US006826506B2

(12) United States Patent
Adamian et al.

(10) Patent No.: US 6,826,506 B2
(45) Date of Patent: Nov. 30, 2004

(54) METHOD AND APPARATUS FOR CALIBRATING A MULTIPORT TEST SYSTEM FOR MEASUREMENT OF A DUT

(75) Inventors: Vahe' A. Adamian, Lexington, MA (US); Peter V. Phillips, Leominster, MA (US); Patrick J. Enquist, Worcester, MA (US)

(73) Assignee: Agilent Technologies, Inc., Palo Alto, CA (US)

(*) Notice: Subject to any disclaimer, the term of this patent is extended or adjusted under 35 U.S.C. 154(b) by 453 days.

(21) Appl. No.: 09/954,809

(22) Filed: Sep. 18, 2001

(65) Prior Publication Data

US 2003/0173978 A1 Sep. 18, 2003

Related U.S. Application Data

(60) Provisional application No. 60/233,596, filed on Sep. 18, 2000.

(51) Int. Cl.[7] .......................... G06F 19/00; G01R 35/00
(52) U.S. Cl. ........................ 702/118; 324/601; 324/638
(58) Field of Search ............................. 702/118, 57, 65, 702/90, 107; 324/601, 602, 605, 638, 646

(56) References Cited

U.S. PATENT DOCUMENTS

| | | | |
|---|---|---|---|
| 5,434,511 A | 7/1995 | Adamian et al. | |
| 5,467,021 A | 11/1995 | Adamian et al. | |
| 5,537,046 A | 7/1996 | Adamian et al. | |
| 5,548,221 A | 8/1996 | Adamian et al. | |
| 5,552,714 A | 9/1996 | Adamian et al. | |
| 5,578,932 A | 11/1996 | Adamian et al. | |
| 6,060,888 A | 5/2000 | Blackman et al. | |
| 6,300,775 B1 | * 10/2001 | Peach et al. | 324/601 |
| 6,347,382 B1 | * 2/2002 | Nakayama et al. | 714/37 |
| 6,417,674 B1 | * 7/2002 | Rowell et al. | 324/601 |
| 6,421,624 B1 | * 7/2002 | Nakayama et al. | 702/117 |
| 6,614,237 B2 | * 9/2003 | Ademian et al. | 324/601 |
| 6,653,848 B2 | * 11/2003 | Adamian et al. | 324/638 |
| 6,677,745 B2 | * 1/2004 | Mayr et al. | 324/158.1 |
| 2003/0173975 A1 | * 9/2003 | Adamian | 324/601 |
| 2003/0200039 A1 | * 10/2003 | Adamian et al. | 702/65 |

OTHER PUBLICATIONS

Adamian, et al., "VNA–Based System Tests Differential Components," Microwaves & RF, Wireless Technology/Show Wrapup Issue, A Penton Publication, Mar. 2000, ATN Microwave, Inc., No. Billerica, MA.

* cited by examiner

Primary Examiner—Patrick Assouad

(57) ABSTRACT

According to one embodiment of the invention, there is provided a method of calibrating an N-port multiport test system for measurement of a DUT. The method consists of coupling each port of an N-port automatic calibration device to a respective port of the N-port multiport test system, and presenting three reflection standards with the automatic calibration device to each port of the N-port multiport test system. The method also consists of providing with the automatic calibration device, N–1 through conditions of a possible N(N–1)/2 possible through conditions, between corresponding ports of the N-port multiport test system, and making measurements with the N-port multiport test system of the three reflection standards at each port and the N–1 through conditions between the corresponding ports. The method further consists of determining all of systematic error coefficients for all of the ports of N-port multiport test system.

26 Claims, 43 Drawing Sheets

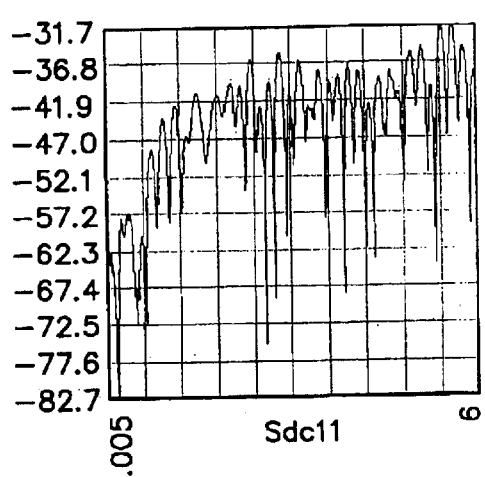
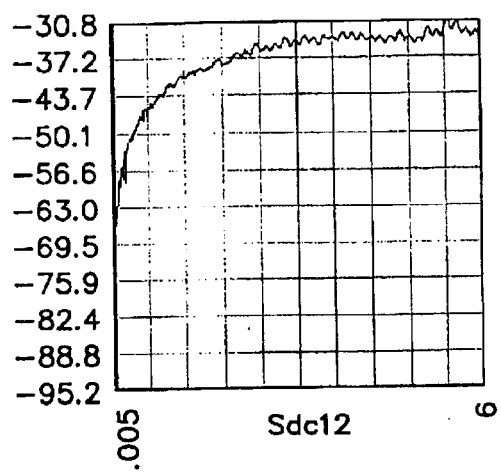
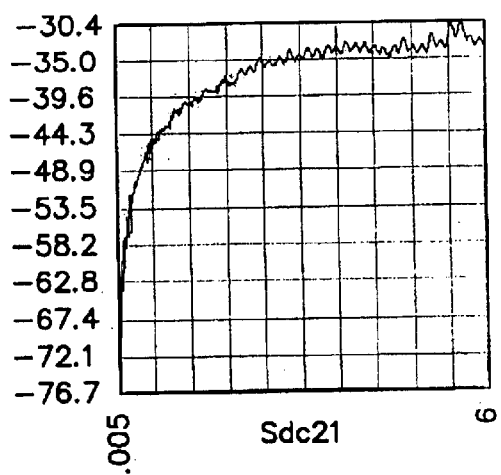
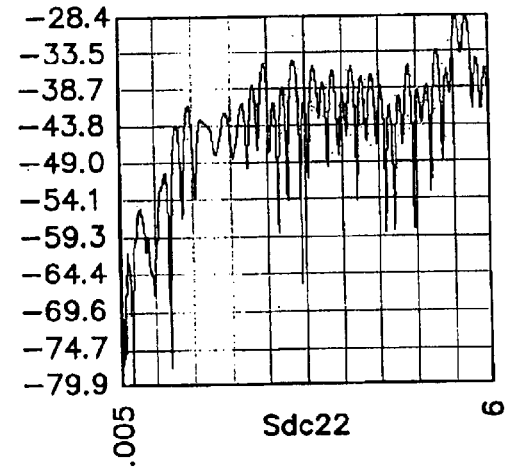
FIG. 18B

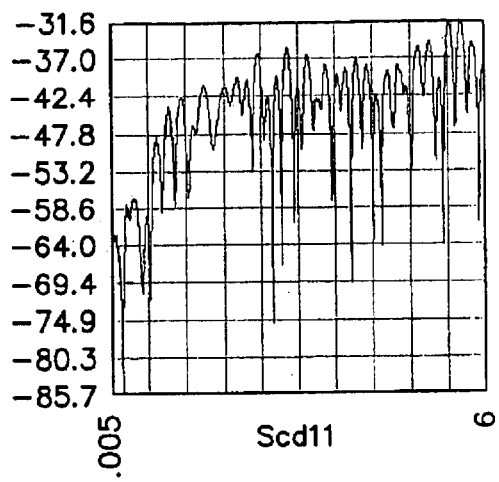
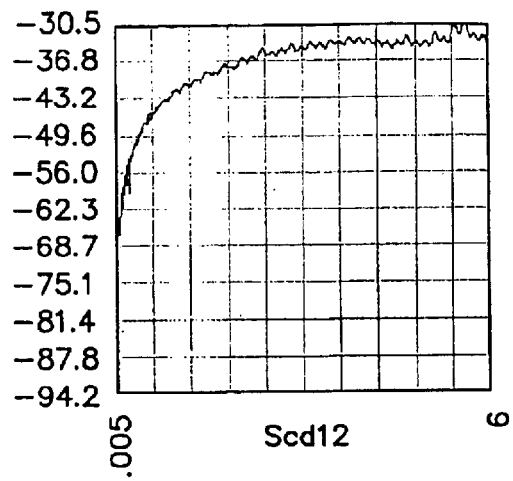
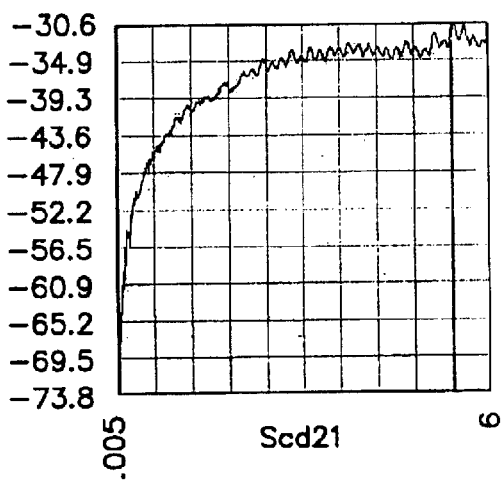
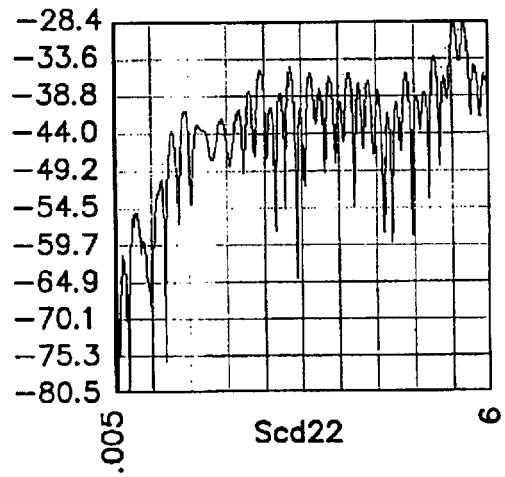
FIG. 18C

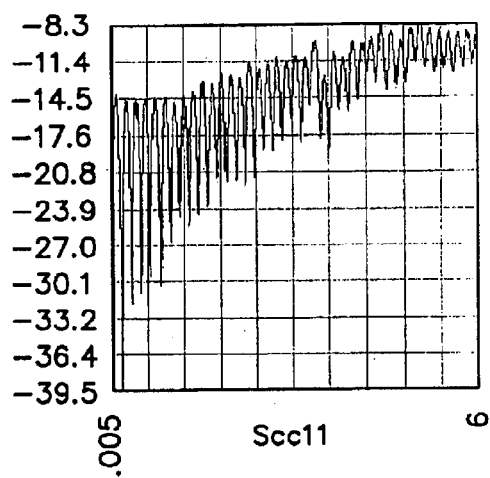
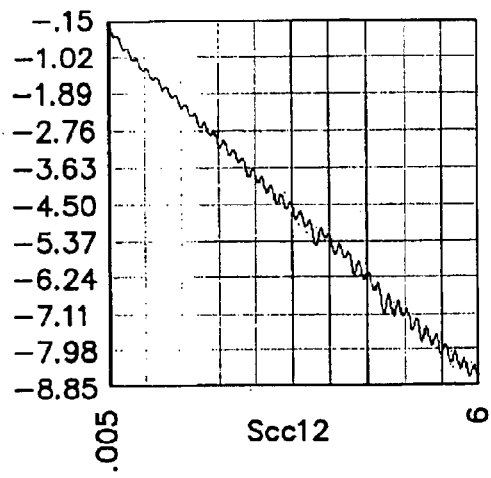
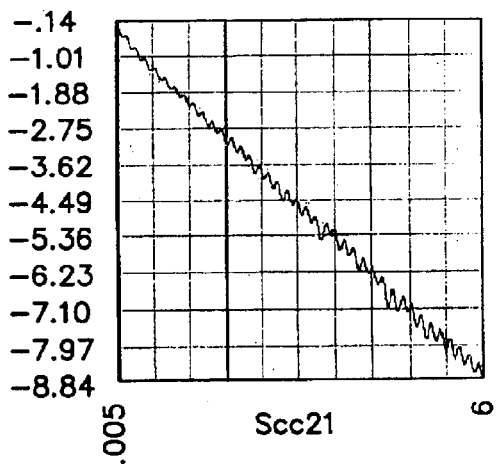
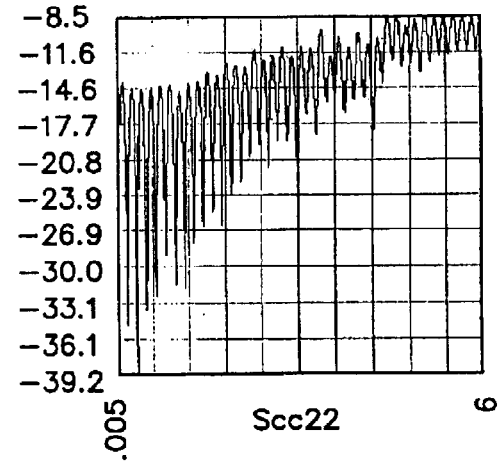
FIG. 18D

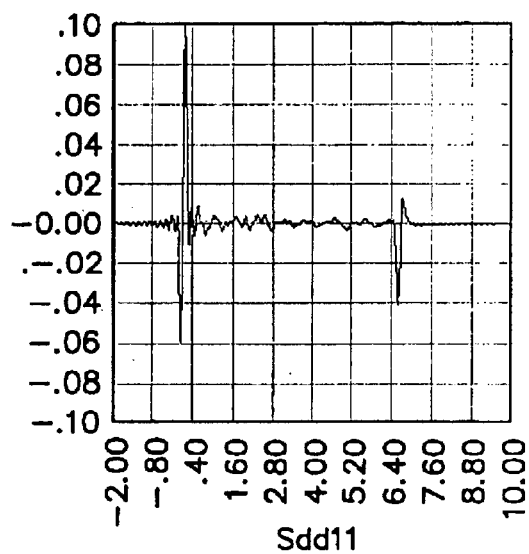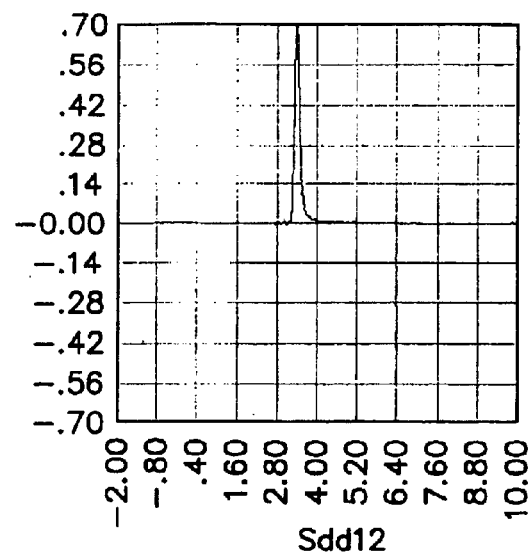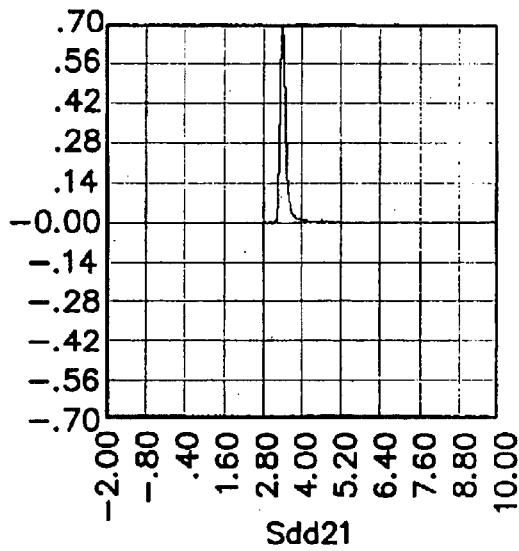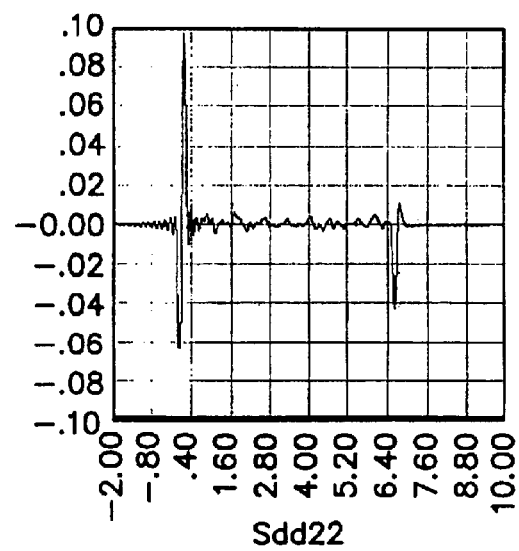
FIG. 19A

FIG. 31 K28.5(1100000101) Digital Bit Pattern at 2Gb/s Data Rate

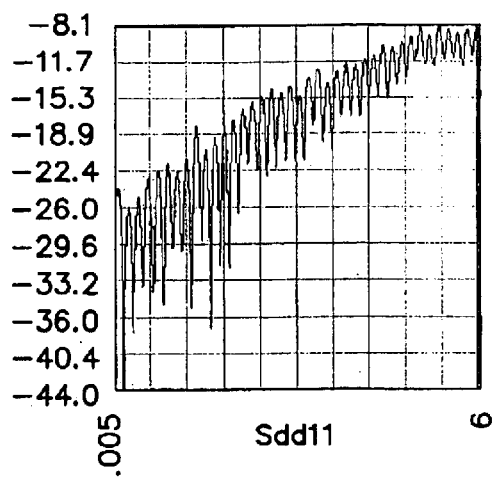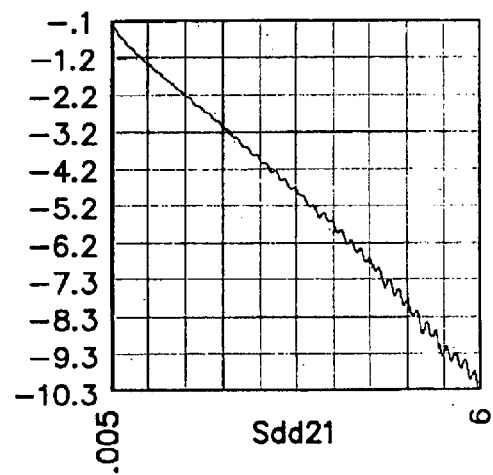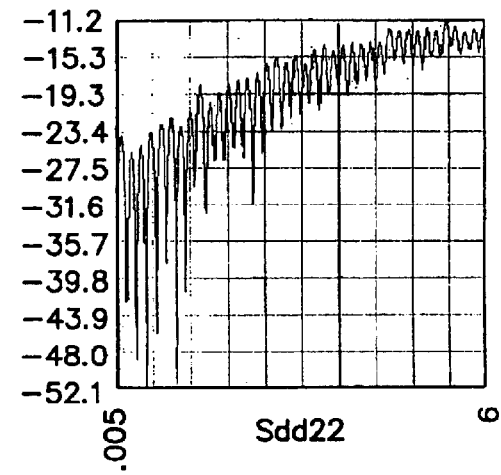
FIG. 33A

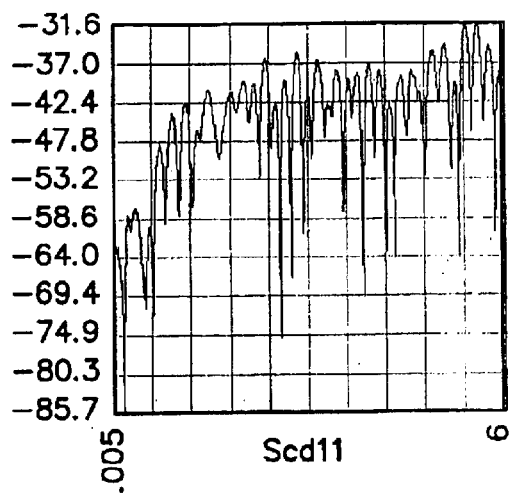
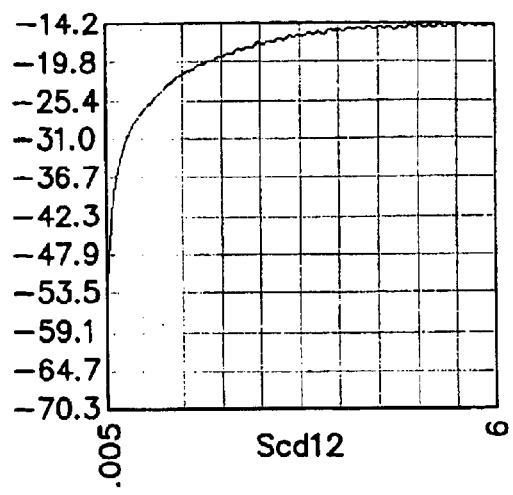
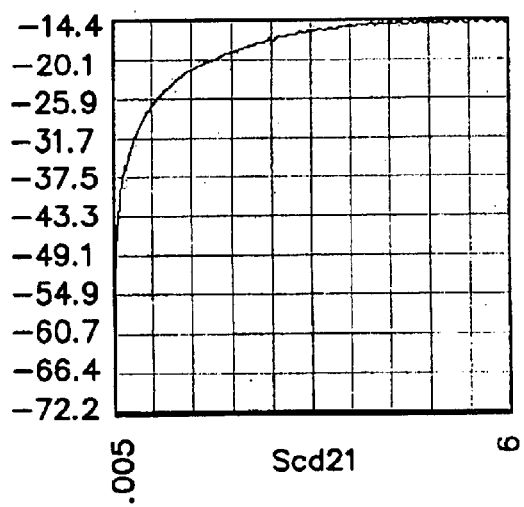
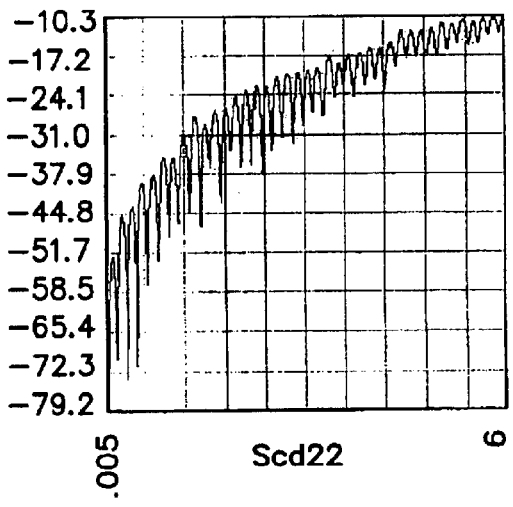
FIG. 33C

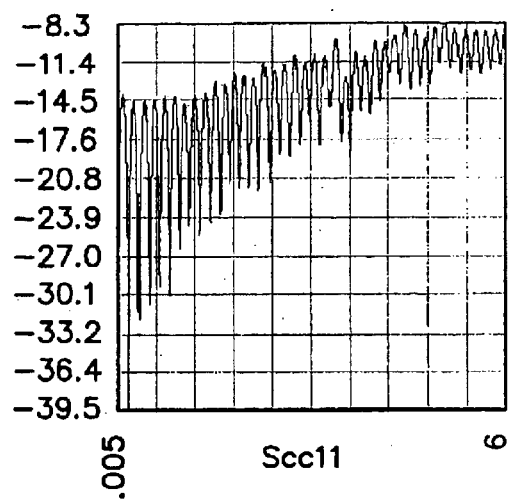
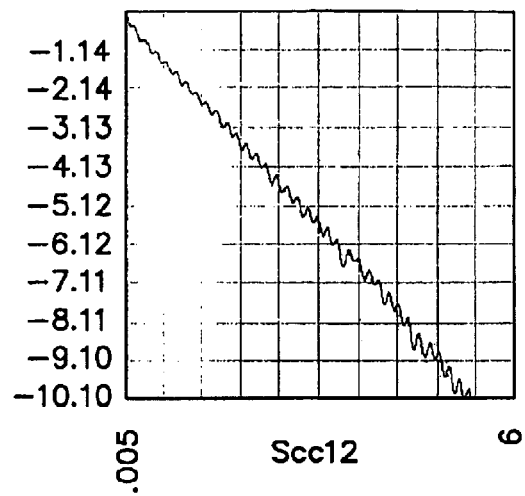
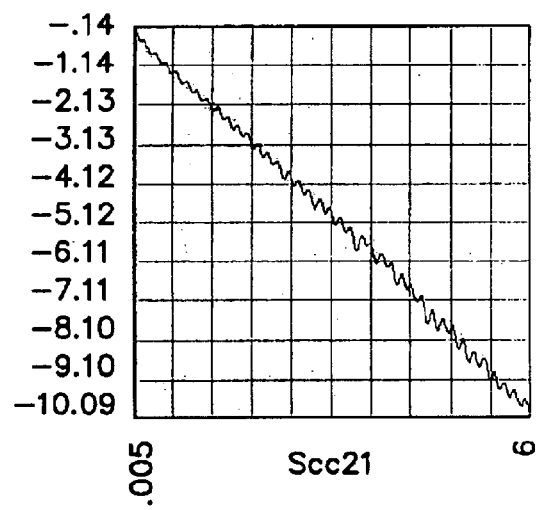
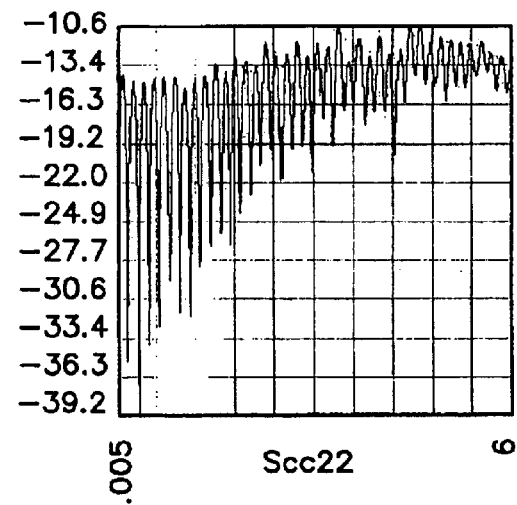
FIG. 33D

METHOD AND APPARATUS FOR CALIBRATING A MULTIPORT TEST SYSTEM FOR MEASUREMENT OF A DUT

RELATED APPLICATIONS

This application claims priority under 35 U.S.C. §119(e) to commonly-owned, co-pending U.S. Provisional Patent Application Ser. No. 60/233,596 entitled, "METHOD AND APPARATUS FOR LINEAR CHARACTERIZATION OF MULTI-TERMINAL SINGLE-ENDED OR BALANCED DEVICES", filed Sep. 18, 2000, which is hereby incorporated by reference in its entirety.

FIELD OF THE INVENTION

This application relates to a method and apparatus for characterizing multi-terminal linear devices operating in several modes, and, in particular, to a method and apparatus for measuring devices in any of unbalanced, balanced, and multiple modes of operation.

DESCRIPTION OF THE RELATED ART

It is to be understood that according to this disclosure an unbalanced device has one signal carrying terminal for each single ended input and output of the device and operates in the single ended mode. It is also to be understood that a balanced device has two signal carrying terminals for each balanced input and output pair of the device and operates in one of two modes, either a common mode (even mode) or a differential mode (odd mode).

Signal integrity and its characterization is an issue of growing importance as digital networks increase in speed and bandwidth. Traditionally, RF devices and digital devices have had little in common. However, as digital signals operate higher and higher in speed and approach a 1 gigabit per second (hereinafter "Gb/s") threshold, the digital signal analysis tools and the RF signal analysis tools begin to overlap in function and requirements. In addition, with higher speed digital signals, the harmonic contents of the digital signals are many times higher than a frequency of a fundamental tone, which results in a need for greater precision in connections between, for example, a device under test (hereinafter "DUT") and testing devices that characterize these high speed digital DUTs.

A traditional differential time domain reflectometer (hereinafter "TDR") system, which has been used to test digital DUTs, uses a step function as a driving signal to a DUT. The step function signal is used because there is no commercially available signal source that can generate an impulse function, which is a preferred driving signal for analog circuit characterization.

Due to the harmonic frequencies content in fast-rise-time digital signals, one may think of high-speed digital circuits or interconnections as transmission lines, and consider the effects of, for example, reflected signals on the measurement of these circuits and interconnections. However, frequency domain instruments such as the Vector Network Analyzer (hereinafter "VNA") that typically consider these effects have not historically been used to measure such digital circuits and interconnections. Instead, the differential TDR has been used to characterize high-speed digital circuits and components.

There are several reasons why the differential TDR has traditionally been used. For one, time-domain representations of digital signals, such as state-to-state transitions, need to be preserved and their signal characteristics as a function of time need to be characterized. In addition, most devices and systems transmitting high-speed digital data use differential signals, while most VNAs are designed for single-ended or unbalanced, 2-terminal devices. However, with increasing data rates, the dynamic range of a very high-speed differential TDR system is often inadequate for analyzing low-level signals such as crosstalk signals or the signal components responsible for generating electromagnetic interference (hereinafter "EMI"). In addition, the parasitic inductances and capacitances that exist in signal lines and interconnections are generally ignored at lower data rates, where traditional TDR systems have been used, but as the data rates become significantly higher they can no longer be ignored. Further, the traditional differential TDR systems do not correct for the systematic sources of error in the measurement equipment, nor do they support de-embedding fixtures or interconnects used to characterize a DUT.

As is known to those of skill in the art, a complete characterization of a single-ended linear 1-terminal or 2-terminal DUT can be achieved by measuring standard S-parameters with a Vector Network Analyzer (hereinafter "VNA"). A standard 2-port S-parameter matrix represents a frequency domain representation of all possible signal paths between any two terminals of a multi-terminal DUT, including forward, reverse, transmission and reflection characteristics of and between the two terminals of the DUT.

One known procedure for measurement of a multi-terminal DUT with a commercially available 2-port VNA, is to connect each port of the VNA to 2-terminals of the multi-terminal DUT, and to terminate the rest of the terminals of the multi-terminal DUT with high quality matching terminations. The 2-port VNA is used to measure or characterize the 2-terminals of the multi-terminal DUT with the remainder of the terminals terminated. This procedure is then repeated wherein two additional terminals of the multi-terminal DUT are measured and the remainder of the terminals are terminated with the high quality matching terminations, until all of the terminals of the multi-terminal DUT have been measured. Once all the terminals of the multi-terminal device have been measured, the plurality of 2-port measurements made by the VNA are then processed to obtain the S-parameters of the multi-terminal DUT. This procedure is described, for example in the related art portion of U.S. Pat. No. 5,578,932 issued to the applicant of this application, which is herein incorporated by reference in its entirety.

As was described in *Combined Differential and Common-Mode Scattering Parameters: Theory and Simulation*, David G. Bockelman and William R. Eisenstadt, IEEE Transactions on Microwave Theory and Techniques, Vol. 43, No. 7, Jul. 1995 (hereinafter "the Bockelman IEEE Article"). The standard S-parameters can be extended to mixed-mode S-parameters (hereinafter "$S_{mm}$") that characterize the linear performance of balanced devices. The mixed-mode S-parameter matrix [$S_{mm}$] are similar to conventional signal-ended S-parameter matrix [S] that the [$S_{mm}$] characterize the stimuli and the response between any two terminals of a DUT. However, the [$S_{mm}$] also considers the stimulus and response mode of operation, in addition to the stimulus and response port.

Referring to FIG. 1(*a*), as is known to those of skill in the art, the single-ended 2-port [S] are defined in the format $S_{yz}$ with yz representing the response and stimulus ports, respectively. Referring now to FIG. 1(*b*), the mixed-mode S-parameter matrix [$S_{mm}$] for balanced devices are defined as $S_{wxyz}$, with wx representing the additional response and stimulus modes of the DUT. The [$S_{mm}$] of FIG. 1(*b*) can characterize the linear performance of a balanced 2-terminal device. As with single-ended S-parameters [S], each column represents a different stimulus condition and each row represents a different response. In addition, the [$S_{mm}$] matrix can be divided into four quadrants, and the DUT can be considered a 2-port device operating in pure and conversion modes of operation, as illustrated in FIG. 1(b).

Referring to FIG. 1(b), the upper left-hand quadrant describes the behavior of the DUT when it is stimulated with a differential-mode signal and a differential-mode response is observed. This quadrant consists of four parameters: reflection parameters $S_{dd11}$, $S_{dd22}$ on both balanced terminals one and two of the 2-terminal DUT and transmission parameters $S_{dd21}$, $S_{dd12}$ in forward and reversed directions between terminals one and two of the 2-terminal DUT. Thus, this quadrant describes the performance characteristics of a 2-terminal DUT operating in the differential mode.

The lower right quadrant describes the behavior of the DUT when it is stimulated with a common-mode signal and a common-mode response is observed. This quadrant also consists of four parameters: reflection parameters $S_{cc11}$, $S_{cc22}$ on both balance terminals one and two of the DUT and transmission parameters $S_{cc21}$, $S_{cc12}$ in the forward and reverse directions between terminals one and two. This quadrant describes the fundamental performance characteristics of a 2-terminal DUT operating in the common-mode. It is to be appreciated by one of skill in the art that if one objective is to reduce the level of common-mode signals in a DUT, these parameters can be used to analyze the DUT behavior. In addition, common-mode rejection of the DUT is often of interest, and it can be calculated by taking a ratio of a differential-mode gain, $S_{dd21}$, to the common-mode gain, $S_{cc21}$.

The lower left quadrant of FIG. 1(b) describes the behavior of the DUT when it is stimulated with a differential-mode signal and a common-mode response is observed. The S-parameters of this quadrant show how the DUT converts a differential-mode signal to a common-mode signal. Again, it is possible to examine reflections on each terminal and transmission of a signal in the forward and reverse directions in this mode of operation. It is to be appreciated that in a perfectly symmetrical balanced device, there should be no conversion between the differential mode and the common mode and all of these S-parameters should be zero.

This lower left quadrant is useful for describing the behavior of the DUT, for example, because any asymmetry in a DUT may result in an imbalance in an amplitude of signals on each side of a balanced pair of terminals of the DUT, or in a phase skew. A conversion of a stimulus signal from a differential-mode to a common-mode may, for example, cause signals to appear on ground returns in the DUT and can result in generation of electromagnetic interference (hereinafter "EMI"). In high-speed digital signal devices, any imbalance in the DUT can also result in degradation of bit-error rates (hereinafter "BERs").

The upper right quadrant of FIG. 1(b), describes the behavior of the DUT when it is stimulated with a common-mode signal and a differential-mode response is observed. These S-parameters characterize how the DUT converts a common-mode signal to a differential-mode signal. The mixed mode S-parameters in the upper right quadrant also characterize reflections on each terminal and transmission in a forward and reverse directions between terminals one and two of the DUT. Again, it is to be appreciated that if a balanced DUT is perfectly symmetrical, there will be no conversion between these modes, and all of these terms should be zero.

As discussed above, any conversion of a signal from a common-mode to a differential-mode may cause the DUT and any system that the DUT is to be used, to be susceptible to EMI. For example, noise that couples into the DUT and system from power supplies, ground connections, and the like may generally be introduced as a common-mode signal. If this common-mode noise signal is converted to the differential-mode, it may be superimposed on the actual DUT signal and degrade its signal-to-noise ratio. Therefore, the mode-conversion behavior of the DUT from common to differential mode may result in the DUT being susceptible to sources of noise and interference.

Accordingly, mode-conversion is one phenomenon that should be considered when examining the signal integrity of balanced DUTs. However, since these signals are ideally zero, the dynamic range provided by a conventional differential TDR systems is typically not sufficient.

It is to be appreciated that the tremendous growth of, for example, the Internet and the increasingly faster processing speed of computers and other digital devices is moving more products into the domain of high-frequency data transmissions. Uncorrected sources of error in current test instruments may have been acceptable for lower data rate devices, but are no longer acceptable as the data rates of these devices are increasingly pushed higher. In addition, much of the test equipment used to characterize these digital devices provide scalar data. However, scalar data does not include enough information to adequately characterize and remove the sources of error. Further, these traditional test devices have issues of dynamic range and also may often provide an excessive amplitude incident signal to the DUT being tested.

SUMMARY OF THE INVENTION

Accordingly, one aspect of some embodiments of the method and apparatus of this disclosure is that systematic sources of error in an N-port multiport test system can be determined and removed by presenting three reflection standards to each port of the multiport test system and only N−1 through conditions between corresponding ports of the N-port multiport test system. Still other aspects of some embodiments of the method and apparatus of this disclosure are that low-level signals can be measured, a dynamic range of the multiport test system can be increased and a DUT need not be measured with excessive amplitude measurement signals.

According to one embodiment of the invention, there is provided a method of calibrating an N-port multiport test system for measurement of a DUT. The method consists of coupling each port of an N-port automatic calibration device to a respective port of the N-port multiport test system, and presenting three reflection standards with the automatic calibration device to each port of the N-port multiport test system. The method also consists of providing with the automatic calibration device, N−1 through conditions of a possible N(N−1)/2 possible through conditions, between corresponding ports of the N-port multiport test system, and making measurements with the N-port multiport test system of the three reflection standards at each port and the N−1 through conditions between the corresponding ports. The method further consists of determining all of systematic error coefficients for all of the ports of N-port multiport test system.

According to another embodiment of the invention, there is provided a combination of an N-port multiport test set that can characterize a multi-terminal DUT and an N-port automatic calibration device, wherein each port of the multiport automatic calibration device is coupled to a respective port of the multiport test set, and wherein the multiport test set and the multiport automatic calibration device are configured to accomplish a method of calibrating the N-port multiport test system. The method consisting of presenting three reflection standards with the multiport automatic calibration device to each port of the multiport test set, and providing with the multiport automatic calibration device, N−1 through conditions of a possible N(N−1)/2 possible through conditions between corresponding ports of the multiport test set. In addition, the method consists of measuring with the multiport test set the three reflections standards presented to each port of the multiport test set and the N−1 through conditions between the corresponding ports, and determining all systematic error coefficients for all of the ports of the multiport test system.

BRIEF DESCRIPTION OF THE DRAWINGS

The foregoing and other objects and advantages will be more fully appreciated from the following drawing in which.

DETAILED DESCRIPTION

Figure 1A:
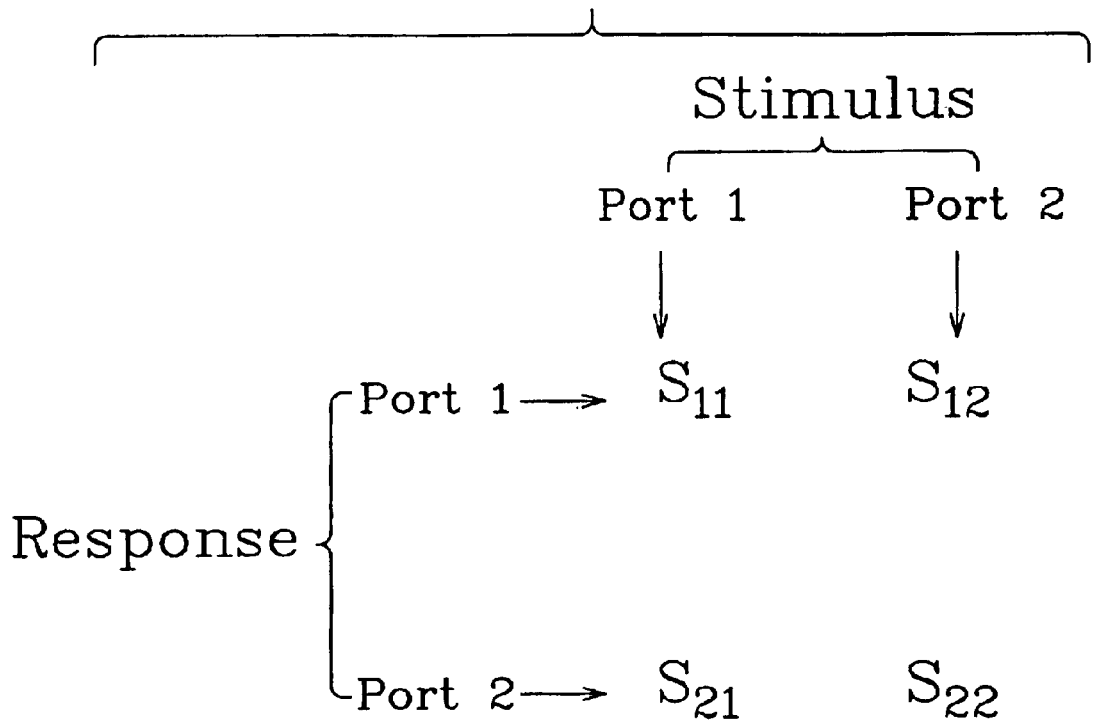
FIG. 1(a) illustrates a single-ended, 2-port S-parameter matrix is known to those of skill in the art.

Numerous advantages, novel features, and objects of the invention will become apparent from the following detailed description of the invention when considered in conjunction with the accompanying drawings. In the FIGS., each identical, or substantially similar component that is illustrated in various FIGS. is represented by a single numeral or notation. For purposes of clarity, not every component is labeled in every Fig., nor is every component of each embodiment of the invention shown where illustration is not necessary to allow those of ordinary skill in the art to understand the invention.

It is to be understood that according to this disclosure an unbalanced device has one signal carrying terminal for each single ended input and output of the device and operates in the single ended mode. It is also to be understood that a balanced device has two signal carrying terminals for each balanced input and output pair of the device and operates in one of two modes, either a common mode (even mode) or a differential mode (odd mode). It is further to be appreciated that a multi-terminal device according to this disclosure is considered to be a device having more than two terminals. For example, one balanced pair of a DUT may comprise two signal terminals that may be coupled to two corresponding ports of a vector network analyzer (hereinafter "VNA"). Accordingly, a multi-terminal device can have more than two connections to a VNA. Therefore, additional hardware is needed to connect a multi-terminal device to a 2-port VNA. It is be understood that according to this disclosure, a multiport test set (hereinafter "MTS") is any test set that is used to measure a multi-terminal device having more than two terminals and may comprise a 2-port VNA and additional hardware that couples a multi-terminal DUT to the 2-port VNA. However, it is to be appreciated that a 2-port VNA need not be used. Instead a multiport VNA can be used and an MTS according disclosure may comprise any multiport VNA having a same number of ports as a multi-terminal DUT, and may also comprise a multiport VNA and any hardware that may be used to couple the multi-terminal device to the multiport VNA, where the multi-terminal device has more terminals than the multiport VNA.

One aspect of some embodiments of the method and apparatus for characterizing multi-terminal devices of this disclosure is that there is provided an ability to measure mixed-mode scattering parameters $[S_{mm}]$ of balanced devices. In addition, another aspect of some embodiments of the method and apparatus of this disclosure is that the precision and accuracy provided by a VNA can be used to measure and characterize digital devices under test (hereinafter "DUT"). Still another aspect of some embodiments of the method and apparatus of this disclosure is that a VNA may be used to provide characteristics and measurements that previously were unavailable to engineers concerned with signal integrity in high-speed digital systems. Still another aspect of some embodiments of the method and apparatus of this disclosure is that the results of a testing and characterization of, for example, a balanced DUT can be presented to the tester in either of the time domain or the frequency domain.

As was discussed in the description of the related art, the traditional differential time domain reflectometer (hereinafter "TDR") systems use a step function as a driving signal to a DUT instead of an impulse function, which is desired. This is to due to a lack of a source that can generate an impulse function, which is rich in harmonic content. In other words, traditional TDR's do not provide an impulse function. A step response or an impulse response or any singularity response can be modeled in a traditional VNA. However, the traditional TDR system and a traditional VNA with a modeled step function driving signal each have several disadvantages, some of which were described in the description of the related art.

With the known TDR test systems the digital DUTs are typically measured by injecting a known digital signal into the DUT and measuring an output from the DUT. However, there are limitations to TDR test systems, such as, the test instrument may not be able to provide an input signal having all desired characteristics of the input signal. In addition, such TDR systems typically have limits on stability and accuracy when generating and measuring step signals. Further, lack of dynamic range in the TDR instrument can exacerbate or mask a presence of similar fluctuations induced by the DUT. Still further, DUT amplitude limits may be far different than operating levels of the TDR instrumentation used. For example, the driving signal may have to be attenuated to safe levels for the DUT, but this may degrade a dynamic range of the TDR instrument and introduce an additional component into the DUT test path that cannot be removed from a measurement with a TDR system. Moreover, scalar receivers are used in such TDR instrumentation, but scalar signals do not have enough information to correct for systematic error coefficients introduced, for example, by interfaced equipment such as test sets and test fixtures.

As is known to those of skill in the art, a characterization of a single-ended linear 1-terminal or 2-terminal DUT can be achieved by measuring standard S-parameters with a VNA. It is to be appreciated that a multi-terminal DUT that is to be measured at each terminal can be thought of as a series of 2-terminal measurements that can be measured with a 2-port VNA. There are N(N−1)/2 2-terminal signal paths for a DUT with N-terminals. For example, a 4-terminal DUT has six possible signal paths between the four terminals of the DUT. It can be appreciated that as a number of terminals of the DUT increase, the number of signal paths increases significantly. For example, an eight-terminal DUT has 28 2-terminal signal paths and a sixteen-terminal DUT has 120 2-terminal signal paths. Accordingly, it can be appreciated that characterizing a multi-terminal DUT is becoming increasingly more difficult, especially where multi-terminal devices are becoming more common due to the use of balanced topologies in digital systems.

One common approach for measuring multi-terminal devices with a 2-port VNA is known as the "round-robin" technique. Since only two terminals can be measured at a time, the terminals that are not measured are terminated preferably in a characteristic impedance that matches the terminal so as to prevent reflections of the measurement signal being used to characterize the DUT, back into the DUT. Thus, the VNA is coupled to two terminals of the multi-terminal DUT and the rest of the terminals are terminated with preferably high quality terminations. The terminated terminals and the terminals coupled to the VNA are then rotated by a systematical procedure until all of the terminals of the DUT have been measured. The multiple 2-terminal measurements are then processed to obtain the final S-parameters [S] of the multi-terminal DUT.

However, one problem with this approach is that signals reflected by the non-perfect terminations may still show up at the measured terminals, especially at frequencies above 500 MHz. For example, because the terminal impedances of the DUT rarely match the available terminations used to terminate the terminals of the DUT, there typically results reflected signals from these terminations. In addition, multiple connections and disconnections of the terminals of the DUT to the VNA and to the terminations are made. Thus, connector repeatability can contribute to measurement error. Also, connector wear can be accelerated. Further, a potential for operator error exists and increases with the number of terminals of the DUT. Moreover, redundant measurements are made with this procedure. An additional disadvantage of measuring a multi-terminal DUT with a 2-port VNA comprises that any internal reflections from terminals with not perfectly matched terminations can add significant error to the measurement. This can be readily apparent in a DUT with low terminal-to-terminal isolation. In addition, multiplexing a VNA to a DUT with a plurality of terminals can result in an insertion of additional multiplexing equipment in the measurement pathways. Accordingly, the repeatability of the multiplexing equipment can contribute to measurement errors of the DUT. Further, different switch configurations used for routing the measurement signals to the DUT can present different impedances to the terminals of the DUT, thus contributing to measurement error.

Thus, with the above-described round robin technique any VNA error correction cannot include effects of unused terminals in the correction and the VNA relies on the quality of the terminations on the unused terminals of the DUT to suppress any reflected signals introduced by the unused terminals. This problem can be accentuated at higher frequencies. Also, many multi-terminal DUTs may not have an impedance value that is a standard impedance value such as 50 Ω or 75 Ω. In addition, terminating an unused terminal with a non-standard termination may not be practical. Further, it may be difficult to get accurate measurements of the DUT due to the many connections and disconnections to the multi-terminal DUT. Still further, the measurement accuracy can be degraded by multiple redundant reflection measurements. For example, for a 4-terminal device each reflection coefficient can be measured three times. However, it is not readily apparent which measurement is the most accurate without knowing the reflection coefficient for each termination and using a correction algorithm that incorporates all the VNA ports. Still further, the calibration of the VNA and the measurement of the DUT can be time consuming and thus can be inefficient and impractical, for example, in a production environment. Moreover, the procedure is prone to errors, and therefore there is a need for a higher level of operator skill and experience.

It is to be appreciated that a characterization of a DUT operating in any of a pure single ended mode, a differential mode or a common mode can also be achieved by measuring standards S-parameters [S] with a VNA, and converting the standard S-parameters to mixed-mode S-parameters [$S_{mm}$]. However, a multi-terminal DUT may also have a combination of single-ended and balanced terminals. Thus, in addition to pure single ended and pure balanced modes, there are mode conversions between types of terminals of a multi-terminal DUT.

However, additional problems with measuring a multi-terminal DUT with a VNA are that there has been no general solution for transforming the S-parameters measured with a VNA to multiple single-ended and multiple balanced parameters that can exist for a DUT. In addition, there is a lack of testing tools for characterizing and measuring a signal integrity in high-speed DUTs, since neither the known differential TDR systems nor the known VNAs are adequate in view of the above-discussed problems.

As known to those of skill in the art, a VNA is a frequency domain apparatus that provides standard S-parameters [S] of a DUT measured with the VNA. According to one aspect of some embodiments of the method and apparatus of this disclosure, a VNA may be used to measure and characterize balanced DUTs and to provide characteristics of these devices that have not previously been available to engineers concerned with signal integrity in high-speed digital systems. Nevertheless, while an S-parameter representation of a DUTs performance can comprehensively characterize the performance of a balanced or mixed-mode DUT, it is also to be appreciated that a frequency domain S-parameter representation does not directly indicate how the DUT is performing to one of skill in the art in the signal integrity field. This is because S-parameters provide a frequency domain representation, while high-speed digital data signals for digital DUTs are typically analyzed in the time domain. However, according to one aspect of some embodiments of the method and apparatus of this disclosure, a VNA can also be conFig.d to transform the frequency domain S-parameters to the time domain with a transform, such as, an Inverse Fourier Transform.

Another aspect of some embodiments of the method and apparatus of this disclosure takes advantage of the principle that the product of two frequency-domain signals is equal to a convolution in the time-domain of the Inverse Fourier Transform of these two frequency signals. Referring to Equation (1):

$$Y(f)=S_{21}(f)X(f) \qquad (1)$$

An input-driving signal $X(f)$ in the frequency domain can be applied to a linear circuit that has a known through response $S_{21}(f)$ in the frequency domain, which has previously been characterized by a VNA, to determine an output $Y(f)$ of the DUT in the frequency domain. It is to be understood throughout this disclosure that the frequency domain is represented by (f) and the time domain is represented by (t). Where the input driving signal $X(f)$ has a unity amplitude as it is swept in frequency over a frequency range of interest for testing a DUT, the output $Y(f)=S_{21}(f)$, where $X(f)=1$. It is known to those of skill in the art that an input driving signal having a unity amplitude in the frequency domain corresponds to a unit impulse function $\partial(t)$. Thus, taking an inverse for a transform of Equation (1) where the input signal is the unit impulse function $\partial(t)$, results in the output signal in the time domain $y(t)=s_{21}(t)$, which is a complete characterization of the DUTs forward transmission coefficient in the time domain when the input signal $x(t)$ is the unity impulse function $\partial(t)$. Thus, the time domain response of a DUT can be determined from the convolution of the measured S-parameter data of the DUT with the impulse function. In other words, the forward transmission coefficient $s_{21}(t)$ is the time-domain impulse response of the DUT. In a similar manner, it is to be appreciated that the time-domain impulse response of the reflection coefficients $S_{11}$, $S_{22}$ and the reverse transmission coefficient $S_{12}$ of the measured S-parameters of a 2-terminal DUT can be determined by a similar convolution procedure.

According to one aspect of some embodiments of the method and apparatus of this disclosure, a VNA can be used to measure the S-parameters of a DUT, and the time-domain reflection (hereinafter "TDR") response and the time-domain transmission (hereinafter "TDT") response of the DUT can be determined by taking the Inverse Fourier Transform of the S-parameters of the DUT measured with a VNA. It is to be appreciated that the TDR response responds to the reflection coefficient, e.g., $S_{11}$, $S_{22}$, for a 2-terminal DUT, and the TDT response corresponds to the transmission coefficients, e.g., $S_{21}$, $S_{12}$, of the 2-terminal DUT.

As will be apparent from the detailed disclosure infra, some embodiments of the method and apparatus of this disclosure provide the following advantages over conventional VNA and TDR measuring devices for the characterization of multi-terminal DUTs and, in particular, multi-terminal mixed-mode, high-speed, digital DUTs. One advantage of some of the embodiments of the method and apparatus of this disclosure is that a comprehensive correction routine for a multiport VNA can be provided to enhance an accuracy of S-parameter measurements of a DUT made with the multiport VNA. Another advantage of some embodiments of the method and apparatus of this disclosure are that any of the following are reduced to a number of connections between the DUT and a VNA, a time needed to calibrate a VNA or measure the DUT, operator experience and skill, and effort used for calibration of a multiport VNA. Thus, there is provided an increased efficiency of calibration of a multiport VNA with some embodiments of a multiport VNA and multiport calibration device of this disclosure. Still another advantage of some embodiments of the method and apparatus of this disclosure is that there is provided a general solution for determining single-ended, balanced, and mixed-mode S-parameters for any terminal configuration of a multi-terminal DUT. Still another advantage of some embodiments of the method and apparatus of this disclosure is that signal-integrity parameters and, in particular, parameters, such as, the time domain response to a singularity function of the DUT are provided to analyze the performance of the high-speed, digital, DUT.

According to another aspect of some embodiments of the method and apparatus of this disclosure, the mixed-mode S-parameters [$S_{mm}$] of a DUT as determined by a multiport VNA of this disclosure, can be converted from the frequency domain to the time domain, for example, with an Inverse Fourier Transform. One aspect of some embodiments of the method and apparatus of this disclosure is that once the time-domain impulse response of the digital DUT is known, an output response of the DUT to any digital input waveform can be determined by a convolution of the input digital waveform with the time-domain impulse response of the DUT, according to a Discrete Time Convolution Transformation. Still another aspect of some embodiments of the method and apparatus of this disclosure is that any digital input waveform can be synthesized. For example, the impulse function, as discussed above can be provided as the input waveform or, for example, known imbalanced conditions can be provided as the input waveform to the digital DUT.

Another advantage of some embodiments of the method and apparatus of this disclosure is that a very high dynamic range can be attained with the multiport VNA of this disclosure. Still another advantage of some embodiments of the method and apparatus of this disclosure is that the S-parameters of the digital DUT can only be measured once to fully characterize the digital DUT. Still another advantage of some embodiments of the method and apparatus of this disclosure is that the DUTs response under various input signal conditions can be evaluated rapidly, and a comparison of the DUTs response for different input waveforms can be performed easily.

Figure 2:
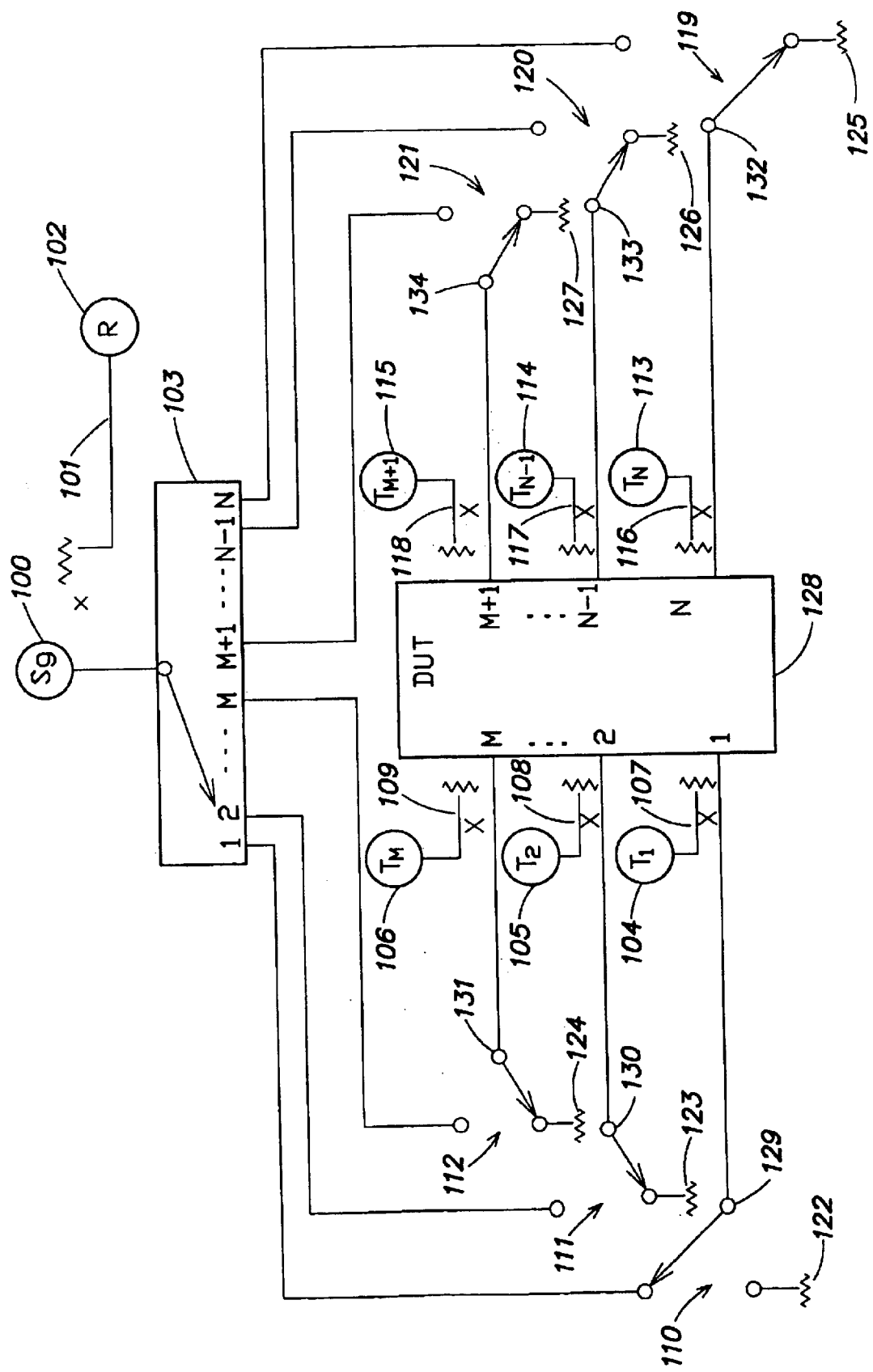
FIG. 2 illustrates one embodiment of a multiport test system according to this disclosure.

Referring now to FIG. 2, there is illustrated one embodiment of a multiport test system (hereinafter "MTS") according to this disclosure. The MTS comprises N-ports. Each port has a respective signal separation device 107, 108 . . . 109, 118 . . . 117, and 116 and is coupled to a VNA receiver 104, 105 . . . 106, 115 . . . 114, and 113. The MTS also comprises a signal generator 100 that generates the test signals used to test a DUT 128, and a coupler 101 that couples the test signal as a reference signal to a reference channel receiver 102. The signal generator also provides the test signal to a single pole, multi-throw switch 103, that routes the test signal to any of the N-terminals of the MTS and the N-terminals of the DUT. Each output of the single-pole, multi-throw switch 103 is coupled to a corresponding single-pole, double-throw switch 110, 111 . . . 112, 121 . . . 120, and 119. According to one alternative embodiment of the MTS, N single-pole, double-throw switches can be integrated into switch 103 such that switch 103 is an absorptive type switch. Thus, the test signal can be fed to any terminal of the DUT 128 with an appropriate switch configuration.

FIG. 2 illustrates, by way of example, that the test signal can be fed to terminal 1 of the DUT while all other terminals of the DUT are terminated into corresponding single-pole, double-throw switch terminations 123, 124, 125, 126, and 127 of the single-pole, double-throw switches 111, 112, 119, 120, and 121.

According to one aspect of this embodiment of the MTS of this disclosure, each pole 129, 130, 131, 132, 133, and 134 of each single-pole double-throw switch 110–112 and 119–121 is connected to a corresponding signal separation device 107–109 and 116–118. According to this embodiment, there are a same number of signal separating devices as there are ports of the MTS. It is to be appreciated that this embodiment of the MTS enables both reflected and transmitted signals from the DUT coupled to the MTS to be measured simultaneously.

Figure 1B:
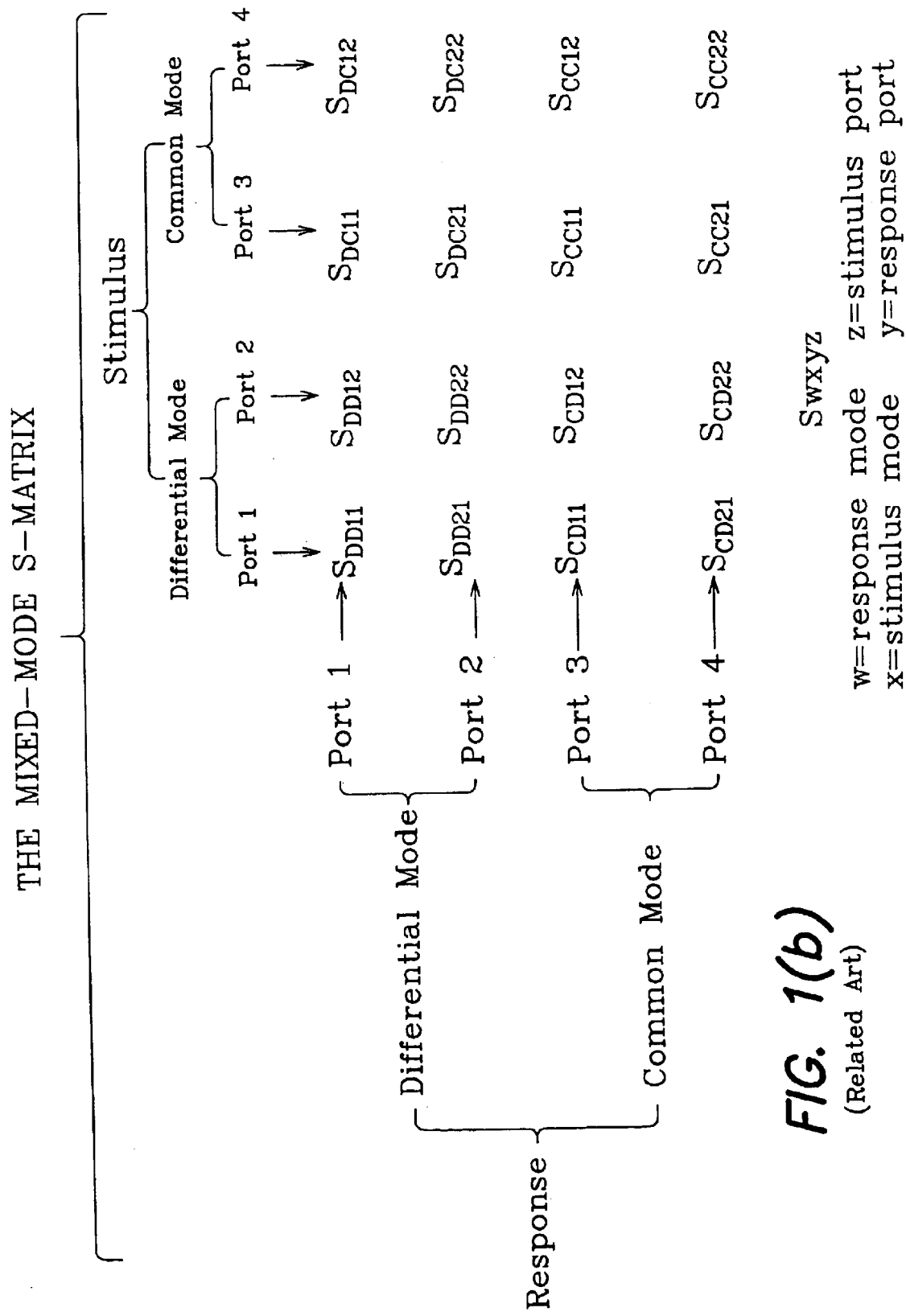
FIG. 1(b) illustrates a mixed-mode, S-parameter matrix for balance devices that is known to those of skill in the art.

FIG. 2 illustrates, by way of example, one mode of operation of the MTS in which all terminals, except terminal 1 of the DUT which is coupled to the signal 100 by single-pole, double-throw switch 110 and single-pole, multi-throw switch 103, are terminated by respective internal loads 123, 124, 125, 126, and 127 which are coupled to respective poles 130, 131, 132, 133, and 134 of respective single-pole, double-throw switches 111–112 and 119–121. Thus, FIG. 1 illustrates by way of example that the test signal has been routed to terminal 1 of the DUT 128 and that all other terminals of the DUT have been terminated. It is to be appreciated that according to this embodiment of the MTS, the load match presented by the internal loads of the MTS to the terminals of the DUT will remain the same throughout an entire measurement sequence of the DUT, except for the condition where the incident signal is routed to a particular terminal of the DUT (in the illustrated case, terminal 1 of the DUT).

It is understood by those of skill in the art that the DUT 128 can be measured by the MTS of FIG. 2 over a desired signal frequency range of characterization, by providing the test signal by signal generator 100 and sweeping the test signal over the desired frequency range of test of the DUT. In response, a ratio of the measured signals with the MTS to the reference channel signals can be measured at each terminal of the DUT. With this embodiment of the MTS of this disclosure, it is to be appreciated that an efficiency of measurement of the DUT is maximized by presenting a single sweep of the test signal to each terminal of the DUT. Each receiver channel 104–106 and 113–115 can be compared to the reference channel 102 during the test signal sweep. In addition, reflection of the test signal from the incident terminal and the transmission of the test signal from the incident terminal to all of the terminals can be obtained simultaneously.

Thus, according to some embodiments of the method and apparatus of this disclosure, an MTS may have a same number of test channels as there are DUT terminals. For example, a 4-terminal DUT can be coupled to a 4-port MTS. As known to those of skill in the art, a 4-terminal DUT has sixteen standard S-parameters that characterize the DUT in a single-ended or unbalanced mode. With a 4-port MTS having the same number of ports as a 4-terminal DUT, the test signal need only be swept across the frequency range of interest and provided as an incident signal to each of the four ports, one sweep for each port for a total of four sweeps. At each sweep of the test signal, a set of four test to reference channel measurements can be made by the four port MTS. Thus, with four frequency sweeps of the test signal generator over the desired frequency range of measurement of the DUT, all sixteen S-parameters can be measured. It is to be appreciated that according to some aspects of this disclosure, the configuration of the MTS of FIG. 2 is preferred.

However, it is to be appreciated that as the number of terminals of a DUT increase, it becomes economically unfeasible to have the same number of MTS test channels as DUT terminals. For example, it becomes economically unfeasible to continue adding receiver test channels. Moreover, commercially available VNAs typically have a fixed number of channels, which may not be conFig.d to accommodate increasing number of terminals on a DUT. To overcome this limitation, according to some embodiments of the method and apparatus of this disclosure the test channels of the MTS can be shared during measurement of the DUT.

Figure 3:
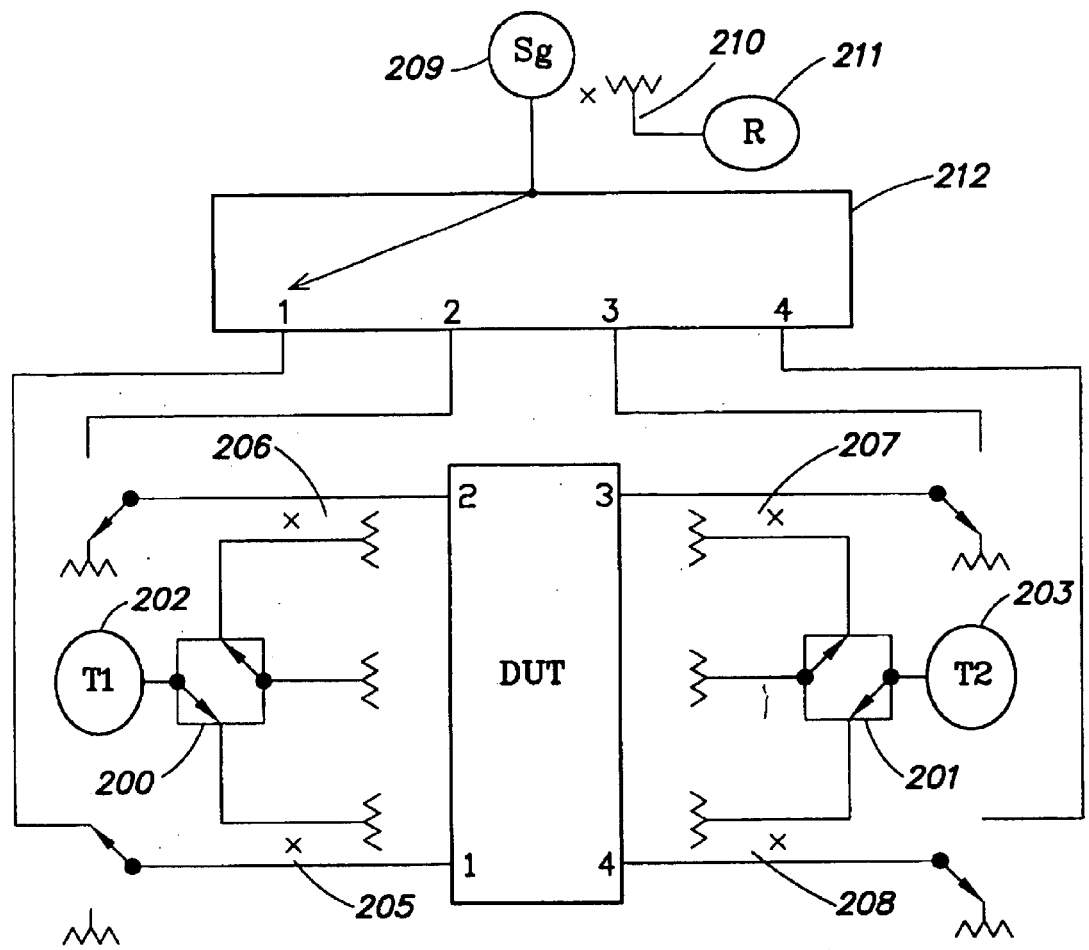
FIG. 3 illustrates an embodiment of a 4-terminal multiport test system according to this disclosure.

Referring now to FIG. 3, there is illustrated a 4-terminal MTS according to another embodiment of the method and apparatus of this disclosure. The 4-port MTS of FIG. 3 comprises shared test channels 202, 203. With this arrangement, ports 1, 2, 3 and 4 of the MTS are coupled to respective terminals 1, 2, 3 and 4 of the DUT and ports 1 and 2, and ports 3 and 4 of the MTS share a respective receiver channel 202, 203. According to this embodiment, a double-pole, double-throw switch 200 multiplexes the test channel 202 between ports and 1 and 2 of the MTS. In addition, a double-pole, double-throw switch 201 multiplexes the test channel 203 between ports 3 and 4 of the MTS. Each port of the MTS has its own signal separation device 205, 206, 207, and 208 that is multiplexed to the corresponding test channel via the respective double-pole, double-throw switch 200, 201. This embodiment of the MTS also comprises a signal generator 209 that provides the test signal used to test the DUT, and a coupler 210 couples the test signal as a reference signal to a reference channel 211. The signal generator 209 also provides the test signal to a single-pole, multi-throw switch 212 that routes the test signal to any of the ports of the MTS.

With the embodiment of the MTS of FIG. 3, at each sweep of the test signal, a set of two test-to-reference-channel measurements can be made by the MTS. Thus, with a total of eight sweeps over the frequency range of interest of the test signal, all sixteen S-parameters of the DUT can be measured. However, it is to be appreciated that this embodiment has a reduced measurement speed of the DUT as compared to the embodiment of FIG. 2 if the same source and receiver assemblies are used in both embodiments.

It is also to be appreciated that according to one aspect of this embodiment of the MTS, an attenuation of the test signal from each DUT terminal to a respective test channel via respective multiplexing switches 200, 201, should be high enough to mitigate any affects of impedance changes when a switch position is changed. According to this embodiment, this is accomplished by providing the switches 200, 201 after the signal separating devices 205–208. However, the attenuation provided by this arrangement can also affect a transmission dynamic range of the MTS system. The reduction in transmission dynamic range is dependent on the swept frequency range. For example, a typical reduction in transmission dynamic range is approximately 1.5 dB to 9 GHz, 2.5 dB to 20 GHz, and 4.5 dB to 50 GHz. Nevertheless, the reduction in reflection dynamic range is insignificant because the change in impedance caused by the different states of the switch are masked by the isolation of the signal separation devices and the match that is provided by the switch. Therefore, a load match provided by this embodiment of the MTS does not significantly change by multiplexing test channels 202, 203 to the DUT terminals with switches 200, 201.

Figure 4:
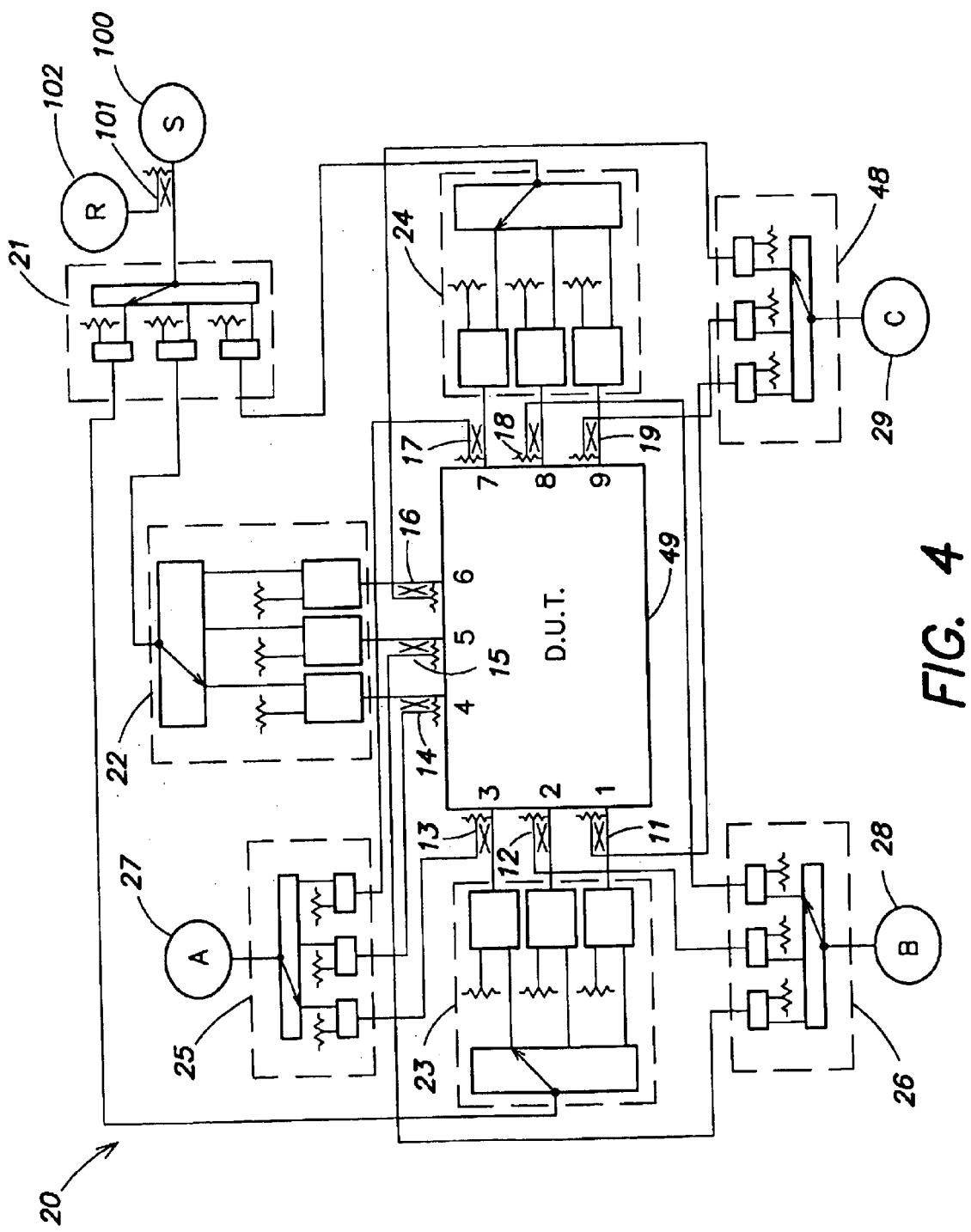
FIG. 4 illustrates an embodiment of a 9-port multiport test system comprising three test and one referenced channel receiver, according to this disclosure.

In addition, it is to be appreciated that one advantage of this configuration of the MTS of FIG. 3 is that it is scalable to any number of ports, without added complexity to its systematic error correction methodology. For example, FIG. 4 illustrates a 9-port MTS 20 that comprises four total channels, one reference channel 102 and three test channels 27, 28 and 29. The three test channels are multiplexed by a plurality of single-pole, three-throw, absorptive-type switches 21, 22, 23, 24, 25, 26, and 48 to ports 1–9 of the MTS 20, and thus to terminals 1–9 of a DUT 49. Thus, the 9-port MTS of FIG. 4 comprises shared test channels 27, 28 and 29. This embodiment of the MTS also comprises the signal generator 100 that provides the test signal for testing the DUT 49, and a coupler 101 that couples the test signal as a reference signal to the reference channel 102.

With this arrangement, ports 1–3, 4–6, and 7–9 of the MTS share a respective receiver 27–29. According to this embodiment, a combination of single-pole, three-throw, absorptive-type switch 21 and single-pole, three-throw, absorptive-type switches 22, 23 and 24 multiplex the signal source 100 to corresponding ports 1–3, 4–6, and 7–9 of the MTS and to the corresponding terminals of the DUT. Each port of the MTS has its own signal separation device 11, 12, 13, 14, 15, 16, 17, 18, and 19 that is multiplexed to one of the three test channels 27, 28 and 29, by corresponding single-pole, three-throw, absorptive-type switches 25, 26 and 48.

With this embodiment 20 of the 9-port MTS of FIG. 4, at each sweep of the test signal, a set of three test-to-reference-channel measurements can be made by the MTS. In other words, at each sweep of the test signal, the ratios A/R, B/R and C/R can be determined over the frequency range of interest of the test signal. As is understood by one of skill in the art, a 9-port DUT comprises eighty-one total S-parameters that characterize the 9-port DUT. Accordingly, with this arrangement of the 9-port MTS, all eighty-one S-parameters of the 9-port DUT can be measured with a total of twenty-seven sweeps of the test signal.

It is to be appreciated that the systematic error calibration methodology of the embodiment of FIG. 3 can be repeated to accommodate the additional ports of the 9-port embodiment of the MTS of FIG. 4. In other words, the same calibration methodology can be used without any additional calibration methodology to accommodate different switch configurations that have been added by the 9-port embodiment of the MTS.

It is also to be appreciated that according to another aspect of some embodiments of the MTS apparatus and method of this disclosure, a plurality of optimized MTS configurations can be provided for any DUT having any number of terminals. According to this aspect, an optimized embodiment of an MTS exists if a number of terminals of the DUT is divisible by a number of test channels of the MTS, and an equal number of terminals of the DUT are allocated to each test channel of the MTS.

For example, a DUT having six terminals can be measured by an optimum MTS of this disclosure having any of two, three or six test channels. Referring to FIG. 2, there is illustrated one optimum embodiment of an MTS of this disclosure. For example, the DUT 128 of FIG. 2 can be a 6-terminal DUT, and that the MTS can be a 6-port MTS. Each terminal of the DUT is coupled to a respective port of the MTS and thus to a respective test channel receiver 104–106, 115–113, by a respective signal separation device 107–109, and 118–116. It is understood by one of skill in the art that a 6-port DUT has a total of $N^2$, or in other words, a total of thirty-six S-parameters that can be determined to fully characterize the 6-port DUT. With the optimum embodiment of the MTS of FIG. 2, it is to be appreciated that for each sweep of the test signal provided by the source 101, a total of six measurements of the test channel to the reference channel or, in other words, measurement ratios $T_1/R$, $T_2/R$, $T_3/R$, $T_4/R$, $T_5/R$, and $T_6/R$, can be determined for each sweep of the test signal. Accordingly, by appropriate switching of switches 103, 110–112 and 121–119, a total of six sweeps of the test signal can be provided to measure all thirty-six S-parameters of the 6-port DUT.

Figure 5A:
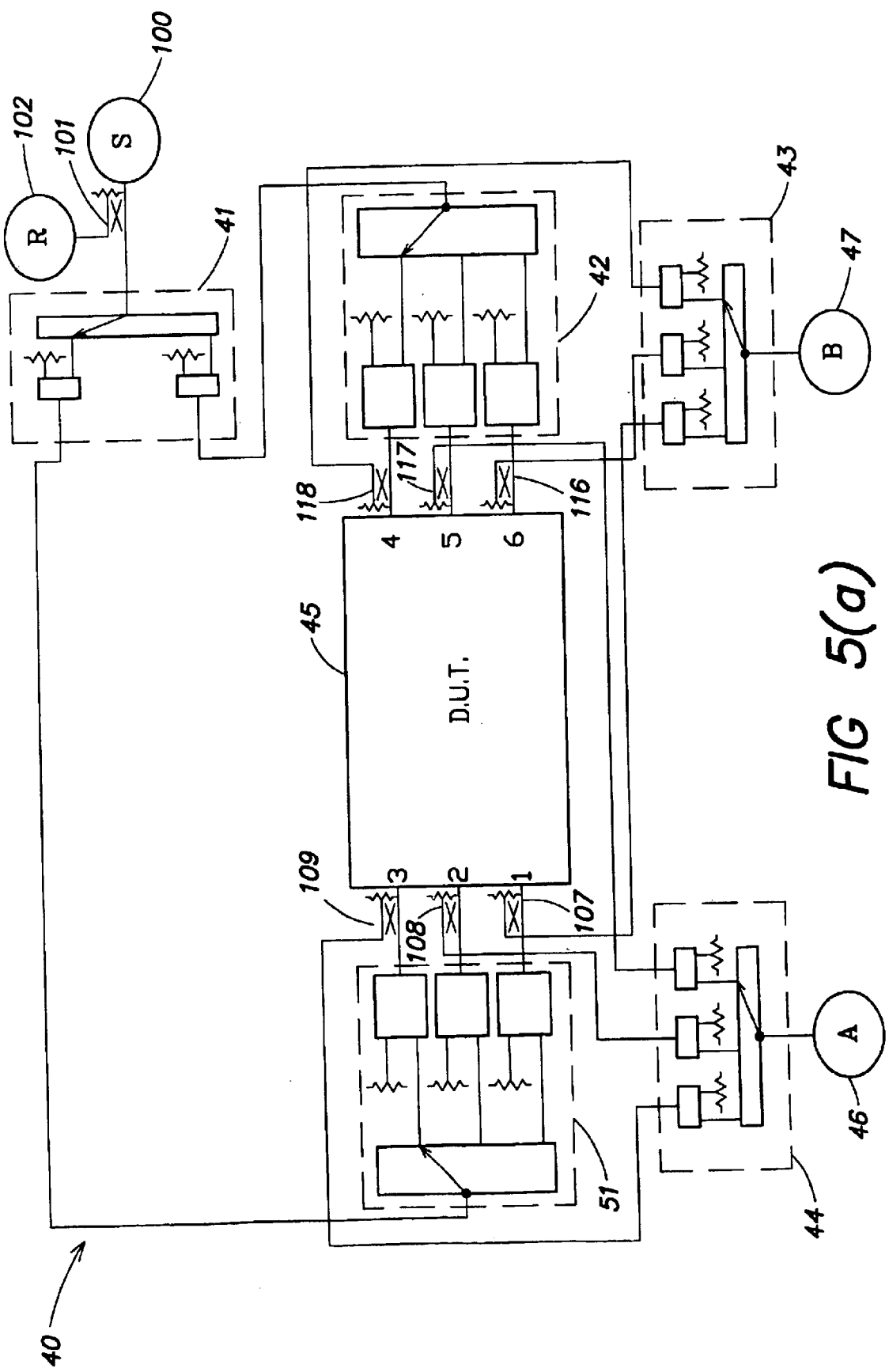
FIG. 5(a) illustrates an embodiment of a 6-port multiport test set comprising two test and one referenced channel receiver, according to this disclosure.

Referring to FIG. 5(a), there is illustrated another embodiment of an optimum 6-port MTS 40 that can be used to measure a 6-terminal DUT. This embodiment of an optimized 6-port MTS 40 comprises one reference channel 102, two test channels 46 and 47, and a single pole, double-throw absorptive-type switch 41 that switches the test signal output by source 100 to one of two single-pole, three-throw absorptive-type switches 51, 42. The single-pole, three-throw absorptive-type switches 51, 42 switch the test signal to one of the 6-ports of the 6-port MTS that are coupled to respective terminals of the 6-port DUT 45 (in FIG. 5(a) the test signal is represented as provided to port one of the MTS and terminal 1 of the DUT). It is to be understood that with this embodiment, for each sweep of the test signal provided by the signal source 100, with the appropriate switching of single-pole, three-throw, absorptive-type switches 51, 42, and single-pole, three-throw absorptive-type switches 43 and 44, a ratio of two test channel measurements (A/R and B/R) can be determined. Accordingly, it is to be understood that for each sweep of the test signal, two S-parameters of the DUT can be determined. Therefore a total of eighteen sweeps of the test signal can be provided by this embodiment of the MTS to measure all thirty-six S-parameters of the DUT.

Figure 5B:
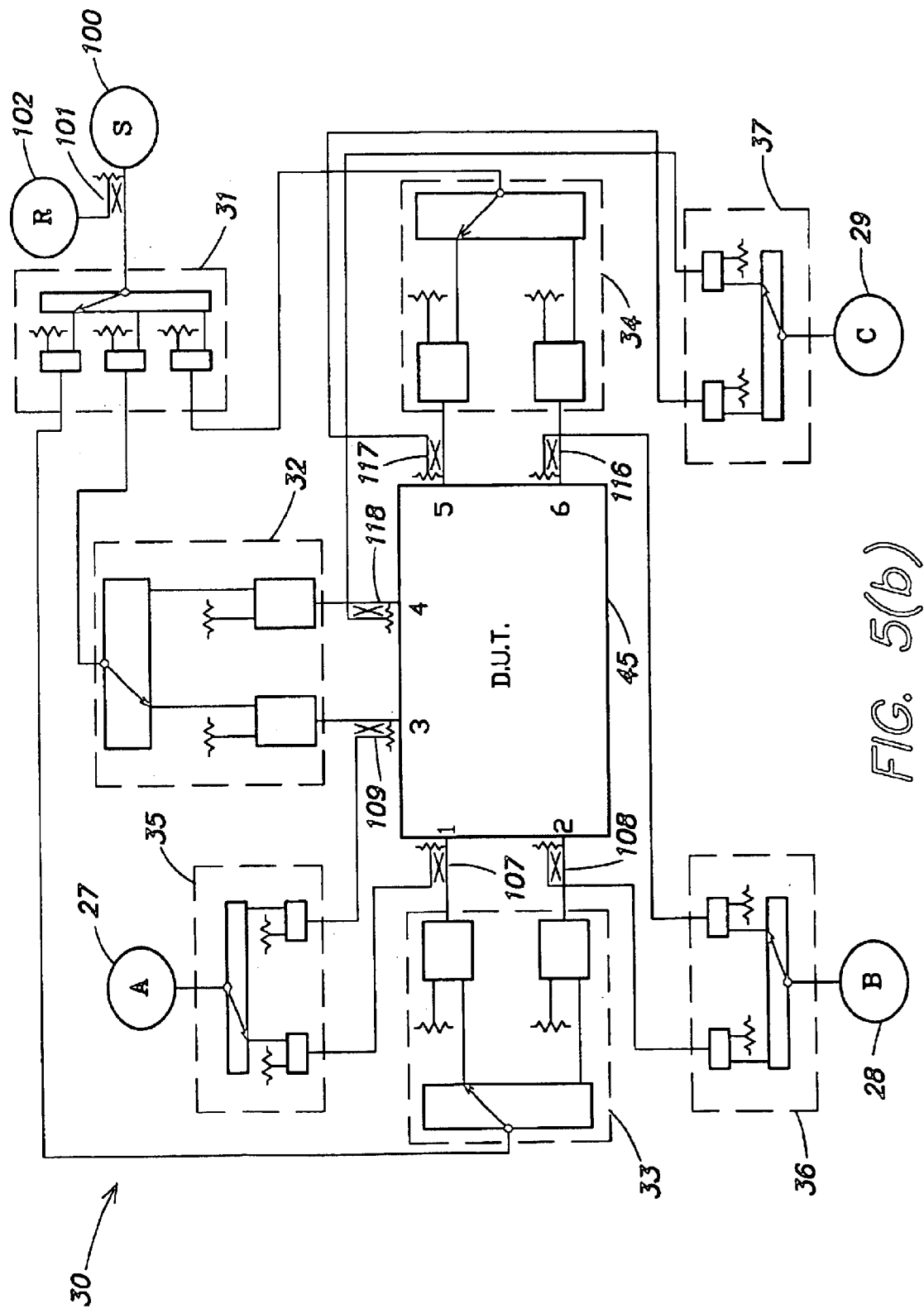
FIG. 5(b) illustrates another embodiment of a 6-port multiport test system comprising three test and one referenced channel receiver, according to this disclosure.

Referring now to FIG. 5(b), there is illustrated another embodiment 30 of an optimum 6-port MTS that can be used to measure a 6-terminal DUT. This embodiment of an optimized 6-port MTS 30 comprises one reference channel 102, three test channels 27, 28 and 29, a single-pole, three-throw absorptive-type switch 31 that routes a test signal output by source 100 through three single-pole, two-throw, absorptive-type switches 32, 33 and 34. The single-pole, two-throw, absorptive-type switch in conjunction with single-pole three-throw switch 31 routes the signal source 100 to any of the ports 1–6 of the MTS which are coupled to corresponding terminals 1–6 of the DUT 45. It is to be understood that with this embodiment of the MTS of this disclosure, for each sweep of a test signal provided by the signal source 100, three measurements of ratios of the test channels 27, 28 and 29 to the reference channel 102 (A/R, B/R and C/R) can be provided by appropriate switching of the single-pole, two-throw, absorptive-type switches 32–34 and single-pole, two-throw, absorptive-type switches 35, 36 and 37. Accordingly, with this 6-port MTS, for each sweep of the test signal provided by the source 100, there can be measured three S-parameters of the DUT 45. Therefore, with this embodiment of an optimized 6-port MTS, a total of twelve measurements can be used to determine all of the S-parameters of the DUT.

Accordingly, it is to be appreciated that there are a plurality of embodiments of an optimized MTS that can used to measure any N-terminal DUT. For the 6-terminal DUT illustrated above, there are, for example, the 6-test channel receiver illustrated in FIG. 2 which can measure all of the S-parameters of the 6-terminal DUT with six frequency sweeps of the test signal, the three test channel embodiment of the MTS as illustrated in FIG. 5(b) where all of the S-parameters of a 6-terminal DUT can be measured with twelve sweeps of the test signal, and the 2-test channel MTS illustrated in FIG. 5(a) where all the S-parameters of the 6-terminal DUT can be measured with eighteen sweeps of the test signal. It is to be appreciated that criteria to provide the various optimum embodiments of an MTS are maximizing the speed of the measurement by providing as many test channel receivers as feasible, and providing a number of test channels such that each test channel is used for each sweep of the test signal. In other words, providing a number of test channels so that no test channel is unused during any sweep of the test signal or in other words, providing a number of test channels that is divisible into the number of terminals of the DUT.

Figure 6:
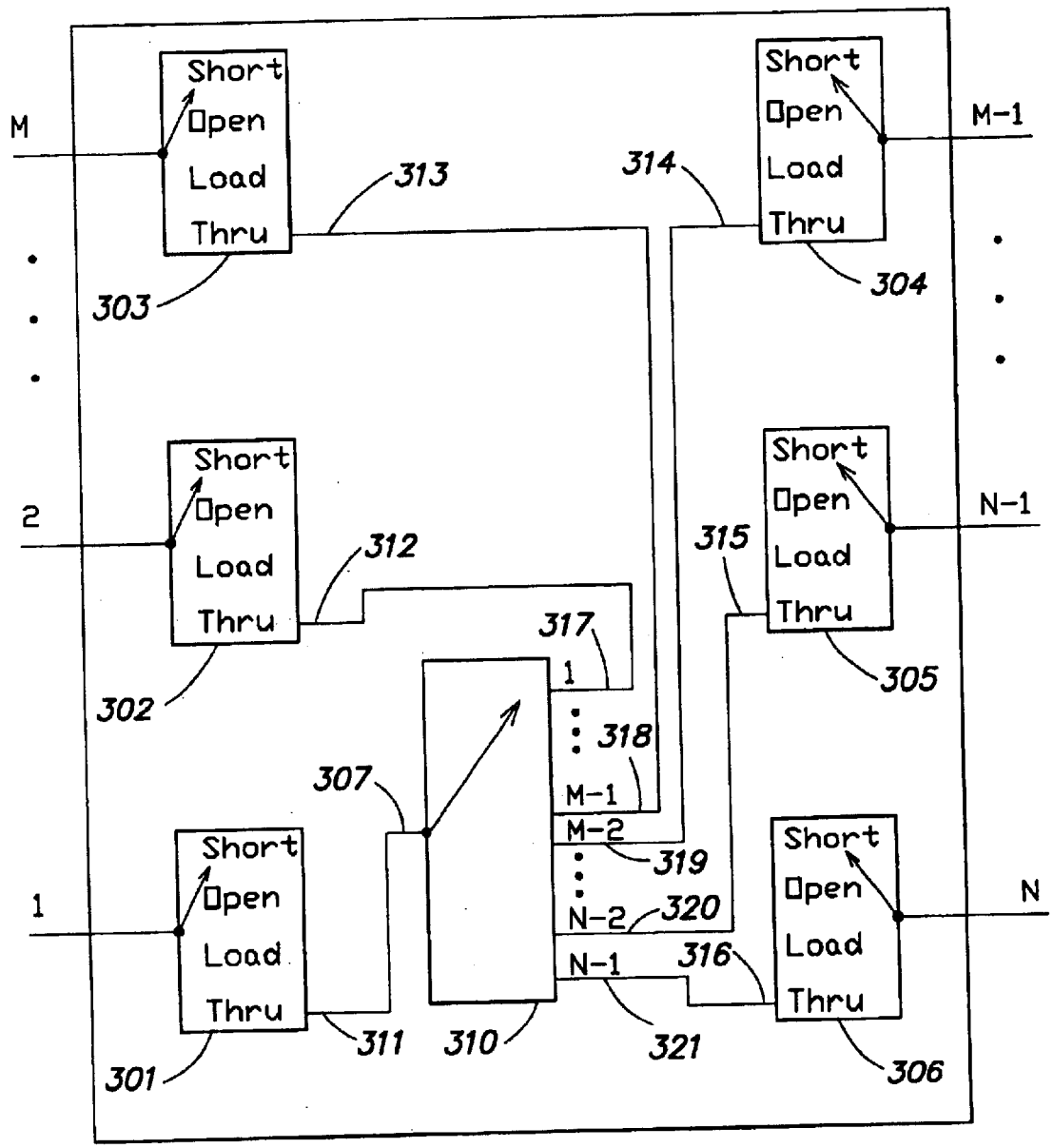
FIG. 6 illustrates one embodiment of an N-port calibration device as known to those of skill in the art.

U.S. Pat. No. 5,578,932 (hereinafter "the '932 patent"), herein incorporated by reference in its entirety, discloses an embodiment of an N-port calibration device. FIG. 6 of this disclosure illustrates one embodiment of such an N-port calibration device. It is to be appreciated that according to one aspect of some embodiments of the method and MTS apparatus of this disclosure, an N-port calibration device can simply be coupled by a one-time connection of the N-port calibration device to an N-port MTS, such as is illustrated in FIG. 2, and the N-port calibration device can be used to completely characterize the N-port MTS. It is also to be appreciated that according to one aspect of some embodiments of the method and MTS apparatus of this disclosure, it is not necessary to have any pattern of connection between the MTS and the N-port calibration device. In other words, any port of the N-port MTS can be connected to any port of the N-port calibration device. In addition, according to another aspect of some embodiments of the method and MTS apparatus of this disclosure, a metrology laboratory can characterize the N-port calibration device into a collection of one and 2-port transfer standards to accurately characterize the N-port calibration device prior to its being used to calibrate an N-port MTS.

Referring to FIG. 6, there is illustrated an N-port automatic calibration device as disclosed in the '932 patent. The 1-port error coefficients for each port of the N-port MTS, can be determined by presenting three reflection standards with the N-port calibration device to each port of the N-port MTS. The three reflection standard may be, for example, a short, an open and a load reflection standard and may be presented with single-pole, four-throw switches 301, 302, 303, 304 . . . 305 and 306 that comprise the N-port calibration device. The automatic calibration device further comprises a single-pole, multi-throw switch 310 comprising a single pole 307 and N−1 throws 317, 318, 319, 320 . . . 321. An additional throw (a thru connection) 311, 312, 313, 314, 315 . . . 316 of each switch 301 . . . 306 can be coupled to any of the single pole 307 and N−1 throws 317–321 of the single-pole, multi-throw switch 310. For example, as illustrated in FIG. 6, the throw 311 of single-pole, four throw switch 301 can be coupled to the pole 307 of single-pole, N−1 throw switch 310, and the remainder of the throws 312–316 can be coupled to respective throws 317, 318, 319, 320 . . . 321 of single-pole, N−1 throw switch 310. It is to be understood that according to one aspect of some embodiments of the automatic calibration device of this disclosure, the throws of the various single-pole, four-throw switches need not be coupled to any particular pole or throw of the single-pole, N−1 throw switch 310. In other words, any through path throw of any of the single-pole, four-throw switches 311–316 can be coupled to the single pole 307 or any of the throws 317–321 of the single-pole, N−1 throw switch.

As disclosed in the '932 patent, the 1-port error coefficients at each port comprise a directivity coefficient $E_{DI}$, a source match coefficient $E_{SI}$ and a reflection tracking coefficient $E_{RI}$, where I=1, 2, . . . N and refers to the port number of the MTS. It is to be appreciated that according to one aspect of some embodiments of the MTS and automatic calibration device of this disclosure, the three reflection standards provided by the automatic calibration device need not be a short, an open and a load. In contrast, the three reflection coefficients can be any reflection value so long as the three reflection coefficients are well distributed throughout the complex reflection plane.

Figure 7:
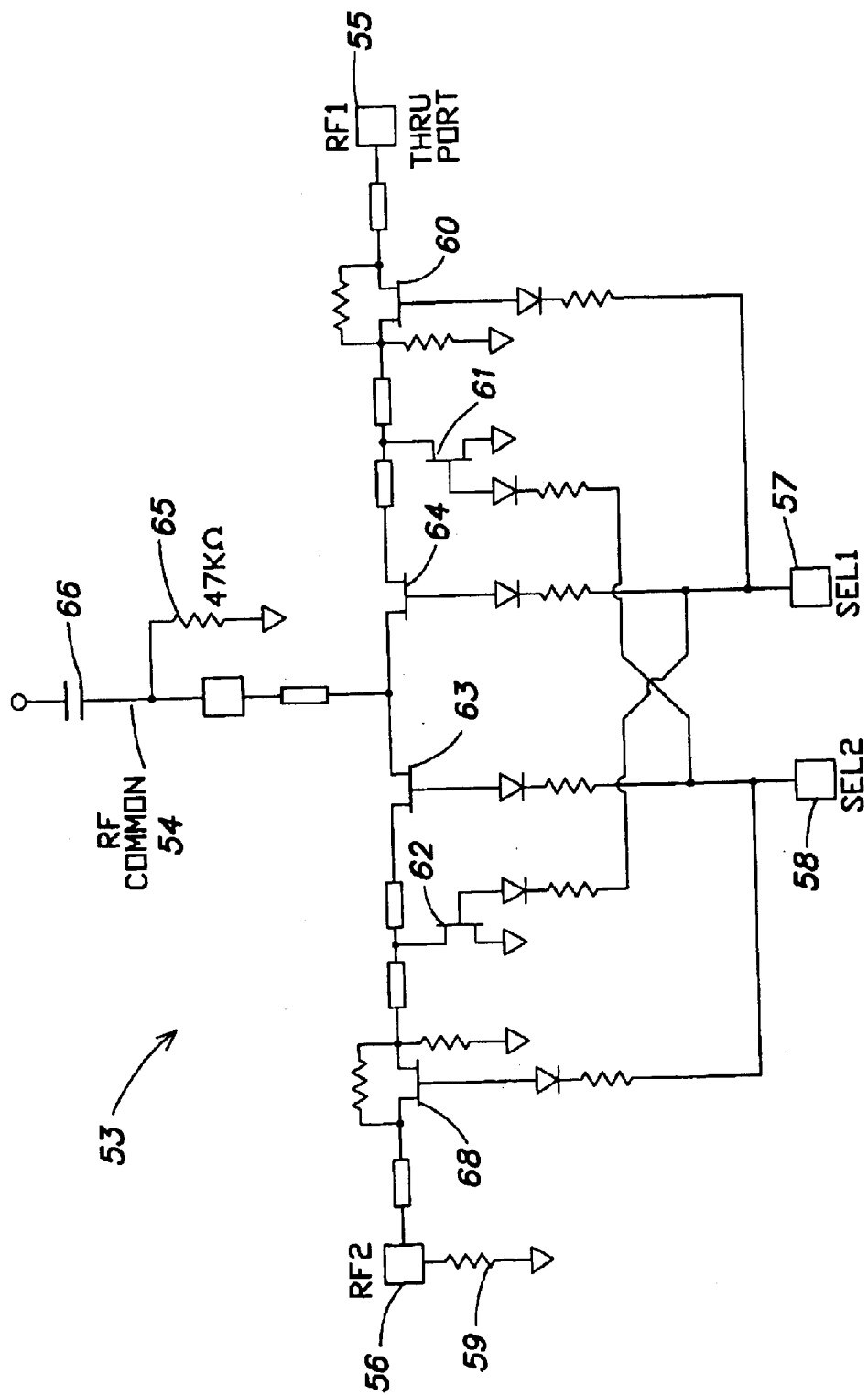
FIG. 7 illustrates one embodiment of a single-pole, double-throw switching device used in an embodiment of an N-port automatic calibration device, according to this disclosure.
Figure 8C:
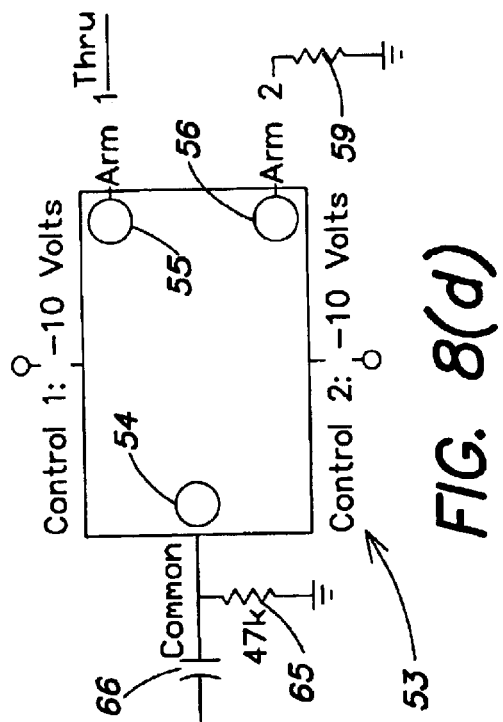
FIG. 8(c) illustrates a third condition of the single-pole, double-throw switch of FIG. 7.
Figure 8D:
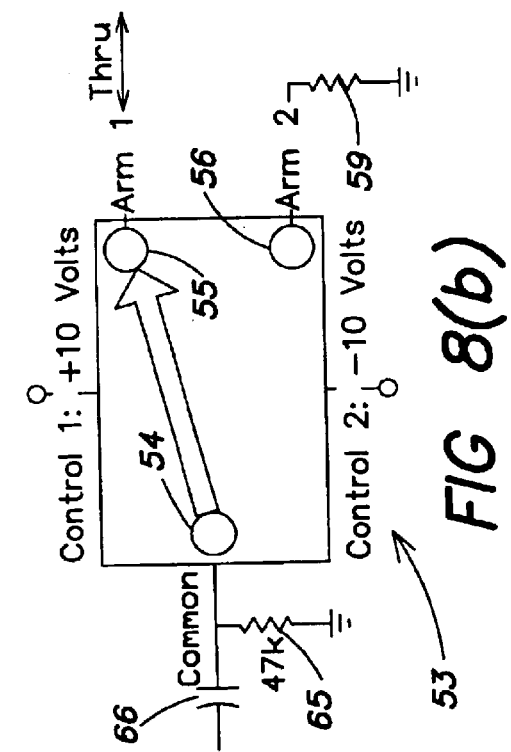
FIG. 8(d) illustrates a fourth condition of the single-pole, double-throw switch of FIG. 7.
Figure 8A:
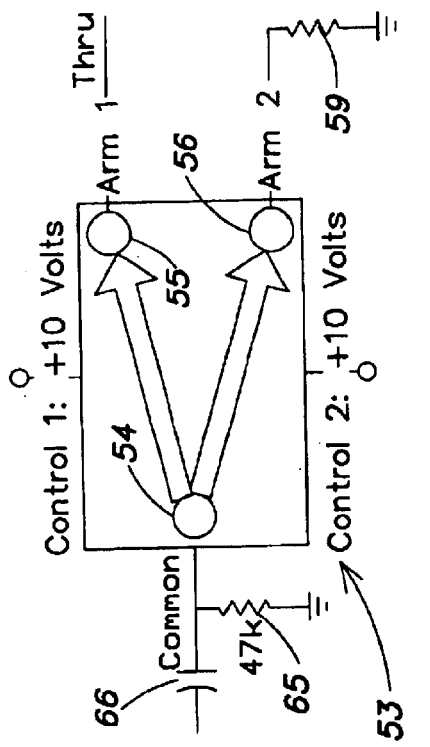
FIG. 8(a) illustrates one condition of the single-pole, double-throw switch of FIG. 7.

For example, referring to FIG. 7, there is illustrated one embodiment of a single-pole, double-throw switching device 53 that can be provided in one embodiment of an N-port automatic calibration device and method of this disclosure, to provide three reflection coefficients as well as a through condition. In other words, FIG. 7 illustrates an embodiment of a single-pole, double-throw switch 53 that can replace any of the single-pole, four-throw switches 301–306 of FIG. 6. The single-pole, double-throw switch 53 comprises a common arm 54 and two output arms 55, 56. The single-pole, double-throw switch further comprises a plurality of FET devices 59, 60, 61, 62, 63 and 64. The single-pole, double-throw switch of FIG. 7 is normally operated in one of two conditions. In the first condition, a control voltage of −10V can be applied to control terminal 57 and a control voltage of +10V can be applied to control arm 58. In this configuration, FETs 62, 64 and 60 are biased to an off-state and FETs 61, 63 and 59 are biased to an on-state. In this arrangement, the common arm 54 is coupled to the second output arm 56 as illustrated in FIG. 8(a). In one embodiment of the single-pole double-throw switch 53, a termination resistance 59 can be provided at the second output arm 56 of the switch 53, such that a termination impedance can be presented by the switch to the common arm 54 of the switch. The N-port calibration device operating in this condition provides one of the three reflection coefficients to be presented by the N-port automatic calibration device.

Figure 8B:
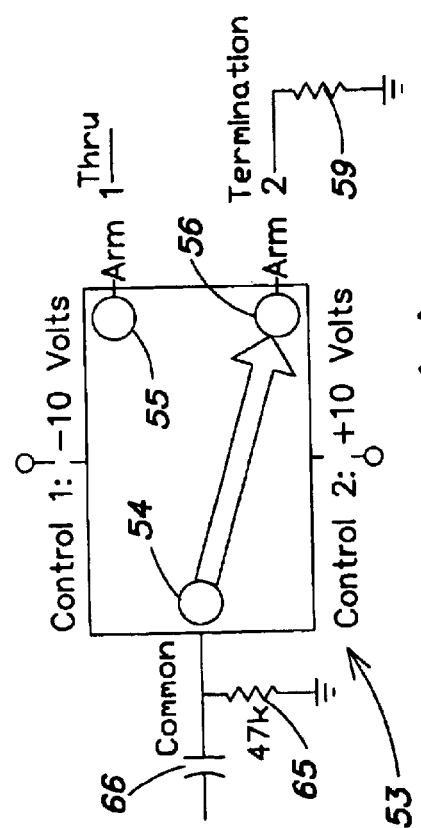
FIG. 8(b) illustrates a second condition of the single-pole, double-throw switch of FIG. 7.

Referring again to FIG. 7, in a second condition of operation of the switch 53, a control voltage of +10V can be applied to first control terminal 57 of the switch 53 and a control voltage of −10V can be applied to the second control terminal 58 of the switch 53. With this arrangement, FETs 60, 64 and 62 are biased-on and FETs 59, 63 and 61 are biased-off. With this arrangement, the common arm 54 of the switch 53 is coupled to the first output arm 55 of the switch as is illustrated in FIG. 8(b). According to one embodiment of an N-port calibration device comprising the single-pole, double-throw switch 53, the output arm 55 can be coupled to any of the pole 307 or any of the throws 317–321 of the single-pole, N−1 throw switch 310 of the N-port calibration device of FIG. 6. Accordingly, an N-port calibration device of FIG. 6 comprising a plurality of switches 53 operating in the second condition, can provide a through connection between any two ports of the N-port calibration device.

Another aspect of an N-port calibration device comprising the single-pole, double-throw switch 53 of FIG. 7, is that the single-pole, double-throw switch 53 can be operated in a third condition. In the third condition, a bias voltage of +10V can be applied to both of control terminals 57 and 58. With this arrangement, all of FETs 59, 60, 61, 62, 63 and 64 are biased to an on condition. Accordingly, with this arrangement the common arm 54 is coupled to both the first output arm 55 and to the second output arm 56 as is illustrated in FIG. 8(c). In other words, a short circuit is provided between the first output arm and the second output arm of the single-pole, double-throw switch of FIG. 7. With this arrangement, a short circuit can be provided to the common arm 54 of the switch 53. Accordingly, an N-port calibration comprising switches 53 operating in a third condition can provide a second reflection coefficient of the three reflection to be presented by the N-port automatic calibration device.

Another aspect of an N-port calibration device comprising the single-pole, double-throw switch 53 of FIG. 7, is that the single-pole, double-throw switch 53 can also be operated in a fourth condition, wherein a control voltage of −10V can be applied to both the first terminal 57 and the second terminal 58 of the switch. With this arrangement, each of FETs 59–64 will be biased to an open state so that the common arm 54 is isolated from each of the first output arm 55 and the second output arm 56, as is illustrated in FIG. 8(d). In other words, an open circuit is provided between the first output arm 55 and the second output arm 56. Accordingly, an N-port calibration device comprising switches 53 and operating in the fourth condition can provide a third reflection coefficient of the three reflection coefficients to be presented by the N-port calibration device.

Figure 9:
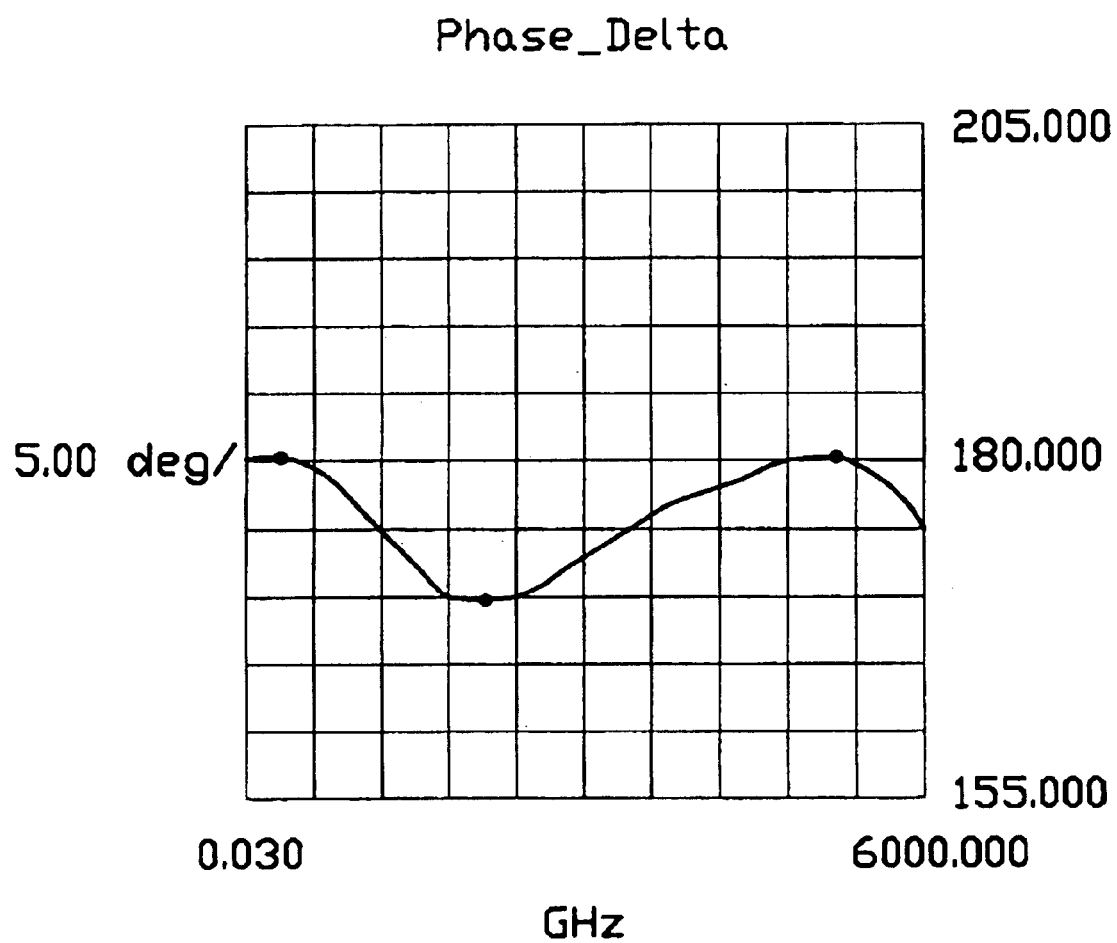
FIG. 9 illustrates the difference in phase presented by the single-pole, double-throw switch of FIG. 7 at a common input arm when operating in the third and fourth conditions.

It is to be appreciated that one advantage of an N-port calibration device comprising a plurality of the single-pole, double-throw switches 53 of FIG. 7 that replace each of the single-pole, four-throw switches 301–306 of FIG. 6, is that three reflection standards provided by the N-port calibration device to each port of the N-port calibration device, can be well distributed throughout the complex impedance plane. FIG. 9 illustrates a difference in phase presented by the single-pole, double-throw switches 53 at the RF common input arm 54 when operating in the third and fourth conditions or, in other words, between providing the short and open conditions described above. It can be seen from FIG. 9, that a phase difference of substantially 180° exists over the frequency range 30 kHz to 6 GHz. Accordingly, with this arrangement, there exist a well distributed phase difference between the short condition and the open condition provided by the single-pole, double-throw switch 53 and by this embodiment of an N-port calibration device of this disclosure. In addition, the third reflection standard is the matched termination provided when the switch is operated in condition one described above, which will lie on a Smith chart mid way between the open and short impedances. Therefore, three reflection standards well distributed throughout the complex impedance plane can be provided by the switch 53 of FIG. 7 incorporated into the N-port calibration device of FIG. 6 as described above.

Figure 10:
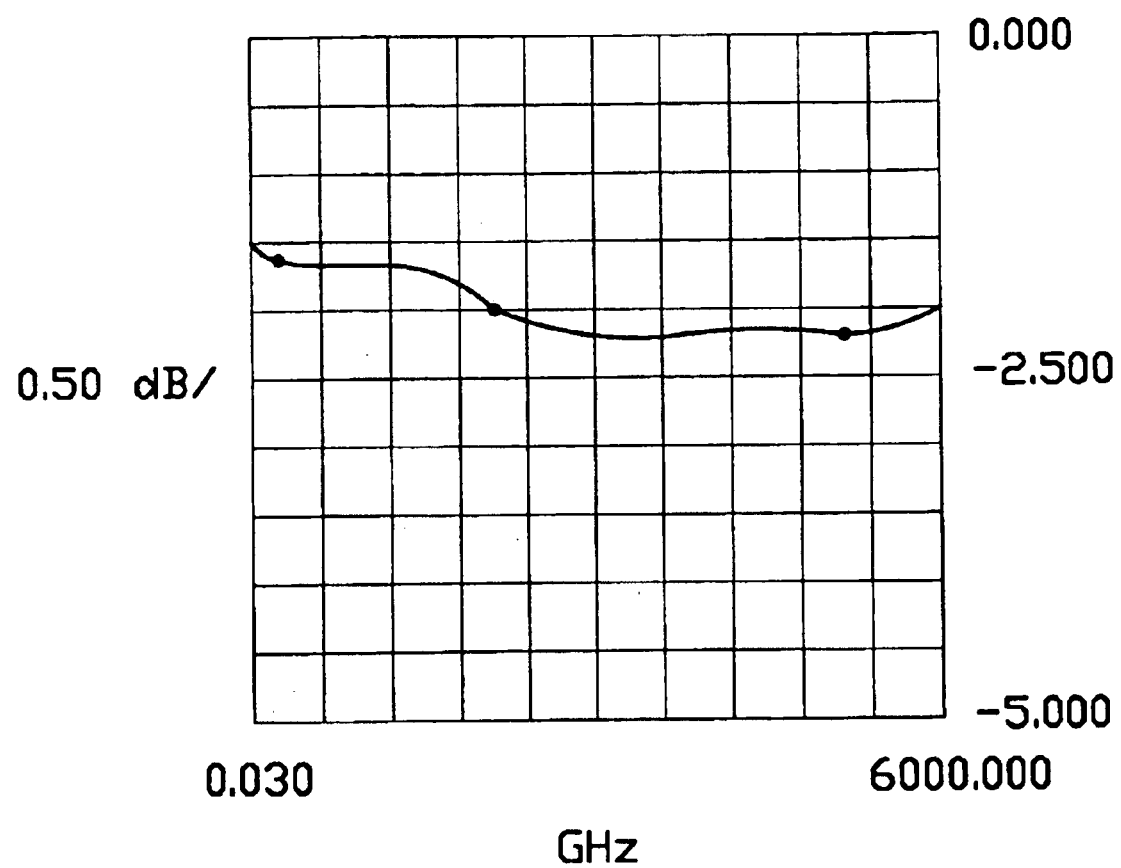
FIG. 10 illustrates a reflection loss of the single-pole, double-throw switch of FIG. 7 when operating in the fourth condition.

In addition, it is to be appreciated that an improved reflection loss and an improved amount of loss in the through state can be provided by the single-pole, double-throw switch 53 of FIG. 7. For example, the single-pole, double-throw switch of FIG. 7 will have a lower loss in the through condition (condition 2) as described above than a single-pole, four-throw switch such as illustrated in FIG. 6. For example, FIG. 10 illustrates a reflection loss of the single-pole, double-throw switch operating in the open fourth condition. In contrast, the reflection loss of a single-pole for throw switch typically has increased loss, for example, because of additional FET devices connected to the common arm than the single-pole, double throw switch of FIG. 7.

According to another aspect of one embodiment of the single-pole, double-throw switch 53 of FIG. 7, it is to be appreciated that it has been observed that when operating the switch in the fourth condition by applying −10V to both control terminals 57 and 58, a −2V operating voltage appears at the common arm 54 of the switch. Accordingly, according to one embodiment of the switch 53 and an N-port calibration device of this disclosure, a blocking capacitor 66 can be provided at the common input port 54 so as to protect any circuitry that the N-port calibration device may be coupled to. In addition, it is to be appreciated that according to another aspect of the single-pole, double-throw switch 53 of FIG. 7, it has been observed that when operating the switch in the fourth condition or, in other words, the open circuit condition, circuit performance repeatability has been observed to be improved by providing a resistor 65 having a value of 47KΩ between the common input arm 54 and ground. According to this embodiment of this disclosure, the switch 53 can be provided with the resistor 65 so as to improve repeatability of the switch with little effect on transmission losses provided by the single-pole, double-throw switch.

As disclosed in the '932 patent, a load match of each port of the N-port MTS can be determined from one of the S-parameters of the N(N−1)/2 through paths of the N-ports of the calibration device, and the three 1-port error coefficients directivity $E_{DI}$, source match $E_{SI}$ and reflection tracking $E_{RI}$ calculated at each port of the MTS. In addition, the '932 patent discloses that an isolation error coefficient for a twelve-term error correction model can also be determined. However, it is to be appreciated that according to some embodiments of an N-port calibration device of this disclosure, the isolation coefficient error term is omitted. While the isolation coefficient has been useful, for example, with VNAs which have limited switch isolation, with newer VNAs that have excellent switch isolation, this isolation error coefficient can no longer be used and can actually introduce more errors in determining an isolation error coefficient. In addition, it is to be appreciated that according to some embodiments of an N-port calibration device of this disclosure, only N−1 through measurements of the N-port calibration device can be made to determine the load match error coefficients for each port of the N-port MTS.

It is to be appreciated that in order to determine systematic error coefficients of an N-port MTS, according to one aspect of some embodiments of an MTS of this disclosure the N-ports of the MTS can be considered as a combination of N(N−1)/2 two port paths. For example, for the four-port MTS illustrated in FIG. 3, the MTS has six 2-port signal paths between ports: 1–2, 1–3, 1–4, 2–3, 2–4 and 3–4. As known to those skilled in the art and as discussed, for example, in U.S. Pat. No. 5,578,932 herein incorporated by reference in its entirety, the standard 2-port S-parameters can be obtained for each of the six two port signal paths and a standard twelve-term error correction can be applied to any measurements made with the MTS to remove test system errors. However, it is to be appreciated that although this twelve-term error correction corrects for any mismatches between the respective two terminals of the DUT and the corresponding two ports of the MTS, it does not correct for any mismatches between the same two terminals of the DUT and the remaining ports of the MTS. Thus, one aspect of some embodiments of the MTS of this disclosure is that the reflection coefficients of each MTS port can be obtained during calibration of the MTS, and can be used in conjunction with the reflection coefficients of the DUT to correct for all mismatches between the two terminals of the DUT and any port of the MTS. It is also to be appreciated that in the measurement of the N(N−1)/2 2-port paths, there are several redundant systematic error coefficients that can be determined. According to another aspect of some embodiments of the MTS of this disclosure, these redundant systematic error coefficients can be eliminated. In addition, according to still another aspect of some embodiments of the MTS of this disclosure, some of the systematic error coefficients can be determined according to an algorithmic process of this disclosure instead of measuring the systematic error coefficients.

The systematic error coefficients of a 2-port VNA have been described, for example, with respect to FIG. 7 of U.S. Pat. No. 5,434,511 (hereinafter "the '511 patent"), which is herein incorporated by reference in its entirety. In addition, the '511 patent discloses how the systematic error coefficients can be determined for a 2-port VNA with the aid of an automatic calibration device. It is to be appreciated that in accordance with some embodiments of the method and apparatus of this disclosure, an automatic calibration device can be used to calibrate an N-port MTS, instead of the mechanical standards typically used in the art (as discussed in the '511 patent).

It is also to be appreciated that according to one aspect of some embodiments of the method and apparatus of this disclosure, an automatic calibration device is particularly suited to embodiments of an MTS of this disclosure, where an increase in the number of ports from 2-ports to N-ports makes it impractical to carry out a manual calibration using mechanical standards. In addition, additional benefits of using an automatic calibration device with embodiments of an MTS of this disclosure comprise: that all of the systematic error coefficients of the MTS can be determined by connecting an automatic calibration device once to the MTS; a calibration accuracy of the MTS can be increased due to a reduced amount of connections and disconnections of calibration device to the MTS; a calibration time is lessened since the calibration is automatic and needs little operator involvement; there is less damage or wear to interface hardware of the MTS and to the automatic calibration device, such as cables and connectors, due to fewer connections that may be made; and the calibration process is less prone to operator error and does not require a high skill set.

According to another aspect of some embodiments of the method and apparatus of this disclosure, it is to be appreciated that the transmission tracking error coefficients (some of the overall systematic error coefficients) can be determined by N−1 through measurements, instead of the N(N−1)/2 through measurements that have been done in the prior art, as was discussed above. For example, for a four-terminal DUT, only three through measurements may be made with certain conditions between any of the six possible 2-terminal signal paths, and all six 2-terminal signal paths 1–2, 1–3, 1–4, 2–3, 2–4 and 3–4 need not be measured.

One condition for measuring all of the transmission tracking error coefficients of an N-port DUT with N–1 through measurements is the selection of N–1 2-terminal paths of the DUT that includes all of the terminals. For example, for the four-terminal DUT, 2-terminal through paths that include all four terminals such as, 1–2, 1–3 and 1–4 can be selected. In contrast, 2-terminal paths 2–3, 2–4, and 3–4 may not be selected if all of the transmission tracking error coefficients are to be measured by N–1 through measurements, because terminal 1 of the DUT has been omitted from the selected two terminal paths.

Figure 14:
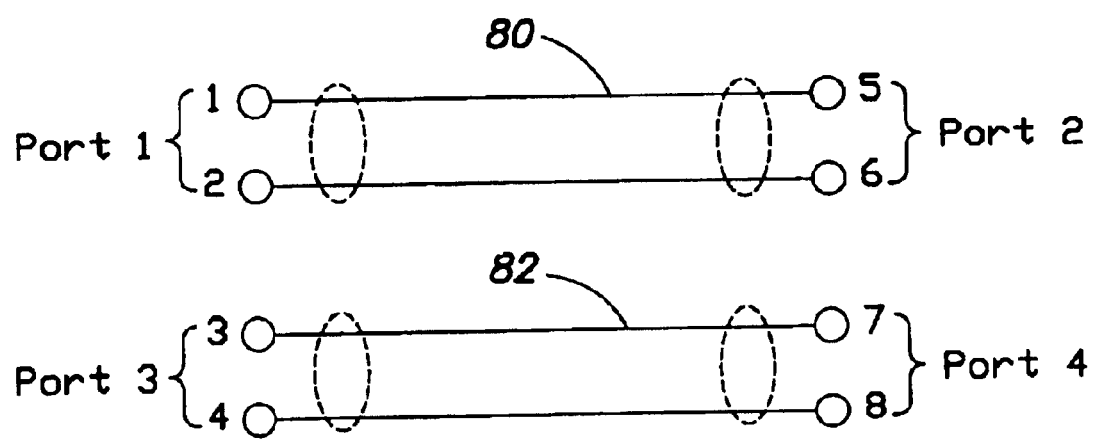
FIG. 14 illustrates a schematic diagram of a two differential transmission line DUT and an exemplary port assignment, according to this disclosure.

Another possible condition for measuring all of the transmission tracking error coefficients of an N-port DUT with N–1 through measurements (for DUTs with more than four terminals) is that a bridging 2-terminal path is selected. For example, referring to FIG. 14 there is illustrated an eight terminal DUT. According to this aspect of this disclosure, an eight terminal DUT can be characterized with seven 2-terminal path measurements. It is to be appreciated that the eight terminal DUT can be considered two four-terminal devices, with a first device comprising terminals 1, 2, 5 and 6 and a second device comprising terminals 3, 4, 7 and 8 as illustrated in FIG. 14. According to the first condition discussed above, the 2-terminal paths 1–2, 1–5, and 1–6 can be selected for the first device and the 2-terminal paths 3–4, 3–7 and 3–8 can be selected for the second device, to provide six of the seven 2-terminal paths. One additional bridging 2-terminal path between the first device and the second device can also be selected. For example, a bridging 2-terminal path can be any one of two terminal paths 1–3, 1–4, 1–7, 1–8, 2–3, 2–4, 2–7, 2–8, 3–5, 3–6, 4–5, 4–6, 5–7, 5–8, 6–7 and 6–8 between the first device and the second device of FIG. 14.

Thus, one advantage of some embodiments of the MTS and automatic calibration device of this disclosure is that a full calibration of the MTS can be accomplished with fewer through measurements than has previously been known. This advantage can be especially important as the number of ports of the MTS system increases. For example, it is to be appreciated that a full through calibration of an eight-port MTS with twenty-eight possible 2-port signal through paths can be done according to some embodiments of this disclosure, with only seven through measurements of the twenty-eight two terminal through paths. Similarly, for a 16-port MTS, a full through calibration can be done with only fifteen through measurements of a possible one hundred and twenty 2-terminal through paths.

Accordingly, it is to be appreciated that according to one aspect of some embodiments of this disclosure, the reflection tracking term error coefficients for the N(N–1)/2 2-port paths can be calculated from N–1 through measurements. For example, a four-port calibration device has a total of six 2-port paths. However, only three through paths can be measured instead of the six, and all of the calibration coefficients of the MTS can still be determined. For a four-port MTS as illustrated in FIG. 3, there are six 2-port paths which are 1–2, 1–3, 1–4, 2–3, 2–4 and 3–4. However, it is to be appreciated that according to some embodiments of the MTS and automatic calibration device of this disclosure, three of the six through paths, such as for example, through paths 1–2, 1–3 and 1–4 can be measured. Referring to equations (2)–(7), a complex variable $K_{ij}$ between two ports of the six possible through paths of the MTS can be defined as:

$$K_{12} = \frac{E_{R1}}{E_{T12}} \quad (2)$$

$$K_{13} = \frac{E_{R1}}{E_{T13}} \quad (3)$$

$$K_{14} = \frac{E_{R1}}{E_{T14}} \quad (4)$$

$$K_{23} = \frac{E_{R2}}{E_{T23}} \quad (5)$$

$$K_{24} = \frac{E_{R2}}{E_{T24}} \quad (6)$$

$$K_{34} = \frac{E_{R3}}{E_{T34}} \quad (7)$$

In equations (2)–(7), the term $E_{TPQ}$ is the forward transmission tracking coefficients between ports P–Q, and the term $E_{TQP}$ is the reverse transmission tracking coefficient between ports P–Q. In addition, the term $E_{RI}$, where I refers to a port number of the MTS, is the reflection tracking coefficient for the corresponding port I=1, 2, 3, 4. It is to be appreciated that all of the parameters on the right side of equations (2)–(4) can be known where the through paths 1–2, 1–3 and 1–4 have been measured with the four-port calibration device coupled to the four-port MTS. It is also to be appreciated that according to some embodiments of the method and apparatus of this disclosure, three of the six through paths for a four-port MTS can be measured to fully calibrate the MTS. Thus, it is to be appreciated that one advantage of some embodiments of the method and apparatus of this disclosure is that for a four-port MTS, three through calibrations can be used to determine all six forward and reverse tracking coefficients for the four-port MTS.

Referring to equation (8), the complex variable $K_{ij}$ between ports 2 and 3 ($K_{23}$) can be calculated from equations (2) and (3).

$$K_{23} = \frac{K_{13}}{K_{12}} = \frac{E_{T12}}{E_{T13}} \quad (8)$$

Referring now to equation (9), from equations (5) and (8), the forward transmission tracking coefficient between ports 2 and 3, $E_{T23}$ is given by:

$$E_{T23} = \frac{E_{R2} E_{T13}}{E_{T12}} \quad (9)$$

Referring to equation (10), the reverse transmission tracking coefficient between ports 2 and 3 is given by:

$$E_{T32} = \frac{E_{R2} E_{R3}}{E_{T23}} \quad (10)$$

Referring to equation (11), the complex variable $K_{ij}$ between ports 2 and 4 ($K_{24}$) can be calculated from equations (2) and (4).

$$K_{24} = \frac{K_{14}}{K_{12}} = \frac{E_{T12}}{E_{T14}} \quad (11)$$

Referring to equation (1), from equations (6) and (11), the forward transmission tracking coefficient between ports 2 and 4 ($E_{T24}$) is given by:

$$E_{T24} = \frac{E_{R2}E_{T14}}{E_{T12}} \quad (12)$$

Referring to equation (13), the reverse transmission tracking coefficient between ports 2–4 is given by:

$$E_{T42} = \frac{E_{R2}E_{R4}}{E_{T24}} \quad (13)$$

Referring to equation (14), from equations (5), (6) and (7), the forward transmission tracking coefficient $E_{T34}$ is given by:

$$E_{T34} = \frac{E_{R3}E_{T23}}{E_{T24}} \quad (14)$$

Referring to equation (15), the reverse transmission tracking coefficient between ports 3–4 is given by:

$$E_{T43} = \frac{E_{R3}E_{R4}}{E_{T34}} \quad (15)$$

Thus, all of the forward and reverse transmission tracking terms for the 2-port paths 2–3, 2–4 and 3–4 can be calculated from the 1-port reflection tracking coefficients at each port of the MTS and from the forward and reverse transmission tracking coefficients of the three 2-port paths 1–2, 1–3 and 1–4.

It is to be appreciated that according to some embodiments of the method and apparatus of this disclosure, the number of through measurements is minimized to N–1 through measurements in order to fully characterize the N-port MTS. For example, for an eight-port MTS which has a total of twenty-eight 2-port through paths, there can be seven through measurements, and three reflection standard measurements at each of the ports to obtain all error correction coefficients for the eight-port MTS including all twenty-eight forward and reverse transmission tracking coefficients. Similarly, a 16-port MTS has a total of one hundred and twenty possible 2-port paths. However, according to some embodiments of the method and apparatus of this disclosure, only fifteen through calibration path measurements as well as three reflection standard measurements at each port, can be measured to obtain all of the error correction coefficients including one hundred and twenty forward and reverse transmission tracking coefficients. It is further to be appreciated that according to some embodiments of the method and apparatus of this disclosure, N–1 of the possible N(N–1)/2 2-port through paths can be measured. Therefore, it is an advantage of some of the embodiments of the method and apparatus of this disclosure that the complexity to calibrate a N-port MTS is greatly reduced.

According to some embodiments of the method and apparatus of this disclosure, a method of calibrating an N-port MTS comprises connecting each port of an N-port calibration device to a port of the N-port MTS, and presenting a plurality of calibration standards to the MTS with the automatic calibration device. For example, a plurality of reflection coefficients comprising three reflection standards are presented by the N-port calibration device to each port of the MTS. From these measurements, a directivity $E_{DI}$, a source match $E_{SI}$ and a reflection tracking coefficient $E_{RI}$ can be determined for each port of the MTS. In addition, a minimum of N–1 2-port through conditions are presented by the N-port calibration device to the N-port MTS and are measured by the MTS. From these measurements, the load match coefficient for each port of the N-port of the MTS can be determined. Further, N–1 forward and reverse transmission tracking coefficients can be determined. From the reflection tracking coefficients of each port and the N–1 forward and reverse transmission tracking coefficients, the forward and reverse transmission tracking coefficients for the remainder of the N(N–1)/2 2-port paths can be determined. For each of a possible the N(N–1)/2 possible 2-port paths of the N-port MTS, twelve-term systematic error coefficients are calculated.

After the N-port MTS has been calibrated with the N-port calibration device as discussed above, the N-port calibration device can be removed from its connection to the MTS, and a DUT to be measured can be coupled to the MTS.

As known to those of skill in the art, for an N-terminal DUT a minimum of $N^2$ measurements can be performed to characterize the N-terminal DUT. For each of a possible N(N–1)/2 2-terminal paths of the N-terminal DUT, the corresponding twelve-term systematic error coefficients of the MTS can be used to correct the measurement of each 2-terminal DUT path. As known to those of skill in the art, the N-terminal DUT will have a total of N(N–1)/2 2-terminal S-parameter subsets. Each 2-terminal S-parameter subset has corresponding four S-parameter elements as illustrated in FIG. 1(a), which are a subset of an N by N S-parameter matrix of the N-terminal DUT. In other words, the N by N S-parameter matrix that characterizes the N-terminal DUT can be broken down into N(N–1)/2 subset 2-terminal S-parameter matrices. For example, a 4-terminal DUT has a sixteen-element S-parameter matrix that can also be represented by six 2-terminal matrices that total twenty-four measured S-parameters. It is to be appreciated that the six 2-terminal matrices have more S-parameters than the sixteen S-parameters that make up the 4-terminal S-parameter matrix, because there can be redundant measurements made of the reflection elements. For example, for the 4-terminal DUT, $S_{11}$, $S_{22}$, $S_{33}$ and $S_{44}$ can be measured two additional times in the six 2-terminal subset matrices.

However, it is to be appreciated that according to some embodiments of the method and apparatus of this disclosure, during N(N–1)/2 2-terminal measurements of an N-terminal DUT, all redundant reflection measurements need not be made. Thus, the measured S-parameters of the N-terminal DUT is equal to $N^2$.

Nevertheless, it is to be appreciated that it is not always possible to provide a reflectionless termination to each terminal of an N-terminal DUT, during the N(N–1)/2 2-terminal measurements (without the redundant measurements). Therefore the 2-terminal measured S-parameters for the DUT may be different from the actual N by N S-parameter matrix. For example, the measured S-parameters can be corrupted by arbitrary terminations presented by the N-port MTS. However, as will be discussed in detail infra, it is to be appreciated that according to some embodiments of the method and apparatus of this disclosure, since the reflection coefficient of each port of the MTS is known, the measured S-parameters of the DUT can be normalized by their corresponding known reflection coefficients.

Referring to equation (16), for each set of N(N–1)/2 2-port S-parameters which are connected by their corresponding 12-term error correction algorithm, the normalized S-parameters (hereinafter "$S_{nj}$") terminated in an arbitrary reflection coefficient $\Gamma_S$ and $\Gamma_L$ is given by:

$$S_{nj}=[\Gamma^*+S][I-\Gamma S]^{-1} j=1,2, \ldots, N(N-1)/2 \quad (16)$$

where $$\Gamma = \begin{bmatrix} \Gamma_S & 0 \\ 0 & \Gamma_L \end{bmatrix},$$

$\Gamma^*$ is complex conjugate of $\Gamma$ and $$I = \begin{bmatrix} 1 & 0 \\ 0 & 1 \end{bmatrix}$$

is the 2 by 2 identity matrix.

The $N(N-1)/2$ normalized S-parameter matrices can be grouped into the N by N S-parameter matrix. As discussed supra, according to one embodiment of the method and apparatus of this disclosure, the redundant reflection coefficients can be measured only once. For example, from (16) the six normalized matrices of a 4-terminal DUT between the six 2-terminal paths 1–2, 1–3, 1–4, 2–3, 2–4 and 3–4 are given by (17):

$$\begin{bmatrix} S_{11} & S_{12} \\ S_{12} & S_{22} \end{bmatrix}, \begin{bmatrix} S_{11} & S_{13} \\ S_{31} & S_{33} \end{bmatrix}, \begin{bmatrix} S_{11} & S_{14} \\ S_{41} & S_{44} \end{bmatrix}, \begin{bmatrix} S_{22} & S_{23} \\ S_{32} & S_{33} \end{bmatrix}, \quad (17)$$

$$\begin{bmatrix} S_{22} & S_{24} \\ S_{42} & S_{44} \end{bmatrix} \text{ and } \begin{bmatrix} S_{33} & S_{34} \\ S_{43} & S_{44} \end{bmatrix}$$

Also, the load reflection coefficients presented by the MTS for the six 2-terminal through paths are given by (18):

$$\begin{bmatrix} \Gamma_1 & 0 \\ 0 & \Gamma_2 \end{bmatrix}, \begin{bmatrix} \Gamma_1 & 0 \\ 0 & \Gamma_3 \end{bmatrix}, \begin{bmatrix} \Gamma_1 & 0 \\ 0 & \Gamma_4 \end{bmatrix}, \quad (18)$$

$$\begin{bmatrix} \Gamma_2 & 0 \\ 0 & \Gamma_3 \end{bmatrix}, \begin{bmatrix} \Gamma_2 & 0 \\ 0 & \Gamma_4 \end{bmatrix} \text{ and}$$

$$\begin{bmatrix} \Gamma_3 & 0 \\ 0 & \Gamma_4 \end{bmatrix}$$

The six 2-terminal matrices of normalized S-parameters can be grouped into one normalized four 4 by 4 S-parameter matrix $[S_n]$ in (19).

$$Sn = \begin{bmatrix} S_{11} & S_{21} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{bmatrix} \quad (19)$$

Also, the six 2-terminal matrices of load reflection coefficients can be grouped into one 4 by 4 load reflection matrix $[\Gamma]$ in (20):

$$\Gamma = \begin{bmatrix} \Gamma_1 & 0 & 0 & 0 \\ 0 & \Gamma_2 & 0 & 0 \\ 0 & 0 & \Gamma_3 & 0 \\ 0 & 0 & 0 & \Gamma_4 \end{bmatrix} \quad (20)$$

The standard S-parameters of an N-terminal DUT normalized to a given reference impedance such as 50 Ω can be determined from the normalized Sn matrix, the load reflection coefficient matrix $\Gamma$ and an identity matrix I. Referring to equation (21), the standard S-parameters [S] of an N-terminal device can be given by (21):

$$S=[I+S_n\Gamma]^{-1}[S_n-\Gamma^*] \quad (21)$$

where $$Sn = \begin{bmatrix} S_{11} & S_{12} & \ldots & S_{1j} \\ S_{21} & S_{22} & \ldots & S_{2j} \\ \vdots & \vdots & \ldots & \vdots \\ S_{il} & S_{i2} & \ldots & S_{ij} \end{bmatrix} i = 1, 2, \ldots, N \text{ and } j = 1, 2, \ldots, N.$$

$$\Gamma = \begin{bmatrix} \Gamma_1 & 0 & \ldots & 0 \\ 0 & \Gamma_2 & \ldots & 0 \\ \vdots & \vdots & \ldots & \vdots \\ 0 & 0 & \ldots & \Gamma_{ij} \end{bmatrix} \Gamma = \Gamma_i \text{ for } i = j \text{ and } \Gamma = 0 \text{ for } i \neq j.$$

$$I = \begin{bmatrix} 1 & 0 & \ldots & 0 \\ 0 & 1 & \ldots & 0 \\ \vdots & \vdots & \ldots & \vdots \\ 0 & 0 & \ldots & 1 \end{bmatrix} I = 1 \text{ for } i = j \text{ and } I = 0 \text{ for } i \neq j.$$

It is to be appreciated that there are presently no traceable calibration artifacts from any standards laboratory for greater than a 2-terminal device. Thus, according to one aspect of some embodiments of the MTS of this disclosure, an N-terminal DUT can be broken down into $N(N-1)/2$ 2-terminal measurements to comply with available calibration artifacts. It is also to be appreciated that according to another aspect of some embodiments of the MTS of this disclosure, redundant measurements of the DUT can be eliminated. It is further to be appreciated that according to another aspect of some embodiments of the MTS of this disclosure, measurements of the DUT with the MTS can be modified to correct for imperfect terminations presented to the terminals of the DUT by the MTS.

According to some embodiments of the method and MTS apparatus of this disclosure, characterization of a multi-terminal device can be provided for balanced circuits or mixed-mode multi-terminal devices. As was discussed supra, some of the benefits of using differential circuits in the high speed digital communications environment in comparison to single-ended devices, are immunity to electromagnetic interference, suppression of even-order harmonics and higher tolerance to non-ideal grounds. With today's digital communication systems, data transfer rates are increasing drastically. In addition, digital data streams for video, HDTV, graphics, serial interface and many other applications are resulting in higher and higher bandwidth. These digital communication systems may comprise high-speed interconnects between chips, functional boards and systems. It is to be appreciated that although the data transmitted is digital, the transmission media that the digital data travels along may be analog with a differential circuit topology. Thus, differential circuit topology is extensively used in high speed digital data communication applications.

According to some embodiments of the method and apparatus of this disclosure, the measurement and analysis of differential circuits can be achieved by transformation of standard single-ended S-parameters into mixed-mode S-parameters $[S_{mm}]$. As was discussed supra and in the Bockelman IEEE Article, mixed-mode S-parameters of a linear balanced devices corresponding to waves propagating in several coupled modes can be determined from a standard S-parameter matrix, and comprise:

[$S_{dd}$] a pure differential-mode;
[$S_{cc}$] a pure common-mode;
[$S_{dc}$] conversion from the common-mode to the differential-mode; and

[S$_{cd}$] conversion from the differential-mode to the common-mode.

However, it is to be appreciated that with today's communication systems, there may be single-ended devices that may interface with a balanced device. Also, there may be DUTs where both single-ended and balanced topologies are integrated together as one DUT or system. Thus, according to some embodiments of the method and apparatus of this disclosure, there is provided a general solution to determine the mixed-mode S-parameter matrix [S$_{mm}$] for any multiple single-ended and multiple balanced topologies for any N-terminal DUT. Additional elements of the mixed-mode S-parameter matrix of this disclosure include purely single ended parameters as well as parameters that represent a conversion of single-ended to balanced and balanced to single-ended modes. The mixed-mode S-parameters matrix [S$_{mm}$] can be determined from a linear combination of the standard multi-port S-parameter matrix [S].

According to some embodiments of the method and apparatus of this disclosure, there is provided mixed-mode S-parameter matrix [S$_{mm}$] that can represent a mixture of single-ended and balanced parameters. These parameters comprise:

[S$_{ss}$], which is a pure single-ended parameter;

[S$_{ds}$], which is a conversion of a single-ended parameter to a differential parameter;

[S$_{sd}$], which is a conversion of a differential parameter to a single-ended parameter;

[S$_{cs}$], which is a conversion of a single-ended parameter to a common-mode parameter; and

[S$_{sc}$], which is a conversion of a common-mode parameter to a single-ended parameter.

According to some embodiments of the method and apparatus of this disclosure, the standard S-parameter matrix [S] can be transformed into the mixed-mode S-parameter matrix [S$_{mm}$] through a similarity transformation with use of a scalar orthogonal matrix [M]. The [S] and the [S$_{mm}$] have the same eigenvalues and different eigenvectors.

Referring to equation (22), it is to be appreciated that according to some embodiments of the method and apparatus of this disclosure, the single-ended matrix [S] can be mapped into the mixed-mode S-parameter matrix [S$_{mm}$], by Equation (22).

$$S_{mm} = MSM^{-1} \tag{22}$$

where

S$_{mm}$ is the mixed-mode S-parameter matrix, [S] is the standard unbalanced S-parameter matrix characterized by some embodiments of the MTS of this disclosure and [M] is the scalar orthogonal matrix. It is to be appreciated that none of the elements of the [M] are complex. It is also to be appreciated that according to some embodiments of the method and apparatus of this disclosure, the columns of the scalar orthogonal matrix [M] describe the physical terminals of the DUT and the rows of the [M] describe scalar coefficients corresponding to a specific mode of operation of the DUT. Further, a remainder of the elements of the scalar orthogonal matrix [M] can be set to 0.

According to some embodiments of the method and apparatus of this disclosure, a method of assigning the scalar coefficients to the scalar orthogonal matrix [M] corresponding to specific modes of the DUT, comprises: assigning a value of 1 for each column of the [M] and a corresponding row for each single-ended input and output terminal of the DUT; assigning a value of $1/\sqrt{2}$ and $-1/\sqrt{2}$ for each column of the [M] and a corresponding row for each terminal of a balanced input and output pair of the DUT which can be operated in a differential mode; and assigning a value of $1/\sqrt{2}$ and $1/\sqrt{2}$ for each column of the [M] and a corresponding row for each terminal of a balanced input and output pair of the DUT which can be operated in a common-mode.

Figure 11:
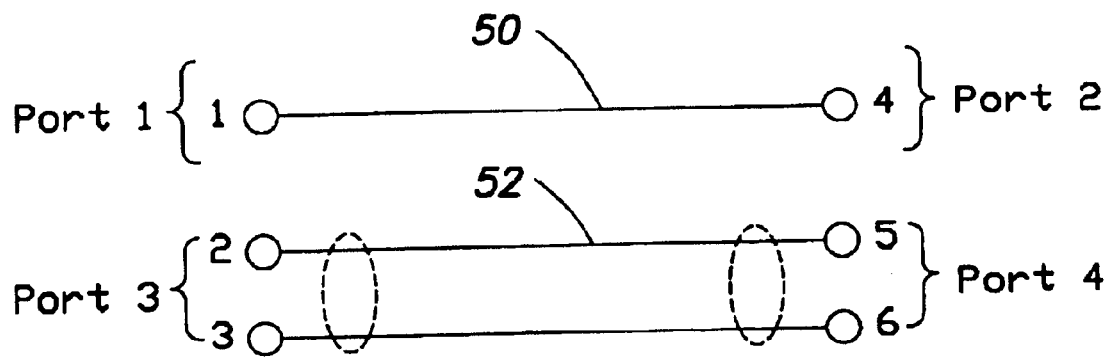
FIG. 11 illustrates a schematic representation of a combined single-ended transmission line and a balanced transmission line, according to this disclosure.

Referring to FIG. 11, there is illustrated a schematic representation of a combined single-ended transmission line 50 and a balanced transmission line 52. The mixed-mode S-parameters of the combined single-ended transmission line and balanced transmission line can be determined by measuring a standard 6×6 S-parameter matrix for the six terminals of the DUT illustrated in FIG. 11, with a MTS of this disclosure. A 6×6 S-parameter matrix [S] can be written as represented by (23):

$$S = \begin{bmatrix} S_{11} & S_{12} & S_{13} & S_{14} & S_{15} & S_{16} \\ S_{21} & S_{22} & S_{23} & S_{24} & S_{25} & S_{26} \\ S_{31} & S_{32} & S_{33} & S_{34} & S_{35} & S_{36} \\ S_{41} & S_{42} & S_{43} & S_{44} & S_{45} & S_{46} \\ S_{51} & S_{52} & S_{53} & S_{54} & S_{55} & S_{56} \\ S_{61} & S_{62} & S_{63} & S_{64} & S_{65} & S_{65} \end{bmatrix} \tag{23}$$

Referring to the above-described coefficients for the scalar orthogonal matrix [M] and to FIG. 11, there is now illustrated an example of assigning scalar coefficients of a scalar orthogonal matrix to the illustrated DUT. Terminal 1 of the DUT of FIG. 11 is a single-ended parameter. In one embodiment, a first row and a second row of the [M] can correspond to single-ended operation of the DUT. Therefore, the first row, first column of the [M] can be assigned a value of 1. In addition, a remainder of elements of the first row can be set to a value of zero. Since terminal 4 of the DUT of FIG. 11 is also a single-ended parameter, the second row, fourth column of the scalar orthogonal matrix [M] can also be set to a value of 1. The remainder of elements of the second row can also be set to zero.

In one embodiment, the third and fourth rows of the [M] can correspond to differential operation of the DUT. Referring to FIG. 11, terminals 2 and 3 of the DUT can constitute a differential input pair for the DUT, and therefore a third row, second column of the scalar orthogonal matrix [M] can be set to $1/\sqrt{2}$ and the third row, third column of the scalar orthogonal matrix [M] can be set to $-1/\sqrt{2}$. In addition, a remainder of elements of the third row can be set to zero. Since terminals 5 and 6 of the DUT can also constitute a differential output pair of the DUT, the fourth row, fifth column of the scalar orthogonal matrix [M] can be set to $1/\sqrt{2}$ and the fourth row, sixth column of the scalar orthogonal matrix [M] can be set to $-1/\sqrt{2}$. A remainder of the elements of the fourth row can also be set to zero.

In one embodiment, the fifth and sixth rows of the [M] can correspond to common mode operation of the DUT. Referring again to FIG. 11, since terminals 2 and 3 of the DUT can also constitute a common input pair of the DUT, a fifth row, second column of the scalar orthogonal matrix [M] can be set to $1/\sqrt{2}$ and a fifth row, third column of the [M] can also be set to $1/\sqrt{2}$. A remainder of the elements of the fifth row can be set to zero. Similarly, since terminals 5 and 6 of the DUT can also constitute a common output pair of the DUT, a sixth row, fifth column of the scalar orthogonal matrix [M] can be set to $1/\sqrt{2}$ and a sixth row, sixth column of the [M] can be set to $1/\sqrt{2}$. The remainder of elements of the sixth row are also set to zero. With the above-illustrated exemplary embodiment for assigning coefficients to the scalar orthogonal matrix, the following scalar orthogonal matrix [M] can be provided by (24):

$$M = \begin{bmatrix} 1 & 0 & 0 & 0 & 0 & 0 \\ 0 & 0 & 0 & 1 & 0 & 0 \\ 0 & \frac{1}{\sqrt{2}} & -\frac{1}{\sqrt{2}} & 0 & 0 & 0 \\ 0 & 0 & 0 & 0 & \frac{1}{\sqrt{2}} & -\frac{1}{\sqrt{2}} \\ 0 & \frac{1}{\sqrt{2}} & \frac{1}{\sqrt{2}} & 0 & 0 & 0 \\ 0 & 0 & 0 & 0 & \frac{1}{\sqrt{2}} & \frac{1}{\sqrt{2}} \end{bmatrix} \quad (24)$$

It is to be appreciated that a transpose of the scalar orthogonal matrix [M] is equal to its inverse. Therefore, by taking the transpose of the [M] and from equation (22) above, the mixed-mode S-parameter matrix $[S_{mm}]$ of the DUT of FIG. 11 can be determined as (25):

$$\begin{bmatrix} S_{11} & S_{14} & \frac{S_{12}-S_{13}}{\sqrt{2}} & \frac{S_{15}-S_{16}}{\sqrt{2}} & \frac{S_{12}+S_{13}}{\sqrt{2}} & \frac{S_{15}+S_{16}}{\sqrt{2}} \\ S_{41} & S_{44} & \frac{S_{42}-S_{43}}{\sqrt{2}} & \frac{S_{45}-S_{46}}{\sqrt{2}} & \frac{S_{42}+S_{43}}{\sqrt{2}} & \frac{S_{45}+S_{46}}{\sqrt{2}} \\ \frac{S_{21}-S_{31}}{\sqrt{2}} & \frac{S_{42}-S_{43}}{\sqrt{2}} & \frac{1}{2}(S_{22}-S_{23}-S_{32}+S_{33}) & \frac{1}{2}(S_{25}-S_{26}-S_{35}+S_{36}) & \frac{1}{2}(S_{22}+S_{23}-S_{32}-S_{33}) & \frac{1}{2}(S_{25}+S_{26}-S_{35}-S_{36}) \\ \frac{S_{51}-S_{61}}{\sqrt{2}} & \frac{S_{54}-S_{64}}{\sqrt{2}} & \frac{1}{2}(S_{52}-S_{53}-S_{62}+S_{63}) & \frac{1}{2}(S_{55}-S_{56}-S_{65}+S_{66}) & \frac{1}{2}(S_{52}+S_{53}-S_{62}-S_{63}) & \frac{1}{2}(S_{55}+S_{56}-S_{65}-S_{66}) \\ \frac{S_{21}+S_{31}}{\sqrt{2}} & \frac{S_{42}+S_{43}}{\sqrt{2}} & \frac{1}{2}(S_{22}-S_{23}+S_{32}-S_{33}) & \frac{1}{2}(S_{25}-S_{26}+S_{35}-S_{36}) & \frac{1}{2}(S_{22}+S_{23}+S_{32}+S_{33}) & \frac{1}{2}(S_{25}+S_{26}+S_{35}+S_{36}) \\ \frac{S_{51}-S_{61}}{\sqrt{2}} & \frac{S_{54}+S_{64}}{\sqrt{2}} & \frac{1}{2}(S_{52}-S_{53}+S_{62}-S_{63}) & \frac{1}{2}(S_{55}-S_{56}+S_{65}-S_{66}) & \frac{1}{2}(S_{52}+S_{53}+S_{62}+S_{63}) & \frac{1}{2}(S_{55}+S_{56}+S_{65}+S_{66}) \end{bmatrix} \quad (25)$$

Referring again to FIG. 11, six single-ended ports of a 6-port MTS can be coupled to the six terminals of the DUT. The mixed-mode S-parameters for the DUT of FIG. 11 can be defined as single ended and balanced ports. For example, Port 1 and Port 2 are single ended ports and Port 3 and Port 4 are balanced ports. For this mixed mode port configuration of the DUT, the mixed-mode S-parameter matrix of the DUT can be summarized as (26):

$$\begin{bmatrix} S_{ss11} & S_{ss12} & S_{sd13} & S_{sd14} & S_{sc13} & S_{sc14} \\ S_{ss21} & S_{ss22} & S_{sd23} & S_{sd24} & S_{sc23} & S_{sc24} \\ S_{ds31} & S_{ds32} & S_{dd33} & S_{dd34} & S_{dc33} & S_{dc34} \\ S_{ds41} & S_{ds42} & S_{dd43} & S_{dd44} & S_{dc43} & S_{dc44} \\ S_{cs31} & S_{cs32} & S_{cd33} & S_{cd34} & S_{cc33} & S_{cc34} \\ S_{cs41} & S_{cs42} & S_{cd43} & S_{cd44} & S_{cc43} & S_{cc44} \end{bmatrix} \quad (26)$$

For the mixed mode S-parameter matrix (26) for the DUT of FIG. 11: $S_{ss11}$ is the single ended reflection coefficient of Port 1 of the mixed mode DUT; $S_{ss22}$ is the single ended reflection coefficient of Port 2 of the mixed mode DUT; $S_{ss21}$ is the single ended transmission coefficient from Port 1 to Port 2 of the mixed mode DUT; and $S_{ss12}$ is the single ended transmission coefficient from Port 2 to Port 1 of the mixed mode DUT.

In addition, $S_{sd13}$ is the conversion from a differential parameter to a single ended parameter between Port 3 and Port 1 of the mixed mode DUT; $S_{sd14}$ is the conversion from a differential parameter to a single ended parameter between Port 4 and Port 1 of the mixed mode DUT; $S_{sd23}$ is the conversion from a differential parameter to a single ended parameter between Port 3 and Port 2 of the mixed mode DUT; and $S_{sd24}$ is the conversion from a differential parameter to a single ended parameter between Port 4 and Port 2 of the mixed mode DUT.

Further, $S_{sc13}$ is the conversion from a common mode parameter to a single ended parameter between Port 3 and Port 1 of the mixed mode DUT; $S_{sc23}$ is the conversion from a common mode parameter to a single ended parameter between Port 3 and Port 2 of the mixed mode DUT; $S_{sc14}$ is the conversion from a common mode parameter to a single ended parameter between Port 4 and Port 1 of the mixed mode DUT; and $S_{sc24}$ is the conversion from a common mode parameter to a single ended parameter between Port 4 and Port 2 of the mixed mode DUT.

Still further, $S_{ds31}$ is the conversion from a single ended parameter to a differential parameter between Port 1 and Port 3 of the mixed mode DUT; $S_{ds32}$ is the conversion from a single ended parameter to a differential parameter between Port 2 and Port 3 of the mixed mode DUT; $S_{ds41}$ is the conversion from a single ended parameter to a differential parameter between Port 1 and Port 4 of the mixed mode DUT; and $S_{ds42}$ is the conversion from a single ended parameter to a differential parameter between Port 2 and Port 4 of the mixed mode DUT.

Also, $S_{cs31}$ is the conversion from a single ended parameter to a common mode parameter between Port 1 and Port 3 of the mixed mode DUT; $S_{cs32}$ is the conversion from a single ended parameter to a common mode parameter between Port 2 and Port 3 of the mixed mode DUT; $S_{cs41}$ is the conversion from a single ended parameter to a common mode parameter between Port 1 and Port 4 of the mixed mode DUT; and $S_{sc42}$ is the conversion from a single ended parameter to a common mode parameter between Port 2 and Port 4 of the mixed mode DUT.

It is to be appreciated that in the mixed mode S-parameter matrix (26) for the DUT of FIG. 11 a remainder of the parameters represent the parameters discussed in the Bockelman IEEE Article. Parameters $S_{dd33}$, $S_{dd34}$, $S_{dd43}$ and $S_{dd44}$ represent the behavior of the DUT when it is stimulated with a differential-mode signal and a differential-mode response is observed. There are four parameters including reflection parameters $S_{dd33}$, $S_{dd44}$ and transmission parameters $S_{dd43}$, $S_{dd34}$ for ports three and four of the DUT. In addition, Parameters $S_{cc33}$, $S_{cc34}$, $S_{cc43}$ and $S_{cc44}$ represent the behavior of the DUT when it is stimulated with a common-mode signal and a common-mode response is observed. There are four parameters including reflection parameters $S_{cc33}$, $S_{cc44}$ and transmission parameters $S_{cc43}$, $S_{cc34}$ for ports three and four of the DUT.

Further, the mode conversion parameters $S_{cd33}$, $S_{cd34}$, $S_{cd43}$, and $S_{cd44}$ represent the behavior of the DUT when it is stimulated with a differential-mode signal and a common-mode response is observed. Still further, parameters $S_{dc33}$, $S_{dc34}$, $S_{dc43}$ and $S_{dc44}$ represent the behavior of the DUT when it is stimulated with a common-mode signal and a differential-mode response is observed.

Figure 12:
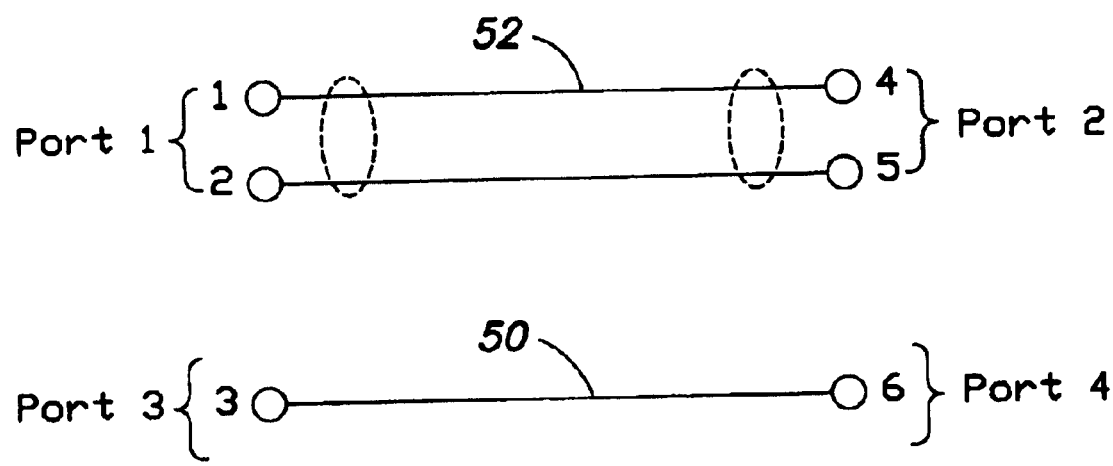
FIG. 12 illustrates a schematic of the DUT of FIG. 11 with alternative port assignments of a 6-port MTS to the DUT of the FIG. 11.
Figure 13:
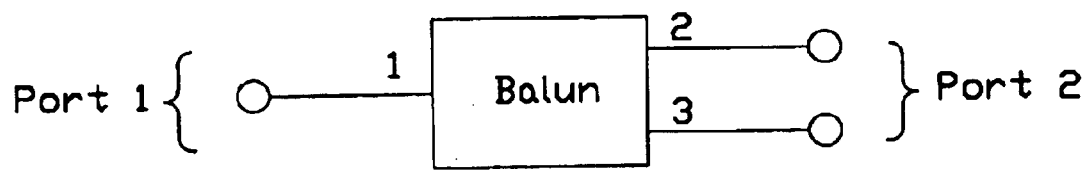
FIG. 13 illustrates a schematic diagram of a balun DUT and one example of a port assignment, according to this disclosure.

There will now be described another embodiment of a method of determining the mixed mode S-parameters [$S_{mm}$] of a DUT. Referring to FIG. 12, there is illustrated a schematic of the DUT of FIG. 11 with the single-ended cable 50 coupled to ports 3, 6 of an embodiment of a 6port MTS and with the differential cable 52 coupled to ports 1, 2, 4 and 5 of the 6port MTS. According to the above-described embodiment, the mixed-mode S-parameter matrix [$S_{mm}$] of the DUT of FIG. 12 can be determined as (27):

of a DUT. Referring now to FIG. 13, there is illustrated a schematic diagram of a balun. As known to those of skill in the art baluns provide an interface from a single-ended circuit at terminal 1 of the balun to a balanced circuit at terminals 2 and 3 of the balun. The mixed-mode S-parameters [$S_{mm}$] of the balun can be determined according to the above described methodology and for the terminal connections of the balun to a 3-port MTS of this disclosure, as illustrated in FIG. 13, with port 1, 2 and 3 of the MTS coupled to terminals 1, 2 and 3 of the balun. For this $$\begin{bmatrix} \frac{1}{2}(S_{11}-S_{12}-S_{21}+S_{22}) & \frac{1}{2}(S_{14}-S_{15}-S_{24}+S_{25}) & \frac{1}{2}(S_{11}-S_{12}-S_{21}+S_{22}) & \frac{1}{2}(S_{14}-S_{15}-S_{24}+S_{25}) & \frac{S_{13}-S_{23}}{\sqrt{2}} & \frac{S_{16}-S_{26}}{\sqrt{2}} \\ \frac{1}{2}(S_{41}-S_{42}-S_{51}+S_{52}) & \frac{1}{2}(S_{44}-S_{45}-S_{54}+S_{55}) & \frac{1}{2}(S_{41}-S_{42}-S_{51}+S_{52}) & \frac{1}{2}(S_{44}-S_{45}-S_{54}+S_{55}) & \frac{S_{43}-S_{53}}{\sqrt{2}} & \frac{S_{46}-S_{56}}{\sqrt{2}} \\ \frac{1}{2}(S_{11}-S_{12}-S_{21}+S_{22}) & \frac{1}{2}(S_{14}-S_{15}-S_{24}+S_{25}) & \frac{1}{2}(S_{11}-S_{12}-S_{21}+S_{22}) & \frac{1}{2}(S_{14}-S_{15}-S_{24}+S_{25}) & \frac{S_{13}-S_{23}}{\sqrt{2}} & \frac{S_{16}-S_{26}}{\sqrt{2}} \\ \frac{1}{2}(S_{41}-S_{42}-S_{51}+S_{52}) & \frac{1}{2}(S_{44}-S_{45}-S_{54}+S_{55}) & \frac{1}{2}(S_{41}-S_{42}-S_{51}+S_{52}) & \frac{1}{2}(S_{44}-S_{45}-S_{54}+S_{55}) & \frac{S_{43}-S_{53}}{\sqrt{2}} & \frac{S_{46}-S_{56}}{\sqrt{2}} \\ \frac{S_{31}-S_{32}}{\sqrt{2}} & \frac{S_{34}-S_{35}}{\sqrt{2}} & \frac{S_{31}-S_{32}}{\sqrt{2}} & \frac{S_{34}-S_{35}}{\sqrt{2}} & S_{33} & S_{36} \\ \frac{S_{61}-S_{62}}{\sqrt{2}} & \frac{S_{64}-S_{65}}{\sqrt{2}} & \frac{S_{61}-S_{62}}{\sqrt{2}} & \frac{S_{64}-S_{65}}{\sqrt{2}} & S_{63} & S_{66} \end{bmatrix} \quad (27)$$

There will now be described another embodiment of a method of determining the mixed-mode S-parameters [$S_{mm}$] arrangement, the [S], the [M] and the [$S_{mm}$] matrices can be given by (28):

$$S = \begin{bmatrix} S_{11} & S_{12} & S_{13} \\ S_{21} & S_{22} & S_{23} \\ S_{31} & S_{32} & S_{33} \end{bmatrix} \quad (28)$$

$$M = \begin{bmatrix} 1 & 0 & 0 \\ 0 & \frac{1}{\sqrt{2}} & -\frac{1}{\sqrt{2}} \\ 0 & \frac{1}{\sqrt{2}} & \frac{1}{\sqrt{2}} \end{bmatrix}$$

$$Smm = \begin{bmatrix} S_{11} & \frac{S_{12}-S_{13}}{\sqrt{2}} & \frac{S_{12}+S_{13}}{\sqrt{2}} \\ \frac{S_{21}-S_{31}}{\sqrt{2}} & \frac{1}{2}(S_{22}-S_{23}-S_{32}+S_{33}) & \frac{1}{2}(S_{22}+S_{23}-S_{32}-S_{33}) \\ \frac{S_{21}-S_{31}}{\sqrt{2}} & \frac{1}{2}(S_{22}-S_{23}+S_{32}-S_{33}) & \frac{1}{2}(S_{22}+S_{23}+S_{32}+S_{33}) \end{bmatrix}$$

where $$\begin{bmatrix} S_{ss11} & S_{sd12} & S_{sc12} \\ S_{ds21} & S_{dd22} & S_{dc22} \\ S_{cs21} & S_{cd22} & S_{cc22} \end{bmatrix}$$

There will now be described another embodiment of a method of determining the mixed-mode S-parameters [$S_{mm}$] of a DUT. Referring now to FIG. 14, there is illustrated a schematic diagram of two differential transmission lines 80, 82, which can comprise part of a high-speed serial databus that can be used, for example, to transport digital data between computers and peripheral devices at transfer rates of, for example, one Gigabit per second (Gb/s). The mixed-mode S-parameters of the two differential transmission lines can be determined from the above described methodology. The [S], [M] and [$S_{mn}$] matrices can be given by (29):

$$S = \begin{pmatrix} S_{11} & S_{12} & S_{13} & S_{14} & S_{15} & S_{16} & S_{17} & S_{18} \\ S_{21} & S_{22} & S_{23} & S_{24} & S_{25} & S_{26} & S_{27} & S_{28} \\ S_{31} & S_{32} & S_{33} & S_{34} & S_{35} & S_{36} & S_{37} & S_{38} \\ S_{41} & S_{42} & S_{43} & S_{44} & S_{45} & S_{46} & S_{47} & S_{48} \\ S_{51} & S_{52} & S_{53} & S_{54} & S_{55} & S_{56} & S_{57} & S_{58} \\ S_{61} & S_{62} & S_{63} & S_{64} & S_{65} & S_{66} & S_{67} & S_{68} \\ S_{71} & S_{72} & S_{73} & S_{74} & S_{75} & S_{76} & S_{77} & S_{78} \\ S_{81} & S_{82} & S_{83} & S_{84} & S_{85} & S_{86} & S_{87} & S_{88} \end{pmatrix} \qquad (29)$$

$$M = \begin{pmatrix} \frac{1}{\sqrt{2}} & \frac{1}{\sqrt{2}} & 0 & 0 & 0 & 0 & 0 & 0 \\ 0 & 0 & 0 & 0 & \frac{1}{\sqrt{2}} & -\frac{1}{\sqrt{2}} & 0 & 0 \\ 0 & 0 & \frac{1}{\sqrt{2}} & -\frac{1}{\sqrt{2}} & 0 & 0 & 0 & 0 \\ 0 & 0 & 0 & 0 & 0 & 0 & \frac{1}{\sqrt{2}} & -\frac{1}{\sqrt{2}} \\ \frac{1}{\sqrt{2}} & \frac{1}{\sqrt{2}} & 0 & 0 & 0 & 0 & 0 & 0 \\ 0 & 0 & 0 & 0 & \frac{1}{\sqrt{2}} & \frac{1}{\sqrt{2}} & 0 & 0 \\ 0 & 0 & \frac{1}{\sqrt{2}} & \frac{1}{\sqrt{2}} & 0 & 0 & 0 & 0 \\ 0 & 0 & 0 & 0 & 0 & 0 & \frac{1}{\sqrt{2}} & \frac{1}{\sqrt{2}} \end{pmatrix}$$

and $$Smm = \begin{bmatrix} S_{dd} & S_{dc} \\ S_{cd} & S_{cc} \end{bmatrix}$$

where $$S_{dd} = \begin{pmatrix} \frac{1}{2}(S_{11} - S_{12} - S_{21} + S_{22}) & \frac{1}{2}(S_{15} - S_{16} - S_{25} + S_{26}) & \frac{1}{2}(S_{13} - S_{14} - S_{23} + S_{24}) & \frac{1}{2}(S_{17} - S_{18} - S_{27} + S_{28}) \\ \frac{1}{2}(S_{51} - S_{52} - S_{61} + S_{62}) & \frac{1}{2}(S_{55} - S_{56} - S_{65} + S_{66}) & \frac{1}{2}(S_{53} - S_{54} - S_{63} + S_{64}) & \frac{1}{2}(S_{57} - S_{58} - S_{67} + S_{68}) \\ \frac{1}{2}(S_{31} - S_{32} - S_{41} + S_{42}) & \frac{1}{2}(S_{35} - S_{36} - S_{45} + S_{46}) & \frac{1}{2}(S_{33} - S_{34} - S_{43} + S_{44}) & \frac{1}{2}(S_{37} - S_{38} - S_{47} + S_{48}) \\ \frac{1}{2}(S_{71} - S_{72} - S_{81} + S_{82}) & \frac{1}{2}(S_{75} - S_{76} - S_{85} + S_{86}) & \frac{1}{2}(S_{73} - S_{74} - S_{83} + S_{84}) & \frac{1}{2}(S_{77} - S_{78} - S_{87} + S_{88}) \end{pmatrix}$$

$$S_{dc} = \begin{pmatrix} \frac{1}{2}(S_{11} + S_{12} - S_{21} - S_{22}) & \frac{1}{2}(S_{15} + S_{16} - S_{25} - S_{26}) & \frac{1}{2}(S_{13} + S_{14} - S_{23} - S_{24}) & \frac{1}{2}(S_{17} + S_{18} - S_{27} - S_{28}) \\ \frac{1}{2}(S_{51} + S_{52} - S_{61} - S_{62}) & \frac{1}{2}(S_{55} + S_{56} - S_{65} - S_{66}) & \frac{1}{2}(S_{53} + S_{54} - S_{63} - S_{64}) & \frac{1}{2}(S_{57} + S_{58} - S_{67} - S_{68}) \\ \frac{1}{2}(S_{31} + S_{32} - S_{41} - S_{42}) & \frac{1}{2}(S_{35} + S_{36} - S_{45} - S_{46}) & \frac{1}{2}(S_{33} + S_{34} - S_{43} - S_{44}) & \frac{1}{2}(S_{37} + S_{38} - S_{47} - S_{48}) \\ \frac{1}{2}(S_{71} + S_{72} - S_{81} - S_{82}) & \frac{1}{2}(S_{75} + S_{76} - S_{85} - S_{86}) & \frac{1}{2}(S_{73} + S_{74} - S_{83} - S_{84}) & \frac{1}{2}(S_{77} + S_{78} - S_{87} - S_{88}) \end{pmatrix}$$

$$S_{cd} = \begin{pmatrix} \frac{1}{2}(S_{11}-S_{12}+S_{21}-S_{22}) & \frac{1}{2}(S_{15}-S_{16}+S_{25}-S_{26}) & \frac{1}{2}(S_{13}-S_{14}+S_{23}+S_{24}) & \frac{1}{2}(S_{17}-S_{18}+S_{27}-S_{28}) \\ \frac{1}{2}(S_{51}-S_{52}+S_{61}-S_{62}) & \frac{1}{2}(S_{55}-S_{56}+S_{65}-S_{66}) & \frac{1}{2}(S_{53}-S_{54}+S_{63}-S_{64}) & \frac{1}{2}(S_{57}-S_{58}+S_{67}-S_{68}) \\ \frac{1}{2}(S_{31}-S_{32}+S_{41}-S_{42}) & \frac{1}{2}(S_{35}-S_{36}+S_{45}-S_{46}) & \frac{1}{2}(S_{33}-S_{34}+S_{43}-S_{44}) & \frac{1}{2}(S_{37}-S_{38}+S_{47}-S_{48}) \\ \frac{1}{2}(S_{71}-S_{72}+S_{81}-S_{82}) & \frac{1}{2}(S_{75}-S_{76}+S_{85}-S_{86}) & \frac{1}{2}(S_{73}-S_{74}+S_{83}+S_{84}) & \frac{1}{2}(S_{77}-S_{78}+S_{87}-S_{88}) \end{pmatrix}$$

$$S_{cc} = \begin{pmatrix} \frac{1}{2}(S_{11}+S_{12}+S_{21}+S_{22}) & \frac{1}{2}(S_{15}+S_{16}+S_{25}+S_{26}) & \frac{1}{2}(S_{13}+S_{14}+S_{23}+S_{24}) & \frac{1}{2}(S_{17}+S_{18}+S_{27}+S_{28}) \\ \frac{1}{2}(S_{51}+S_{52}+S_{61}+S_{62}) & \frac{1}{2}(S_{55}+S_{56}+S_{65}+S_{66}) & \frac{1}{2}(S_{53}+S_{54}+S_{63}+S_{64}) & \frac{1}{2}(S_{57}+S_{58}+S_{67}+S_{68}) \\ \frac{1}{2}(S_{31}+S_{32}+S_{41}+S_{42}) & \frac{1}{2}(S_{35}+S_{36}+S_{45}+S_{46}) & \frac{1}{2}(S_{33}+S_{34}+S_{43}+S_{44}) & \frac{1}{2}(S_{37}+S_{38}+S_{47}+S_{48}) \\ \frac{1}{2}(S_{71}+S_{72}+S_{81}+S_{82}) & \frac{1}{2}(S_{75}+S_{76}+S_{85}+S_{86}) & \frac{1}{2}(S_{73}+S_{74}+S_{83}+S_{84}) & \frac{1}{2}(S_{77}+S_{78}+S_{87}+S_{88}) \end{pmatrix}$$

Referring again to FIG. 14, eight single-ended ports of an 8-port MTS can be coupled to the eight terminals of the DUT. The mixed-mode S-parameters for the DUT of FIG. 14 can be defined as balanced ports. For example, Port 1, Port 2, Port 3 and Port 4 are balanced ports. For this mixed mode port configuration of the DUT, the mixed-mode S-parameter matrix of the DUT can be summarized as (30):

$$\begin{bmatrix} S_{dd11} & S_{dd12} & S_{dd13} & S_{dd14} & S_{dc11} & S_{dc12} & S_{dc13} & S_{dc14} \\ S_{dd21} & S_{dd22} & S_{dd23} & S_{dd24} & S_{dc21} & S_{dc22} & S_{dc23} & S_{dc24} \\ S_{dd31} & S_{dd32} & S_{dd33} & S_{dd34} & S_{dc31} & S_{dc32} & S_{dc33} & S_{dc34} \\ S_{dd41} & S_{dd42} & S_{dd43} & S_{dd44} & S_{dc41} & S_{dc42} & S_{dc43} & S_{dc44} \\ S_{cd11} & S_{cd12} & S_{cd13} & S_{cd14} & S_{cc11} & S_{cc12} & S_{cc13} & S_{cc14} \\ S_{cd21} & S_{cd22} & S_{cd23} & S_{cd24} & S_{cc21} & S_{cc22} & S_{cc23} & S_{cc24} \\ S_{cd31} & S_{cd32} & S_{cd33} & S_{cd34} & S_{cc31} & S_{cc32} & S_{cc33} & S_{cc34} \\ S_{cd41} & S_{cd42} & S_{cd43} & S_{cd44} & S_{cc41} & S_{cc42} & S_{cc43} & S_{cc44} \end{bmatrix} \quad (30)$$

Figure 15:
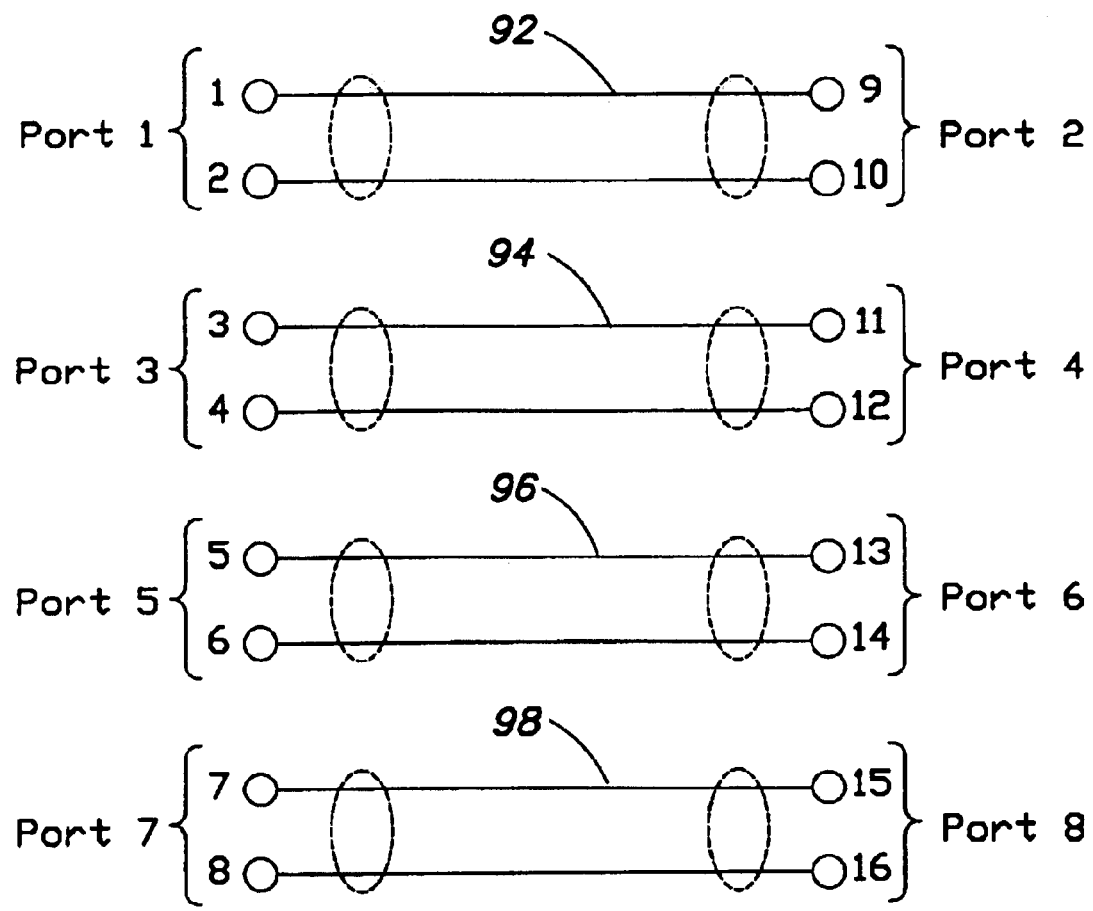
FIG. 15 illustrates an embodiment of a 4-pair differential transmission line DUT and one exemplary port assignment, according to this disclosure.

There will now be described another embodiment of a method of determining the mixed-mode S-parameters $[S_{mm}]$ of a DUT. Referring now to FIG. 15, there is illustrated four pairs of differential transmission lines 92, 94, 96 and 98 which can be used, for example, in a local area network as category 5, category 6 and category type cables. The mixed-mode S-parameters $[S_{mm}]$ of the four pairs of differential transmission lines can be determined according to the above described embodiment. The [S], [M] $[S_{mm}]$ can be given by (31):

$$s = \begin{pmatrix} S_{11} & S_{12} & S_{13} & S_{14} & S_{15} & S_{16} & S_{17} & S_{18} & S_{19} & S_{110} & S_{111} & S_{112} & S_{113} & S_{114} & S_{115} & S_{116} \\ S_{21} & S_{22} & S_{23} & S_{24} & S_{25} & S_{26} & S_{27} & S_{28} & S_{29} & S_{210} & S_{211} & S_{212} & S_{213} & S_{214} & S_{215} & S_{216} \\ S_{31} & S_{32} & S_{33} & S_{34} & S_{35} & S_{36} & S_{37} & S_{38} & S_{39} & S_{310} & S_{311} & S_{312} & S_{313} & S_{314} & S_{315} & S_{316} \\ S_{41} & S_{42} & S_{43} & S_{44} & S_{45} & S_{46} & S_{47} & S_{48} & S_{49} & S_{410} & S_{411} & S_{412} & S_{413} & S_{414} & S_{415} & S_{416} \\ S_{51} & S_{52} & S_{53} & S_{54} & S_{55} & S_{56} & S_{57} & S_{58} & S_{59} & S_{510} & S_{511} & S_{512} & S_{513} & S_{514} & S_{515} & S_{116} \\ S_{61} & S_{62} & S_{63} & S_{64} & S_{65} & S_{66} & S_{67} & S_{68} & S_{69} & S_{610} & S_{611} & S_{612} & S_{613} & S_{614} & S_{615} & S_{616} \\ S_{71} & S_{72} & S_{73} & S_{74} & S_{75} & S_{76} & S_{77} & S_{78} & S_{79} & S_{710} & S_{711} & S_{712} & S_{713} & S_{714} & S_{715} & S_{716} \\ S_{81} & S_{82} & S_{83} & S_{84} & S_{85} & S_{86} & S_{87} & S_{88} & S_{89} & S_{810} & S_{811} & S_{812} & S_{813} & S_{814} & S_{815} & S_{816} \\ S_{91} & S_{92} & S_{93} & S_{94} & S_{95} & S_{96} & S_{97} & S_{98} & S_{99} & S_{910} & S_{911} & S_{912} & S_{913} & S_{914} & S_{915} & S_{916} \\ S_{101} & S_{102} & S_{103} & S_{104} & S_{105} & S_{106} & S_{107} & S_{108} & S_{109} & S_{1010} & S_{1011} & S_{1012} & S_{1013} & S_{1014} & S_{1015} & S_{1016} \\ S_{111} & S_{112} & S_{113} & S_{114} & S_{115} & S_{116} & S_{117} & S_{118} & S_{119} & S_{1110} & S_{1111} & S_{1112} & S_{1113} & S_{1114} & S_{1115} & S_{1116} \\ S_{121} & S_{122} & S_{123} & S_{124} & S_{125} & S_{126} & S_{127} & S_{128} & S_{129} & S_{1210} & S_{1211} & S_{1212} & S_{1213} & S_{1214} & S_{1215} & S_{1216} \\ S_{131} & S_{132} & S_{133} & S_{134} & S_{135} & S_{136} & S_{137} & S_{138} & S_{139} & S_{1310} & S_{1311} & S_{1312} & S_{1313} & S_{1314} & S_{1315} & S_{1316} \\ S_{141} & S_{142} & S_{143} & S_{144} & S_{145} & S_{146} & S_{147} & S_{148} & S_{149} & S_{1410} & S_{1411} & S_{1412} & S_{1413} & S_{1414} & S_{1415} & S_{1416} \\ S_{151} & S_{152} & S_{153} & S_{154} & S_{155} & S_{156} & S_{157} & S_{158} & S_{159} & S_{1510} & S_{1511} & S_{1512} & S_{1513} & S_{1514} & S_{1515} & S_{1516} \\ S_{161} & S_{162} & S_{163} & S_{164} & S_{165} & S_{166} & S_{167} & S_{168} & S_{169} & S_{1610} & S_{1611} & S_{1612} & S_{1613} & S_{1614} & S_{1615} & S_{1616} \end{pmatrix} \quad (31)$$

$$M = \begin{pmatrix}
\frac{1}{\sqrt{2}} & -\frac{1}{\sqrt{2}} & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & \frac{1}{\sqrt{2}} & -\frac{1}{\sqrt{2}} & 0 & 0 & 0 & 0 & 0 & 0 \\
0 & 0 & \frac{1}{\sqrt{2}} & \frac{1}{\sqrt{2}} & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & \frac{1}{\sqrt{2}} & -\frac{1}{\sqrt{2}} & 0 & 0 & 0 & 0 \\
0 & 0 & 0 & 0 & \frac{1}{\sqrt{2}} & -\frac{1}{\sqrt{2}} & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & \frac{1}{\sqrt{2}} & -\frac{1}{\sqrt{2}} & 0 & 0 \\
0 & 0 & 0 & 0 & 0 & 0 & \frac{1}{\sqrt{2}} & -\frac{1}{\sqrt{2}} & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & \frac{1}{\sqrt{2}} & -\frac{1}{\sqrt{2}} \\
\frac{1}{\sqrt{2}} & \frac{1}{\sqrt{2}} & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & \frac{1}{\sqrt{2}} & \frac{1}{\sqrt{2}} & 0 & 0 & 0 & 0 & 0 & 0 \\
0 & 0 & \frac{1}{\sqrt{2}} & \frac{1}{\sqrt{2}} & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & \frac{1}{\sqrt{2}} & \frac{1}{\sqrt{2}} & 0 & 0 & 0 & 0 \\
0 & 0 & 0 & 0 & \frac{1}{\sqrt{2}} & \frac{1}{\sqrt{2}} & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & \frac{1}{\sqrt{2}} & \frac{1}{\sqrt{2}} & 0 & 0 \\
0 & 0 & 0 & 0 & 0 & 0 & \frac{1}{\sqrt{2}} & \frac{1}{\sqrt{2}} & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & \frac{1}{\sqrt{2}} & \frac{1}{\sqrt{2}}
\end{pmatrix}$$

It is to be appreciated that in order to be able to illustrate the mixed-mode S-parameter matrix $[S_{mm}]$, the matrix is herein split up. A first portion of the matrix corresponds to a pure differential mode of the LAN of FIG. 15. This portion of the matrix can be split in half, where elements $S_{dd}$ [1:8,1:4] can be given by (32):

$$\begin{pmatrix}
\frac{1}{2}(S_{11}-S_{12}-S_{21}+S_{22}) & \frac{1}{2}(S_{19}-S_{29}-S_{110}+S_{210}) & \frac{1}{2}(S_{13}-S_{14}-S_{23}+S_{24}) & \frac{1}{2}(S_{111}-S_{112}-S_{211}+S_{212}) \\
\frac{1}{2}(S_{91}-S_{92}-S_{101}+S_{102}) & \frac{1}{2}(S_{99}-S_{109}-S_{910}+S_{1010}) & \frac{1}{2}(S_{93}-S_{94}-S_{103}+S_{104}) & \frac{1}{2}(S_{911}-S_{912}-S_{1011}+S_{1012}) \\
\frac{1}{2}(S_{31}-S_{32}-S_{41}+S_{42}) & \frac{1}{2}(S_{39}-S_{49}-S_{310}+S_{410}) & \frac{1}{2}(S_{33}-S_{34}-S_{43}+S_{44}) & \frac{1}{2}(S_{311}-S_{312}-S_{411}+S_{412}) \\
\frac{1}{2}(S_{111}-S_{112}-S_{121}+S_{122}) & \frac{1}{2}(S_{119}-S_{129}-S_{1110}+S_{1210}) & \frac{1}{2}(S_{113}-S_{114}-S_{123}+S_{124}) & \frac{1}{2}(S_{1111}-S_{1112}-S_{1211}+S_{1212}) \\
\frac{1}{2}(S_{51}-S_{52}-S_{61}+S_{62}) & \frac{1}{2}(S_{59}-S_{69}-S_{510}+S_{610}) & \frac{1}{2}(S_{53}-S_{54}-S_{63}+S_{64}) & \frac{1}{2}(S_{511}-S_{512}-S_{611}+S_{612}) \\
\frac{1}{2}(S_{131}-S_{132}-S_{141}+S_{142}) & \frac{1}{2}(S_{139}-S_{149}-S_{1310}+S_{1410}) & \frac{1}{2}(S_{133}-S_{134}-S_{143}+S_{144}) & \frac{1}{2}(S_{1311}-S_{1312}-S_{1411}+S_{1412}) \\
\frac{1}{2}(S_{71}-S_{72}-S_{81}+S_{82}) & \frac{1}{2}(S_{79}-S_{89}-S_{710}+S_{810}) & \frac{1}{2}(S_{73}-S_{74}-S_{83}+S_{84}) & \frac{1}{2}(S_{711}-S_{712}-S_{811}+S_{812}) \\
\frac{1}{2}(S_{151}-S_{152}-S_{161}+S_{162}) & \frac{1}{2}(S_{159}-S_{169}-S_{1510}+S_{1610}) & \frac{1}{2}(S_{153}-S_{154}-S_{163}+S_{164}) & \frac{1}{2}(S_{1511}-S_{1512}-S_{1611}+S_{1612})
\end{pmatrix} \quad (32)$$

A second part of the matrix $S_{dd}[1:8,5:8]$ can be given by:

$$\begin{pmatrix} \frac{1}{2}(S_{15}-S_{16}-S_{25}+S_{26}) & \frac{1}{2}(S_{113}-S_{114}-S_{213}+S_{214}) & \frac{1}{2}(S_{17}-S_{18}-S_{27}+S_{28}) & \frac{1}{2}(S_{115}-S_{116}-S_{215}+S_{216}) \\ \frac{1}{2}(S_{95}-S_{96}-S_{105}+S_{106}) & \frac{1}{2}(S_{913}-S_{914}-S_{1013}+S_{1014}) & \frac{1}{2}(S_{97}-S_{98}-S_{107}+S_{108}) & \frac{1}{2}(S_{915}-S_{916}-S_{1015}+S_{1016}) \\ \frac{1}{2}(S_{35}-S_{36}-S_{45}+S_{46}) & \frac{1}{2}(S_{313}-S_{314}-S_{413}+S_{414}) & \frac{1}{2}(S_{37}-S_{38}-S_{47}+S_{48}) & \frac{1}{2}(S_{315}-S_{316}-S_{415}+S_{416}) \\ \frac{1}{2}(S_{115}-S_{116}-S_{125}+S_{126}) & \frac{1}{2}(S_{1113}-S_{1114}-S_{1213}+S_{1214}) & \frac{1}{2}(S_{117}-S_{118}-S_{127}+S_{128}) & \frac{1}{2}(S_{1115}-S_{1116}-S_{1215}+S_{1216}) \\ \frac{1}{2}(S_{55}-S_{56}-S_{65}+S_{66}) & \frac{1}{2}(S_{513}-S_{514}-S_{613}+S_{614}) & \frac{1}{2}(S_{57}-S_{58}-S_{67}+S_{68}) & \frac{1}{2}(S_{515}-S_{516}-S_{615}+S_{616}) \\ \frac{1}{2}(S_{135}-S_{136}-S_{146}+S_{146}) & \frac{1}{2}(S_{1313}-S_{1314}-S_{1413}+S_{1414}) & \frac{1}{2}(S_{137}-S_{138}-S_{147}+S_{148}) & \frac{1}{2}(S_{1315}-S_{1316}-S_{1415}+S_{1416}) \\ \frac{1}{2}(S_{75}-S_{76}-S_{85}+S_{86}) & \frac{1}{2}(S_{713}-S_{714}-S_{813}+S_{814}) & \frac{1}{2}(S_{77}-S_{78}-S_{87}+S_{88}) & \frac{1}{2}(S_{715}-S_{716}-S_{815}+S_{816}) \\ \frac{1}{2}(S_{155}-S_{156}-S_{165}+S_{166}) & \frac{1}{2}(S_{1513}-S_{1514}-S_{1613}+S_{1614}) & \frac{1}{2}(S_{157}-S_{158}-S_{167}+S_{168}) & \frac{1}{2}(S_{1515}-S_{1516}-S_{1615}+S_{1616}) \end{pmatrix} \quad (32)$$

Referring to FIG. 15, sixteen single-ended ports of a 16-port MTS can be coupled to the sixteen terminals of the DUT. The mixed-mode S-parameters for the DUT of FIG. 15 can be defined as balanced ports. For example, Port 1, Port 2, Port 3, Port 4, Port 5, Port 6, Port 7 and port 8 are balanced ports. For this mixed mode port configuration of the DUT, the mixed-mode S-parameter matrix of the DUT operating in the pure differential mode can be summarized as (33):

$$\begin{bmatrix} S_{dd11} & S_{dd12} & S_{dd13} & S_{dd14} & S_{dd15} & S_{dd16} & S_{dd17} & S_{dd18} \\ S_{dd21} & S_{dd22} & S_{dd23} & S_{dd24} & S_{dd25} & S_{dd26} & S_{dd27} & S_{dd28} \\ S_{dd31} & S_{dd32} & S_{dd33} & S_{dd34} & S_{dd35} & S_{dd36} & S_{dd37} & S_{dd38} \\ S_{dd41} & S_{dd42} & S_{dd43} & S_{dd44} & S_{dd45} & S_{dd46} & S_{dd47} & S_{dd48} \\ S_{dd51} & S_{dd52} & S_{dd53} & S_{dd54} & S_{dd55} & S_{dd56} & S_{dd57} & S_{dd58} \\ S_{dd61} & S_{dd62} & S_{dd63} & S_{dd64} & S_{dd65} & S_{dd66} & S_{dd67} & S_{dd68} \\ S_{dd71} & S_{dd72} & S_{dd73} & S_{dd74} & S_{dd75} & S_{dd76} & S_{dd77} & S_{dd78} \\ S_{dd81} & S_{dd82} & S_{dd83} & S_{dd84} & S_{dd85} & S_{dd86} & S_{dd87} & S_{dd88} \end{bmatrix} \quad (33)$$

Another portion of the mixed-mode S-parameter matrix $[S_{mm}]$ of the DUT of FIG. 15, that corresponds to the common mode to differential mode conversion $[S_{dc}]$, is herein split in half in order to be able to provide all of the matrix elements within this disclosure. The $S_{dc}[1:8,1:4]$ can be given by (34):

$$\begin{pmatrix} \frac{1}{2}(S_{11}+S_{12}-S_{21}-S_{22}) & \frac{1}{2}(S_{19}-S_{29}+S_{110}-S_{210}) & \frac{1}{2}(S_{13}+S_{14}-S_{23}-S_{24}) & \frac{1}{2}(S_{111}+S_{112}-S_{211}-S_{212}) \\ \frac{1}{2}(S_{91}+S_{92}-S_{101}-S_{102}) & \frac{1}{2}(S_{99}-S_{109}+S_{910}-S_{1010}) & \frac{1}{2}(S_{93}+S_{94}-S_{103}-S_{104}) & \frac{1}{2}(S_{911}+S_{912}-S_{1011}-S_{1012}) \\ \frac{1}{2}(S_{31}+S_{32}-S_{41}-S_{42}) & \frac{1}{2}(S_{39}-S_{49}+S_{310}-S_{410}) & \frac{1}{2}(S_{33}+S_{34}-S_{43}-S_{44}) & \frac{1}{2}(S_{311}+S_{312}-S_{411}-S_{412}) \\ \frac{1}{2}(S_{111}+S_{112}-S_{121}-S_{122}) & \frac{1}{2}(S_{119}-S_{129}+S_{1110}-S_{1210}) & \frac{1}{2}(S_{113}+S_{114}-S_{123}-S_{124}) & \frac{1}{2}(S_{1111}+S_{1112}-S_{1211}-S_{1212}) \\ \frac{1}{2}(S_{51}+S_{52}-S_{61}-S_{62}) & \frac{1}{2}(S_{59}-S_{69}+S_{510}-S_{610}) & \frac{1}{2}(S_{53}+S_{54}-S_{63}-S_{64}) & \frac{1}{2}(S_{511}+S_{512}-S_{611}-S_{612}) \\ \frac{1}{2}(S_{131}+S_{132}-S_{141}-S_{142}) & \frac{1}{2}(S_{139}-S_{419}+S_{1310}-S_{1410}) & \frac{1}{2}(S_{133}+S_{134}-S_{143}-S_{144}) & \frac{1}{2}(S_{1311}+S_{1312}-S_{1411}-S_{1412}) \\ \frac{1}{2}(S_{71}+S_{72}-S_{81}-S_{82}) & \frac{1}{2}(S_{79}-S_{89}+S_{710}-S_{810}) & \frac{1}{2}(S_{73}+S_{74}-S_{83}-S_{84}) & \frac{1}{2}(S_{711}+S_{712}-S_{811}-S_{812}) \\ \frac{1}{2}(S_{151}+S_{152}-S_{161}-S_{162}) & \frac{1}{2}(S_{159}-S_{169}+S_{1510}-S_{1610}) & \frac{1}{2}(S_{153}+S_{154}-S_{163}-S_{164}) & \frac{1}{2}(S_{1511}+S_{1512}-S_{1611}-S_{1612}) \end{pmatrix} \quad (34)$$

In addition, the $S_{dc}[1:8,5:8]$ can be given by:

$$\begin{pmatrix} \frac{1}{2}(S_{15}+S_{16}-S_{25}-S_{26}) & \frac{1}{2}(S_{113}+S_{114}-S_{213}-S_{214}) & \frac{1}{2}(S_{17}+S_{18}-S_{27}-S_{28}) & \frac{1}{2}(S_{115}+S_{116}-S_{215}-S_{216}) \\ \frac{1}{2}(S_{95}+S_{96}-S_{105}-S_{106}) & \frac{1}{2}(S_{913}+S_{914}-S_{1013}-S_{1014}) & \frac{1}{2}(S_{97}+S_{98}-S_{107}-S_{108}) & \frac{1}{2}(S_{915}+S_{916}-S_{1015}-S_{1016}) \\ \frac{1}{2}(S_{35}+S_{36}-S_{45}-S_{46}) & \frac{1}{2}(S_{313}+S_{314}-S_{413}-S_{414}) & \frac{1}{2}(S_{37}+S_{38}-S_{47}-S_{48}) & \frac{1}{2}(S_{315}+S_{316}-S_{415}-S_{416}) \\ \frac{1}{2}(S_{115}+S_{116}-S_{125}-S_{126}) & \frac{1}{2}(S_{1113}+S_{1114}-S_{1213}-S_{1214}) & \frac{1}{2}(S_{117}+S_{118}-S_{127}-S_{128}) & \frac{1}{2}(S_{1115}+S_{1116}-S_{1215}-S_{1216}) \\ \frac{1}{2}(S_{55}+S_{56}-S_{65}-S_{66}) & \frac{1}{2}(S_{513}+S_{514}-S_{613}-S_{614}) & \frac{1}{2}(S_{57}+S_{58}-S_{67}-S_{68}) & \frac{1}{2}(S_{515}+S_{516}-S_{615}-S_{616}) \\ \frac{1}{2}(S_{135}+S_{136}-S_{146}-S_{147}) & \frac{1}{2}(S_{1313}+S_{1314}-S_{1413}-S_{1414}) & \frac{1}{2}(S_{137}+S_{138}-S_{147}-S_{148}) & \frac{1}{2}(S_{1315}+S_{1316}-S_{1415}-S_{1416}) \\ \frac{1}{2}(S_{75}+S_{76}-S_{85}-S_{86}) & \frac{1}{2}(S_{713}+S_{714}-S_{813}-S_{814}) & \frac{1}{2}(S_{77}+S_{78}-S_{87}-S_{88}) & \frac{1}{2}(S_{715}+S_{716}-S_{815}-S_{816}) \\ \frac{1}{2}(S_{155}+S_{156}-S_{165}-S_{166}) & \frac{1}{2}(S_{1513}+S_{1514}-S_{1613}-S_{1614}) & \frac{1}{2}(S_{157}+S_{158}-S_{167}-S_{168}) & \frac{1}{2}(S_{1515}+S_{1516}-S_{1615}-S_{1616}) \end{pmatrix} \quad (34)$$

Similarly, a portion of the mixed-mode S-parameter matrix $[S_{mm}]$ of the DUT of FIG. 15, that describes the differential to common mode conversion is herein split in half in order to display all the elements of this portion of the $[S_{mm}]$ matrix. The $S_{cd}[1:8,1:4]$ can be given by (35):

$$\begin{pmatrix} \frac{1}{2}(S_{11}+S_{12}+S_{21}+S_{22}) & \frac{1}{2}(S_{19}+S_{29}+S_{110}+S_{210}) & \frac{1}{2}(S_{13}+S_{14}+S_{23}+S_{24}) & \frac{1}{2}(S_{111}+S_{112}+S_{211}+S_{212}) \\ \frac{1}{2}(S_{91}+S_{92}+S_{101}+S_{102}) & \frac{1}{2}(S_{99}+S_{109}+S_{910}+S_{1010}) & \frac{1}{2}(S_{93}+S_{94}+S_{103}+S_{104}) & \frac{1}{2}(S_{911}+S_{912}+S_{1011}+S_{1012}) \\ \frac{1}{2}(S_{31}+S_{32}+S_{41}+S_{42}) & \frac{1}{2}(S_{39}+S_{49}+S_{310}+S_{410}) & \frac{1}{2}(S_{33}+S_{34}+S_{43}+S_{44}) & \frac{1}{2}(S_{311}+S_{312}+S_{411}+S_{412}) \\ \frac{1}{2}(S_{111}+S_{112}+S_{121}+S_{122}) & \frac{1}{2}(S_{119}+S_{129}+S_{1110}+S_{1210}) & \frac{1}{2}(S_{113}+S_{114}+S_{123}+S_{124}) & \frac{1}{2}(S_{1111}+S_{1112}+S_{1211}+S_{1212}) \\ \frac{1}{2}(S_{51}+S_{52}+S_{61}+S_{62}) & \frac{1}{2}(S_{59}+S_{69}+S_{510}+S_{610}) & \frac{1}{2}(S_{53}+S_{54}+S_{63}+S_{64}) & \frac{1}{2}(S_{511}+S_{512}+S_{611}+S_{612}) \\ \frac{1}{2}(S_{131}+S_{132}+S_{141}+S_{142}) & \frac{1}{2}(S_{139}+S_{149}+S_{1310}+S_{1410}) & \frac{1}{2}(S_{133}+S_{134}+S_{143}+S_{144}) & \frac{1}{2}(S_{1311}+S_{1312}+S_{1411}+S_{1412}) \\ \frac{1}{2}(S_{71}+S_{72}+S_{81}+S_{82}) & \frac{1}{2}(S_{79}+S_{89}+S_{710}+S_{810}) & \frac{1}{2}(S_{73}+S_{74}+S_{83}+S_{84}) & \frac{1}{2}(S_{711}+S_{712}+S_{811}+S_{812}) \\ \frac{1}{2}(S_{151}+S_{152}+S_{161}+S_{162}) & \frac{1}{2}(S_{159}+S_{169}+S_{1510}+S_{1610}) & \frac{1}{2}(S_{153}+S_{154}+S_{163}+S_{164}) & \frac{1}{2}(S_{1511}+S_{1512}+S_{1611}+S_{1612}) \end{pmatrix} \quad (35)$$

In addition, the $S_{cd}[1:8,5:8]$ can be given by:

$$\begin{pmatrix} \frac{1}{2}(S_{15}+S_{16}+S_{25}+S_{26}) & \frac{1}{2}(S_{113}+S_{114}+S_{213}+S_{214}) & \frac{1}{2}(S_{17}+S_{18}+S_{27}+S_{28}) & \frac{1}{2}(S_{115}+S_{116}+S_{215}+S_{216}) \\ \frac{1}{2}(S_{95}+S_{96}+S_{105}+S_{106}) & \frac{1}{2}(S_{913}+S_{914}+S_{1013}+S_{1014}) & \frac{1}{2}(S_{97}+S_{98}+S_{107}+S_{108}) & \frac{1}{2}(S_{915}+S_{916}+S_{1015}+S_{1016}) \\ \frac{1}{2}(S_{35}+S_{36}+S_{45}+S_{46}) & \frac{1}{2}(S_{313}+S_{314}+S_{413}+S_{414}) & \frac{1}{2}(S_{37}+S_{38}+S_{47}+S_{48}) & \frac{1}{2}(S_{315}+S_{316}+S_{415}+S_{416}) \\ \frac{1}{2}(S_{115}+S_{116}+S_{125}+S_{126}) & \frac{1}{2}(S_{1113}+S_{1114}+S_{1213}+S_{1214}) & \frac{1}{2}(S_{117}+S_{118}+S_{127}+S_{128}) & \frac{1}{2}(S_{1115}+S_{1116}+S_{1215}+S_{1216}) \\ \frac{1}{2}(S_{55}+S_{56}+S_{65}+S_{66}) & \frac{1}{2}(S_{513}+S_{514}+S_{613}+S_{614}) & \frac{1}{2}(S_{57}+S_{58}+S_{67}+S_{68}) & \frac{1}{2}(S_{515}+S_{516}+S_{615}+S_{616}) \\ \frac{1}{2}(S_{135}+S_{136}+S_{145}+S_{146}) & \frac{1}{2}(S_{1313}+S_{1314}+S_{1413}+S_{1414}) & \frac{1}{2}(S_{137}+S_{138}+S_{147}+S_{148}) & \frac{1}{2}(S_{1315}+S_{1316}+S_{1415}+S_{1416}) \\ \frac{1}{2}(S_{75}+S_{76}+S_{85}+S_{86}) & \frac{1}{2}(S_{713}+S_{714}+S_{813}+S_{814}) & \frac{1}{2}(S_{77}+S_{78}+S_{87}+S_{88}) & \frac{1}{2}(S_{715}+S_{716}+S_{815}+S_{816}) \\ \frac{1}{2}(S_{155}+S_{156}+S_{165}+S_{166}) & \frac{1}{2}(S_{1513}+S_{1514}+S_{1613}+S_{1614}) & \frac{1}{2}(S_{157}+S_{158}+S_{167}+S_{168}) & \frac{1}{2}(S_{1515}+S_{1516}+S_{1615}+S_{1616}) \end{pmatrix} \quad (35)$$

Similarly, a portion of the mixed mode S-parameter matrix for the DUT of FIG. 15, for describing the pure common mode operation is herein split in half in order to illustrate all the elements of this portion of the [$S_{mm}$]. The $S_{cc}$[1:8,1:4] can be given by (36):

each of the [$S_{dc}$], the [$S_{cd}$] and the [$S_{cc}$] portions of the mixed-mode S-parameter matrix described above.

It is to be appreciated that one aspect of some embodiments of the above described method and apparatus of this disclosure, is that a user can arbitrarily define the terminal $$\begin{pmatrix} \frac{1}{2}(S_{11}+S_{12}+S_{21}+S_{22}) & \frac{1}{2}(S_{19}+S_{29}+S_{110}+S_{210}) & \frac{1}{2}(S_{13}+S_{14}+S_{23}+S_{24}) & \frac{1}{2}(S_{111}+S_{112}+S_{211}+S_{212}) \\ \frac{1}{2}(S_{91}+S_{92}+S_{101}+S_{102}) & \frac{1}{2}(S_{99}+S_{109}+S_{910}+S_{1010}) & \frac{1}{2}(S_{93}+S_{94}+S_{103}+S_{104}) & \frac{1}{2}(S_{911}+S_{912}+S_{1011}+S_{1012}) \\ \frac{1}{2}(S_{31}+S_{32}+S_{41}+S_{42}) & \frac{1}{2}(S_{39}+S_{49}+S_{310}+S_{410}) & \frac{1}{2}(S_{33}+S_{34}+S_{43}+S_{44}) & \frac{1}{2}(S_{311}+S_{312}+S_{411}+S_{412}) \\ \frac{1}{2}(S_{111}+S_{112}+S_{121}+S_{122}) & \frac{1}{2}(S_{119}+S_{129}+S_{1110}+S_{1210}) & \frac{1}{2}(S_{113}+S_{114}+S_{123}+S_{124}) & \frac{1}{2}(S_{1111}+S_{1112}+S_{1211}+S_{1212}) \\ \frac{1}{2}(S_{51}+S_{52}+S_{61}+S_{62}) & \frac{1}{2}(S_{59}+S_{69}+S_{510}+S_{610}) & \frac{1}{2}(S_{53}+S_{54}+S_{63}+S_{64}) & \frac{1}{2}(S_{511}+S_{512}+S_{611}+S_{612}) \\ \frac{1}{2}(S_{131}+S_{132}+S_{141}+S_{142}) & \frac{1}{2}(S_{139}+S_{149}+S_{1310}+S_{1410}) & \frac{1}{2}(S_{133}+S_{134}+S_{143}+S_{144}) & \frac{1}{2}(S_{1311}+S_{1312}+S_{1411}+S_{1412}) \\ \frac{1}{2}(S_{71}+S_{72}+S_{81}+S_{82}) & \frac{1}{2}(S_{79}+S_{89}+S_{710}+S_{810}) & \frac{1}{2}(S_{73}+S_{74}+S_{83}+S_{84}) & \frac{1}{2}(S_{711}+S_{712}+S_{811}+S_{812}) \\ \frac{1}{2}(S_{151}+S_{152}+S_{161}+S_{162}) & \frac{1}{2}(S_{159}+S_{169}+S_{1510}+S_{1610}) & \frac{1}{2}(S_{153}+S_{154}+S_{163}+S_{164}) & \frac{1}{2}(S_{1511}+S_{1512}+S_{1611}+S_{1612}) \end{pmatrix} \quad (36)$$

In addition, the $S_{cc}$[1:8,5:8] can be given by:

$$\begin{pmatrix} \frac{1}{2}(S_{15}+S_{16}+S_{25}+S_{26}) & \frac{1}{2}(S_{113}+S_{114}+S_{213}+S_{214}) & \frac{1}{2}(S_{17}+S_{18}+S_{27}+S_{28}) & \frac{1}{2}(S_{115}+S_{116}+S_{215}+S_{216}) \\ \frac{1}{2}(S_{95}+S_{96}+S_{105}+S_{106}) & \frac{1}{2}(S_{913}+S_{914}+S_{1013}+S_{1014}) & \frac{1}{2}(S_{97}+S_{98}+S_{107}+S_{108}) & \frac{1}{2}(S_{915}+S_{916}+S_{1015}+S_{1016}) \\ \frac{1}{2}(S_{35}+S_{36}+S_{45}+S_{46}) & \frac{1}{2}(S_{313}+S_{314}+S_{413}+S_{414}) & \frac{1}{2}(S_{37}+S_{38}+S_{47}+S_{48}) & \frac{1}{2}(S_{315}+S_{316}+S_{415}+S_{416}) \\ \frac{1}{2}(S_{115}+S_{116}+S_{125}+S_{126}) & \frac{1}{2}(S_{1113}+S_{1114}+S_{1213}+S_{1214}) & \frac{1}{2}(S_{117}+S_{118}+S_{127}+S_{128}) & \frac{1}{2}(S_{1115}+S_{1116}+S_{1215}+S_{1216}) \\ \frac{1}{2}(S_{55}+S_{56}+S_{65}+S_{66}) & \frac{1}{2}(S_{513}+S_{514}+S_{613}+S_{614}) & \frac{1}{2}(S_{57}+S_{58}+S_{67}+S_{68}) & \frac{1}{2}(S_{515}+S_{516}+S_{615}+S_{616}) \\ \frac{1}{2}(S_{135}+S_{136}+S_{145}+S_{146}) & \frac{1}{2}(S_{1313}+S_{1314}+S_{1413}+S_{1414}) & \frac{1}{2}(S_{137}+S_{138}+S_{147}+S_{148}) & \frac{1}{2}(S_{1315}+S_{1316}+S_{1415}+S_{1416}) \\ \frac{1}{2}(S_{75}+S_{76}+S_{85}+S_{86}) & \frac{1}{2}(S_{713}+S_{714}+S_{813}+S_{814}) & \frac{1}{2}(S_{77}+S_{78}+S_{87}+S_{88}) & \frac{1}{2}(S_{715}+S_{716}+S_{815}+S_{816}) \\ \frac{1}{2}(S_{155}+S_{156}+S_{165}+S_{166}) & \frac{1}{2}(S_{1513}+S_{1514}+S_{1613}+S_{1614}) & \frac{1}{2}(S_{157}+S_{158}+S_{167}+S_{168}) & \frac{1}{2}(S_{1515}+S_{1516}+S_{1615}+S_{1616}) \end{pmatrix} \quad (36)$$

Figure 16:
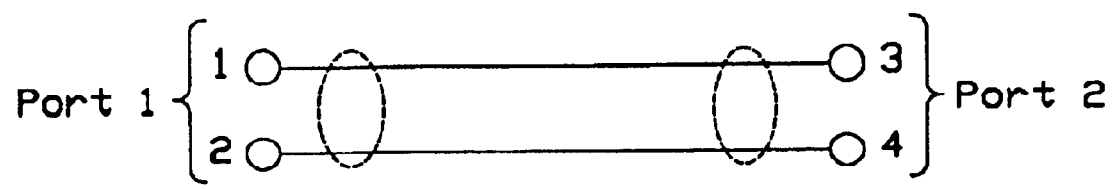
FIG. 16 illustrates one example of assigning terminal numbers for input and output ports of a differential pair of transmission lines, according to this disclosure.
Figure 17:
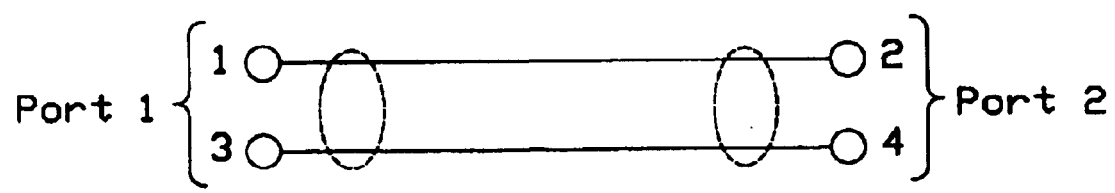
FIG. 17 illustrates one example of assigning terminal numbers for input and output ports of a differential pair of transmission lines, according to this disclosure.

It is to be appreciated that the mixed-mode S-parameter matrix for the LAN of FIG. 15 for the port assignments of an embodiment of a MTS of this disclosure as illustrated in FIG. 15, have not been provided for the modes of operation other than the differential mode described above by (33). However, one of skill in the art according to some embodiments of the method and apparatus of this disclosure can determine the mixed-mode S-parameter matrix for these port assignments using the above described methodology for numbers of a DUT while testing the DUT. In other words, according to some embodiments of the method and apparatus of this disclosure, the user can assign numbers to any terminals of the DUT, and the terminal numbers need not be rigidly assigned. For example, FIGS. 16 and 17 illustrate two different terminal numberings for input and output ports of a differential pair of transmission lines, that can be assigned according to some of the embodiments of the method and apparatus of this disclosure. For the differential pair of FIG. 16, terminals 1–2 can be assigned to the mixed-mode port 1 of the balanced input, terminals 3–4 canbe assigned to the mixed-mode port 2 of the balanced output, and the scalar orthogonal matrix [M] and the mixed-mode S-parameter matrix [$S_{mm}$] can be given by (37):

$$M = \begin{pmatrix} \frac{1}{\sqrt{2}} & -\frac{1}{\sqrt{2}} & 0 & 0 \\ 0 & 0 & \frac{1}{\sqrt{2}} & -\frac{1}{\sqrt{2}} \\ \frac{1}{\sqrt{2}} & \frac{1}{\sqrt{2}} & 0 & 0 \\ 0 & 0 & \frac{1}{\sqrt{2}} & \frac{1}{\sqrt{2}} \end{pmatrix} \tag{37}$$

$$S_{mm} = \begin{pmatrix} \frac{1}{2}(S_{11}-S_{12}-S_{21}+S_{22}) & \frac{1}{2}(S_{31}-S_{14}-S_{23}+S_{24}) & \frac{1}{2}(S_{11}+S_{12}-S_{21}-S_{22}) & \frac{1}{2}(S_{13}+S_{14}-S_{23}-S_{24}) \\ \frac{1}{2}(S_{31}-S_{32}-S_{41}+S_{42}) & \frac{1}{2}(S_{31}-S_{34}-S_{43}+S_{44}) & \frac{1}{2}(S_{31}+S_{32}-S_{41}-S_{42}) & \frac{1}{2}(S_{33}+S_{34}-S_{43}-S_{44}) \\ \frac{1}{2}(S_{11}-S_{12}+S_{21}-S_{22}) & \frac{1}{2}(S_{31}-S_{14}+S_{23}-S_{24}) & \frac{1}{2}(S_{11}+S_{12}+S_{21}+S_{22}) & \frac{1}{2}(S_{13}+S_{14}+S_{23}+S_{24}) \\ \frac{1}{2}(S_{11}-S_{32}+S_{41}-S_{42}) & \frac{1}{2}(S_{33}-S_{34}+S_{43}-S_{44}) & \frac{1}{2}(S_{31}+S_{32}+S_{41}+S_{42}) & \frac{1}{2}(S_{33}+S_{34}+S_{43}+S_{44}) \end{pmatrix}$$

In a similar manner, for the differential pair of transmission lines of FIG. 17, terminals 1–3 can be assigned to the mixed-mode port 1 of the balanced input, terminals 2–4 can be assigned to the mixed-mode of the port 2 balanced output, and the [M] and the [$S_{mm}$] of the differential pair of cables can be given by (38):

$$M = \begin{pmatrix} \frac{1}{\sqrt{2}} & 0 & -\frac{1}{\sqrt{2}} & 0 \\ 0 & \frac{1}{\sqrt{2}} & 0 & -\frac{1}{\sqrt{2}} \\ \frac{1}{\sqrt{2}} & 0 & \frac{1}{\sqrt{2}} & 0 \\ 0 & \frac{1}{\sqrt{2}} & 0 & \frac{1}{\sqrt{2}} \end{pmatrix} \tag{38}$$

$$S_{mm} = \begin{pmatrix} \frac{1}{2}(S_{11}-S_{13}-S_{31}+S_{33}) & \frac{1}{2}(S_{12}-S_{14}-S_{32}+S_{34}) & \frac{1}{2}(S_{11}+S_{13}-S_{31}-S_{33}) & \frac{1}{2}(S_{12}+S_{14}-S_{32}-S_{34}) \\ \frac{1}{2}(S_{21}-S_{23}-S_{41}+S_{43}) & \frac{1}{2}(S_{22}-S_{24}-S_{42}+S_{44}) & \frac{1}{2}(S_{21}+S_{23}-S_{41}-S_{43}) & \frac{1}{2}(S_{22}+S_{24}-S_{42}-S_{44}) \\ \frac{1}{2}(S_{11}-S_{13}+S_{31}-S_{33}) & \frac{1}{2}(S_{12}-S_{14}+S_{32}-S_{34}) & \frac{1}{2}(S_{11}+S_{13}+S_{31}+S_{33}) & \frac{1}{2}(S_{12}+S_{14}+S_{32}+S_{34}) \\ \frac{1}{2}(S_{21}-S_{23}+S_{41}-S_{43}) & \frac{1}{2}(S_{22}-S_{24}+S_{42}-S_{44}) & \frac{1}{2}(S_{21}+S_{23}+S_{41}+S_{43}) & \frac{1}{2}(S_{22}+S_{24}+S_{42}+S_{44}) \end{pmatrix}$$

One of skill in the art can appreciate that frequency domain measurements with an embodiment of an MTS of this disclosure can address some of the shortcomings of the TDR systems discussed above, and can provide some additional advantages. For example, some embodiments of an MTS of this disclosure do not provide a large signal voltage to the DUT, do not require the DUT to have a DC return path, and can provide forward and reverse transmission data and reflection data without changing the measurement setup.

It is also to be appreciated that according to some embodiments of the method and apparatus of this disclosure, a MTS system can be provided with an embodiment of the herein described methodology for characterizing both single-ended and balanced topology DUTs, and therefore provides a powerful method and apparatus to characterize mixed mode and balanced mode DUTs.

Some additional advantages of some embodiments of the method and MTS apparatus of this disclosure comprises high accuracy; a large dynamic range; and high-speed which can be achieved, in part, from the VNA-based architecture. Some additional advantages of some of the embodiments of the method and apparatus of this disclosure, comprise the smallest resolution in a time domain which can be a function of last harmonic frequencies of the MTS and a sufficient time span which can be a function of the first harmonic frequency of the MTS. For example, a return loss of over 100 dB in the time-domain can be determined by some embodiments of the MTS, based on a small time domain resolution. In contrast, an 100 dB return loss is far beyond instrumentation dynamic range for a traditional TDR system. In addition, some embodiments of the MTS system of this disclosure do not apply a high power signal to the DUT, thus minimizing the possibility of saturation of the DUT. In contrast, the traditional TDR system provides a step function input signal to an input of the DUT and typically, for an excessive input drive signal, uses an attenuation pad to reduce an output power from a source of the TDR system to the input of the DUT. With the traditional TDR system, the dynamic range of measurement of the DUT and the characteristics of the input signal pulse of the TDR system can be compromised. Further, some embodiments of the MTS system of this disclosure can determine all of the parameters to be measured for the DUT with a one time connection of the DUT to the multiport MTS. In contrast, the traditional TDR system change connections between reflection and transmission measurements of the DUT.

It is also to be appreciated that according to some of the embodiments of the method and MTS apparatus of this disclosure, the MTS can measure both balanced and unbalanced devices. In addition, according to some embodiment of the method and MTS apparatus of this disclosure, the MTS system can provide the results of these measurements in the time domain. In contrast, a traditional VNA measures unbalanced devices and employs S-parameters which are frequency domain measurements.

Figure 18A:
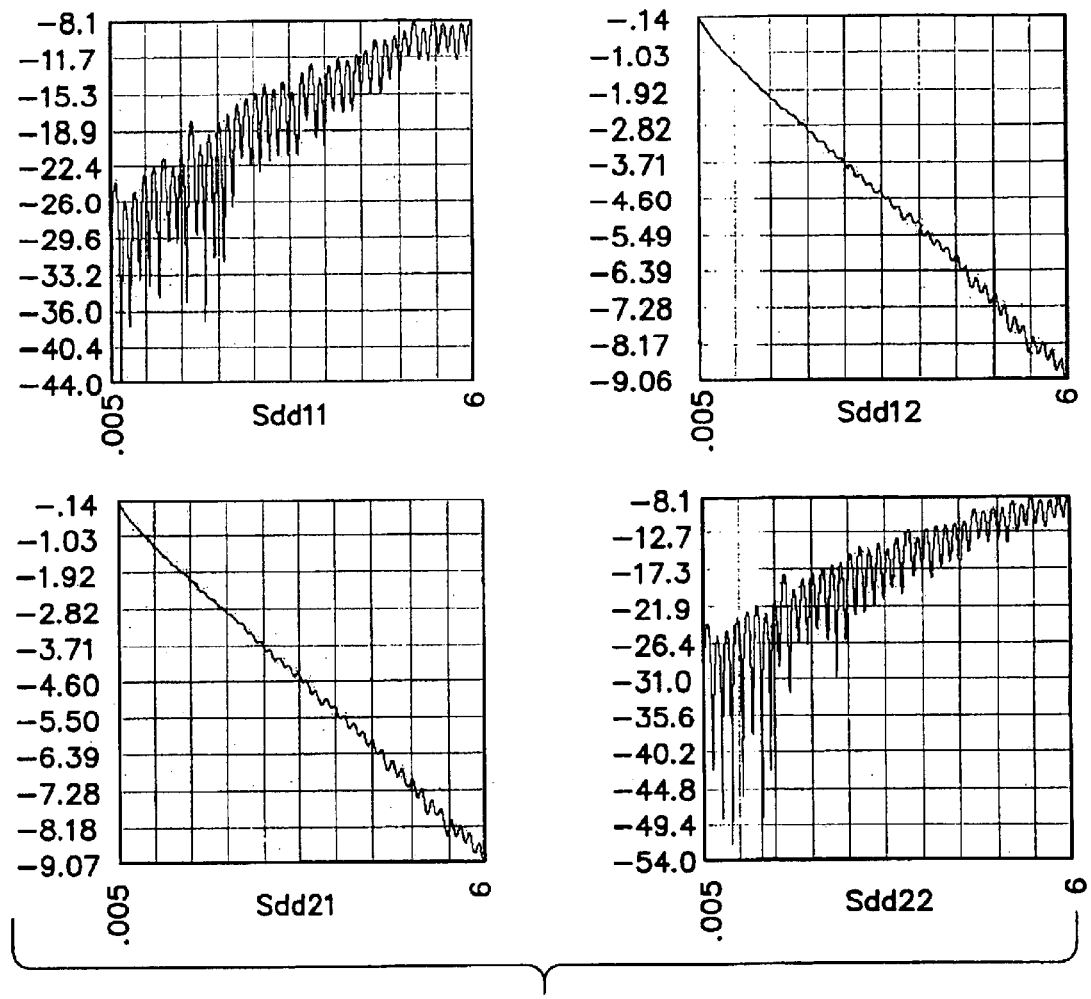
FIG. 18 illustrates mixed-mode S-parameter measurements of a differential pair of transmission lines such as illustrated in FIG. 16, with an embodiment of a multiport test system of this disclosure.

Referring to FIG. 18, there is illustrated measured mixed-mode S-parameters of a differential pair such as illustrated in FIG. 16 with an embodiment of an MTS of this disclosure with ports 1 and 2 of an MTS coupled to input terminals of the differential pair and port 3 and 4 of the MTS coupled to output terminals of the differential pair. It is to be understood that according to some embodiments of the method and MTS apparatus of this disclosure, a differential pair can be modeled as a 2-port balanced device as measured and as illustrated in FIG. 18, or as a 4-port single-ended device. The illustrated measurements of FIG. 18 may be broken up into four quadrants of measurements: the upper left quadrant representing the pure differential mode $[S_{dd}]$ of the balanced pair; the upper right quadrant representing the common mode to differential mode conversion $[S_{dc}]$ of the balanced pair; the lower left quadrant representing the differential mode to common mode conversion $[S_{cd}]$ of the balanced pair; and the lower right quadrant representing the pure common mode $[S_{cc}]$ of the balanced pair. Thus, the upper left and the lower right quadrants of FIG. 18 represent pure modes of operation of the balanced pair and the upper right and lower left quadrants of FIG. 18 represent the cross modes of operation of the balanced pair.

One of skill in the art can appreciate that in a perfectly symmetrical balanced DUT, the elements of the $[S_{dc}]$ and the $[S_{cd}]$ quadrants may have zero magnitude. One of skill in the art can also appreciate that the presence of any asymmetry in the DUT due to, for example, signal amplitude or phase skew can result in a magnitude larger than zero for the elements of $[S_{dc}]$ and $[S_{cd}]$. One of skill in the art can further appreciate that the lower left quadrant $[S_{cd}]$ as illustrated in FIG. 18 provides an indication of the generation of EMI by the DUT and the upper right quadrant $[S_{dc}]$ provides an indication of the susceptibility of the DUT to EMI[2].

It is to be appreciated that the data of FIG. 18 were measured on a model ATN-4111D 300 KHz-to-6 GHz MTS test system from Agilent Technologies (Billerica, Mass.). The MTS system includes a model N8573A VNA, a multiport test set, and multiport application software embodying an embodiment of the method and apparatus of this disclosure.

Referring to FIG. 18, it can be seen that the input $[S_{dd11}]$ and output $[S_{dd22}]$ return loss of the differential transmission line in the purely differential mode [upper left quadrant of the matrix] reaches 8.1 dB at 6 GHz, while the forward and reverse insertion loss $[S_{dd21}]$ and $[S_{dd12}]$ reaches 9 dB at 6 GHz. It is to be appreciated that the data of FIG. 18 are referenced to a differential mode impedance of 100 Ω.

Referring to FIG. 18, it can be seen that the common mode performance of the differential pair is illustrated in the lower right quadrant of FIG. 18 and it is to be appreciated that it is referenced to a common mode of impedance of 25 Ω. The common-mode performance shows a similar performance of the differential cable indicating some light coupling between the lines that form the balanced pair. It can also be determined from the measurements of the DUT illustrated in the lower left and upper right quadrants of FIG. 18, that the DUT has fairly low mode conversion of approximately 38 dB in the worst case scenario at 6 GHz.

Figure 19B:
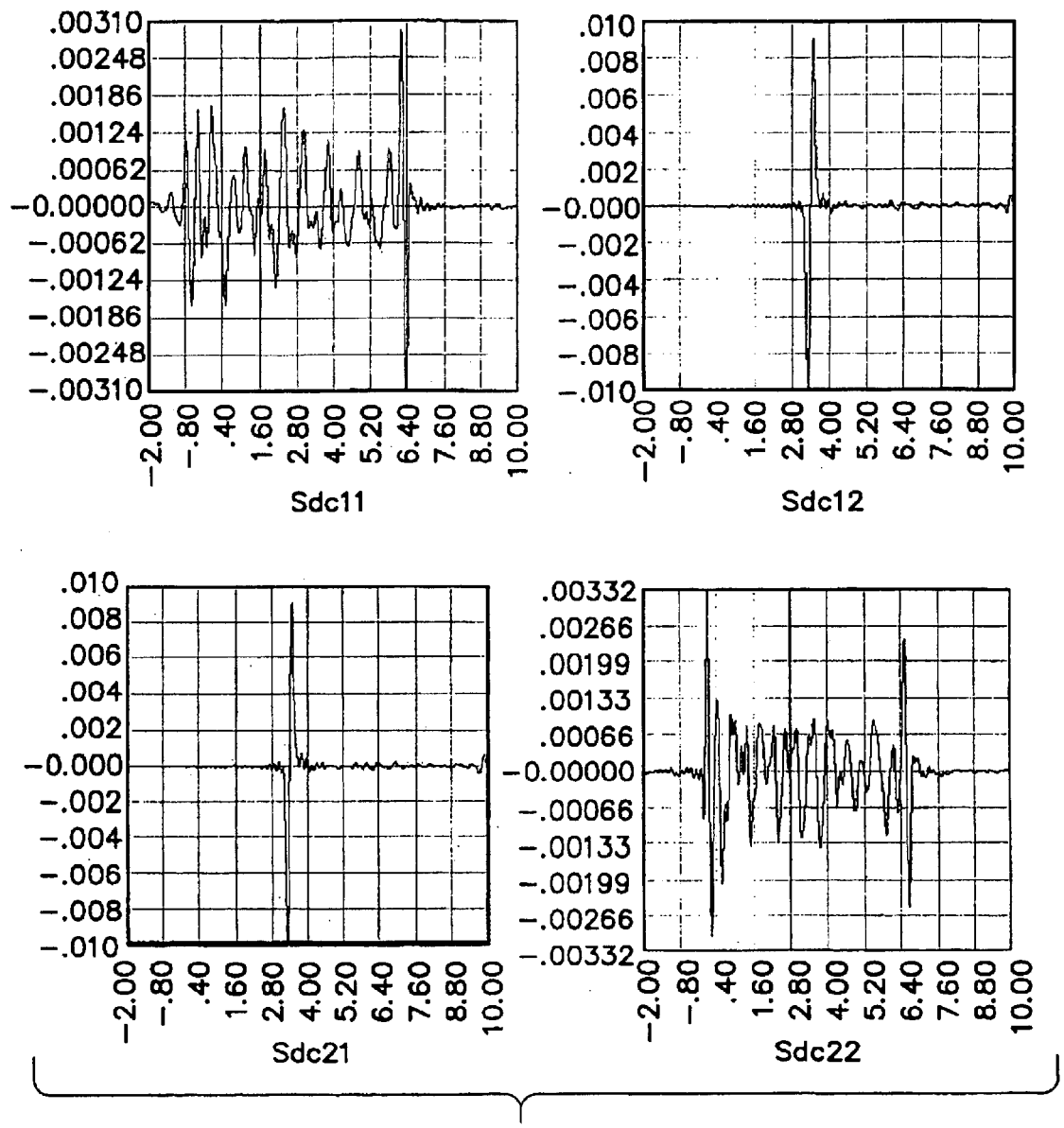
FIG. 19 illustrates a time-domain impulse response representation of the mixed-mode S-parameters of FIG. 18.
Figure 19C:
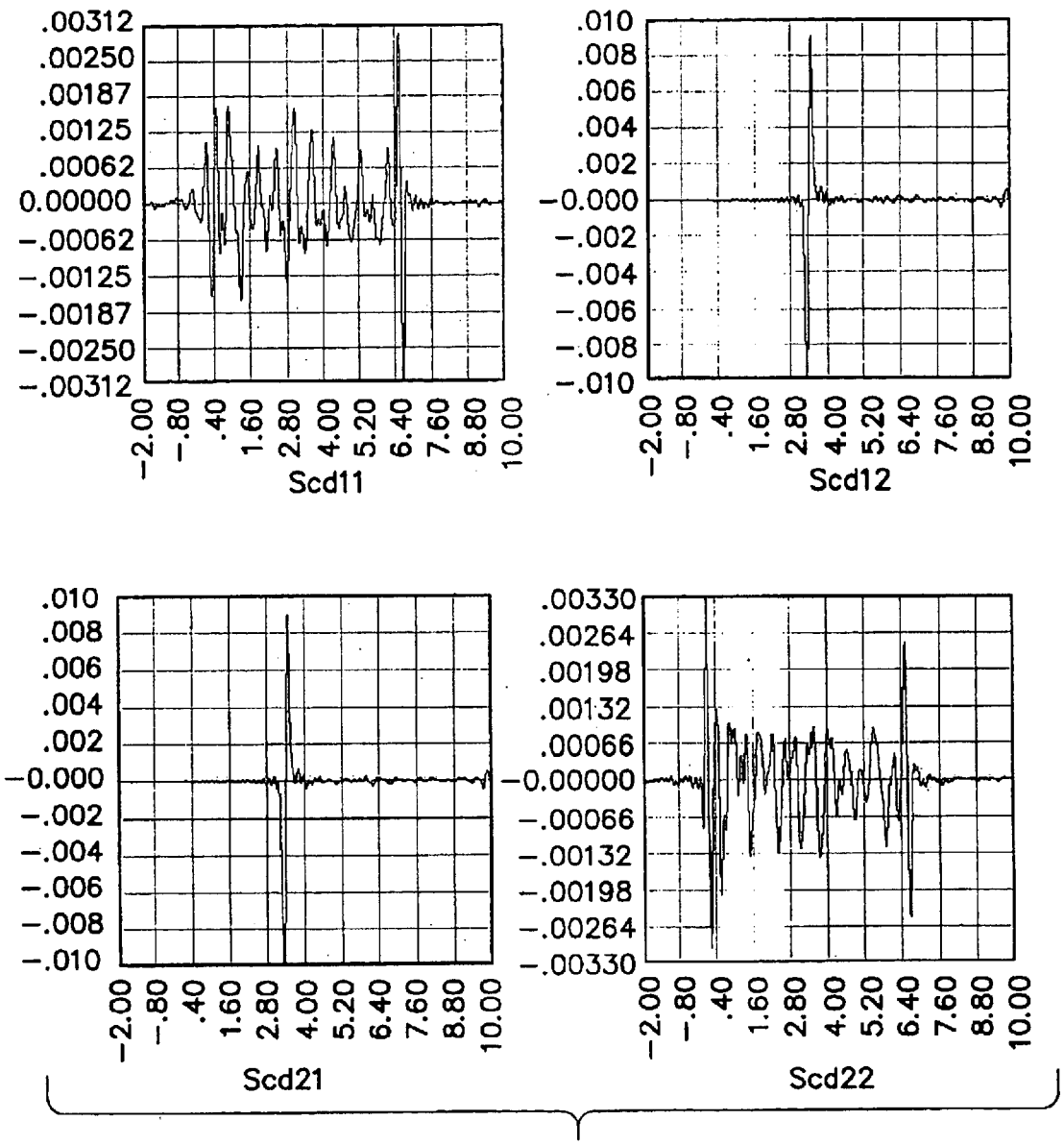
Figure 19D:
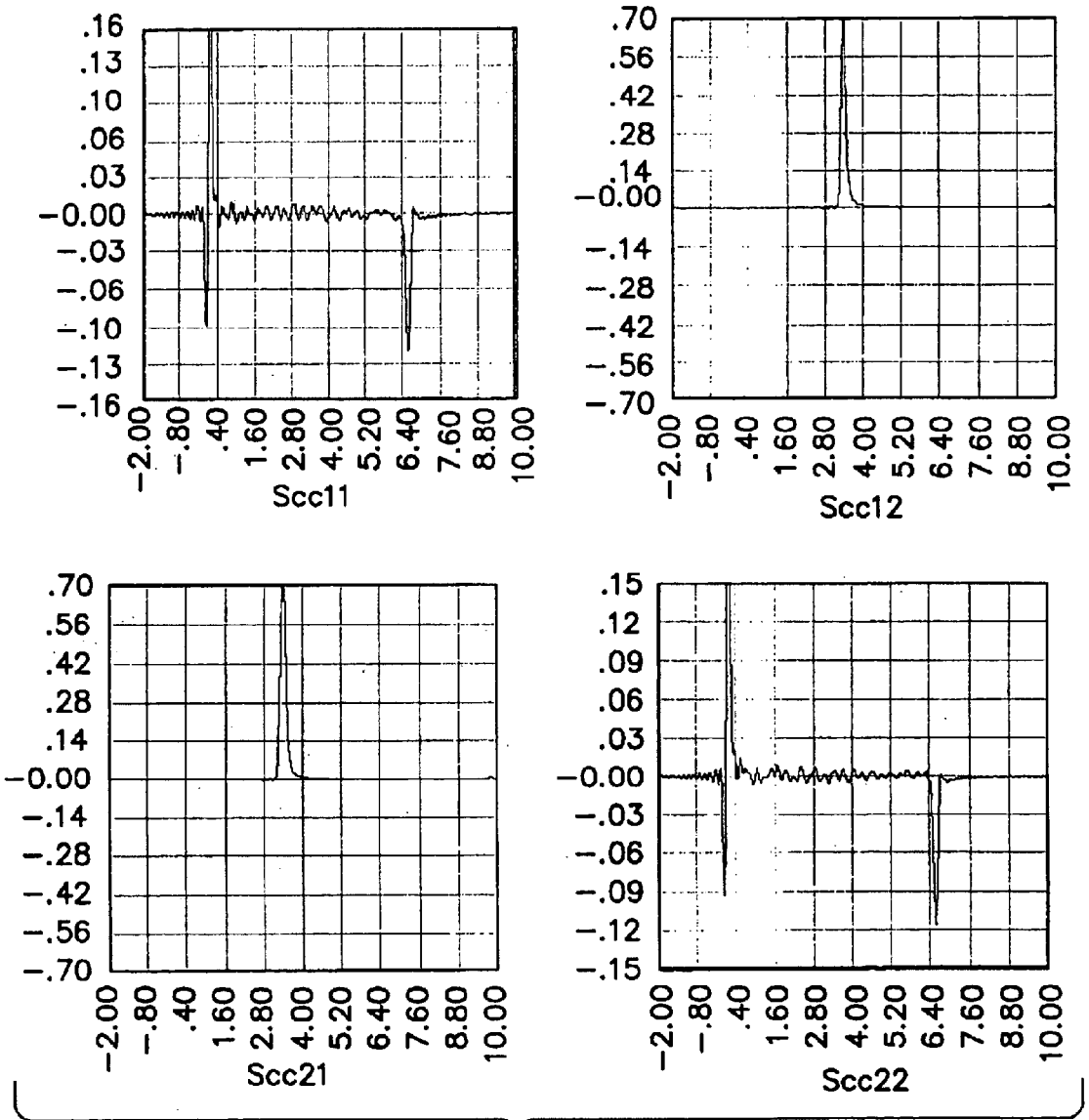

It is also to be appreciated that according to some embodiments of the method and apparatus of this disclosure, the mixed-mode S-parameters obtained with the MTS of this disclosure can be converted into the time domain. FIG. 19 illustrates the time-domain impulse response of the mixed-mode S-parameters of FIG. 18. In particular, by performing an inverse Fast Fourier Transform (FFT), any of the parameters of FIG. 18 can be viewed in the time-domain as illustrated in FIG. 19. Thus, FIG. 19 illustrates the time-domain impulse response of the DUT, and is organized in the same manner as the frequency domain data of FIG. 18. In particular, the upper left quadrant illustrates the differential mode time-domain performance. The parameters $S_{dd11}$ and $S_{dd22}$ illustrate the TDR response of each port of the differential cable DUT in a differential mode, and the parameters $S_{dd21}$ and $S_{dd12}$ illustrate the forward and reverse TDT parameters of the differential pair DUT in the differential mode. It is to be appreciated that the other three quadrants of FIG. 19 illustrate the full mixed mode time domain performance of the differential pair DUT.

Figure 20:
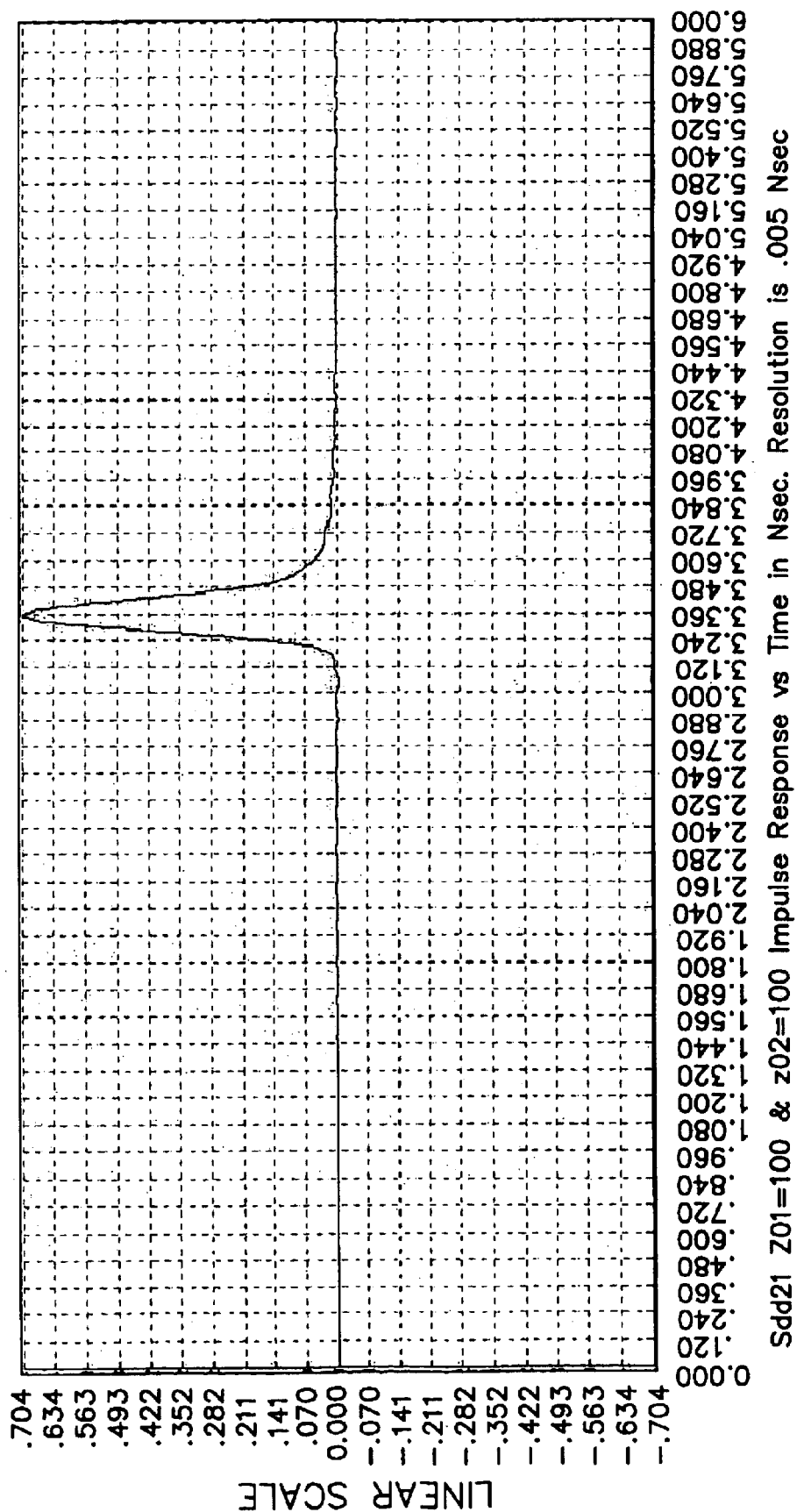
FIG. 20 illustrates the pure differential forward transmission time-domain impulse response of the time-domain representation of FIG. 19.
Figure 21:
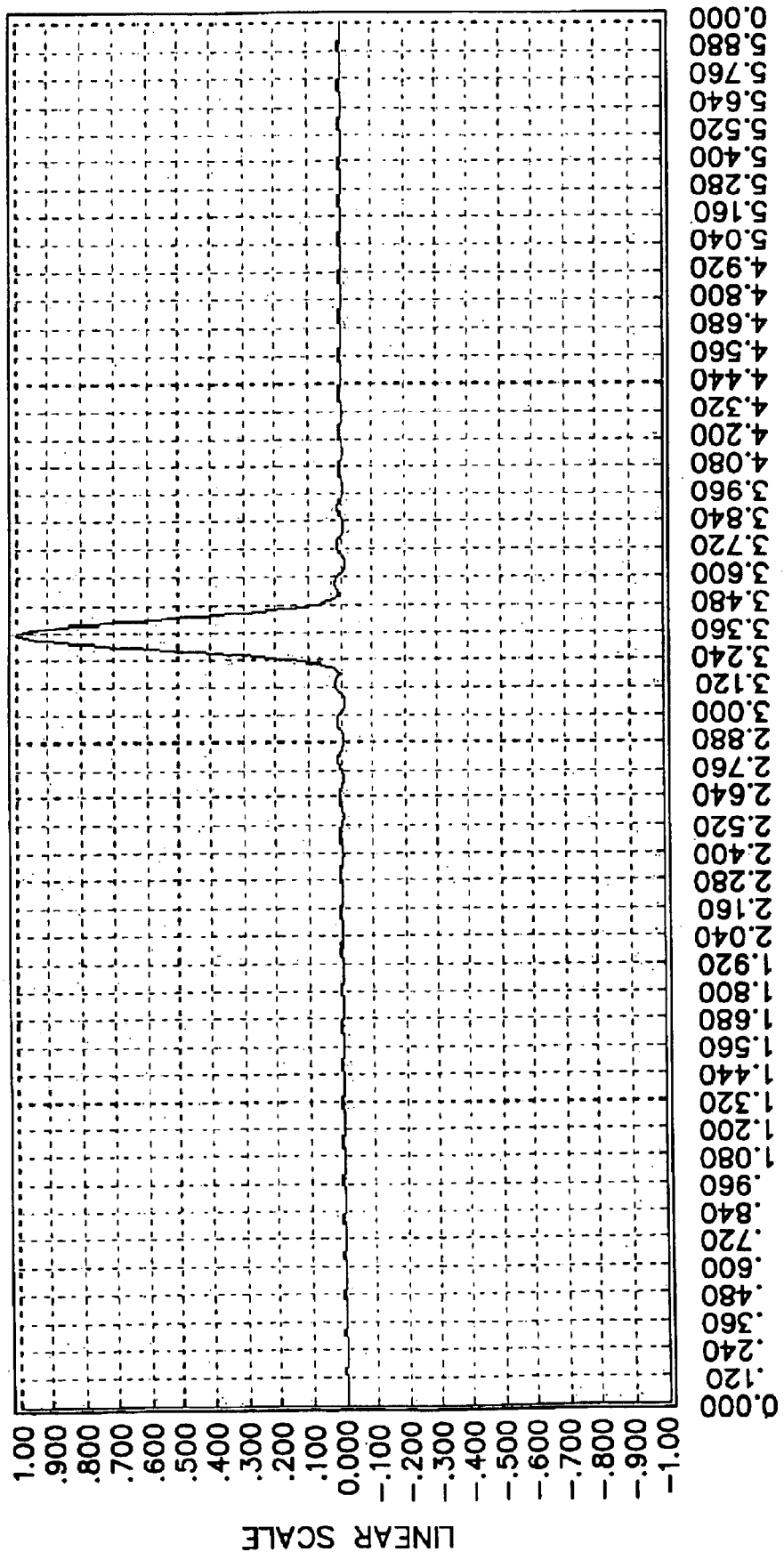
FIG. 21 illustrates the transmission time-domain impulse response of a 3.35 Psec loss-less transmission line that is simulated according to an embodiment of an MTS of this disclosure.

Referring to FIG. 19, the upper left quadrant represents the $[S_{dd}]$ performance of the DUT, which is the time domain differential performance of the differential pair DUT. The $S_{dd21}$ performance of the DUT is further illustrated in FIGS. 20–23. In particular, the TDT response of $S_{dd21}$ or, in other words, the forward transmission time-domain impulse response is illustrated in FIG. 20. FIG. 20 illustrates that the DUT has a 3.35 nanosecond (Nsec) delay, a mid-pulse-bandwidth (MPB) of approximately 175 picoseconds (Psec) wide and a ratio of the transmission coefficient, at a peak, of approximately 0.704. Compare FIG. 20 with FIG. 21, which illustrates the TDT of a 3.35 Psec loss-less transmission line that is generated through simulation by an embodiment of the MTS of this disclosure. The loss-less transmission line has a MPB of approximately 146 Psec wide and a ratio of the transmission coefficient, at the peak, which is 1. It is to be appreciated that both the measurement of FIG. 20 and the simulation of FIG. 21 are characterized from 5 MHz to 6 GHz in 5 MHz step size increments. Thus, the TDT response of FIG. 20 clearly illustrates that the DUT has an attenuation transmission coefficient from unity to 0.704, and a distortion of the MPB from approximately 146 Psec to approximately 175 Psec.

Figure 22:
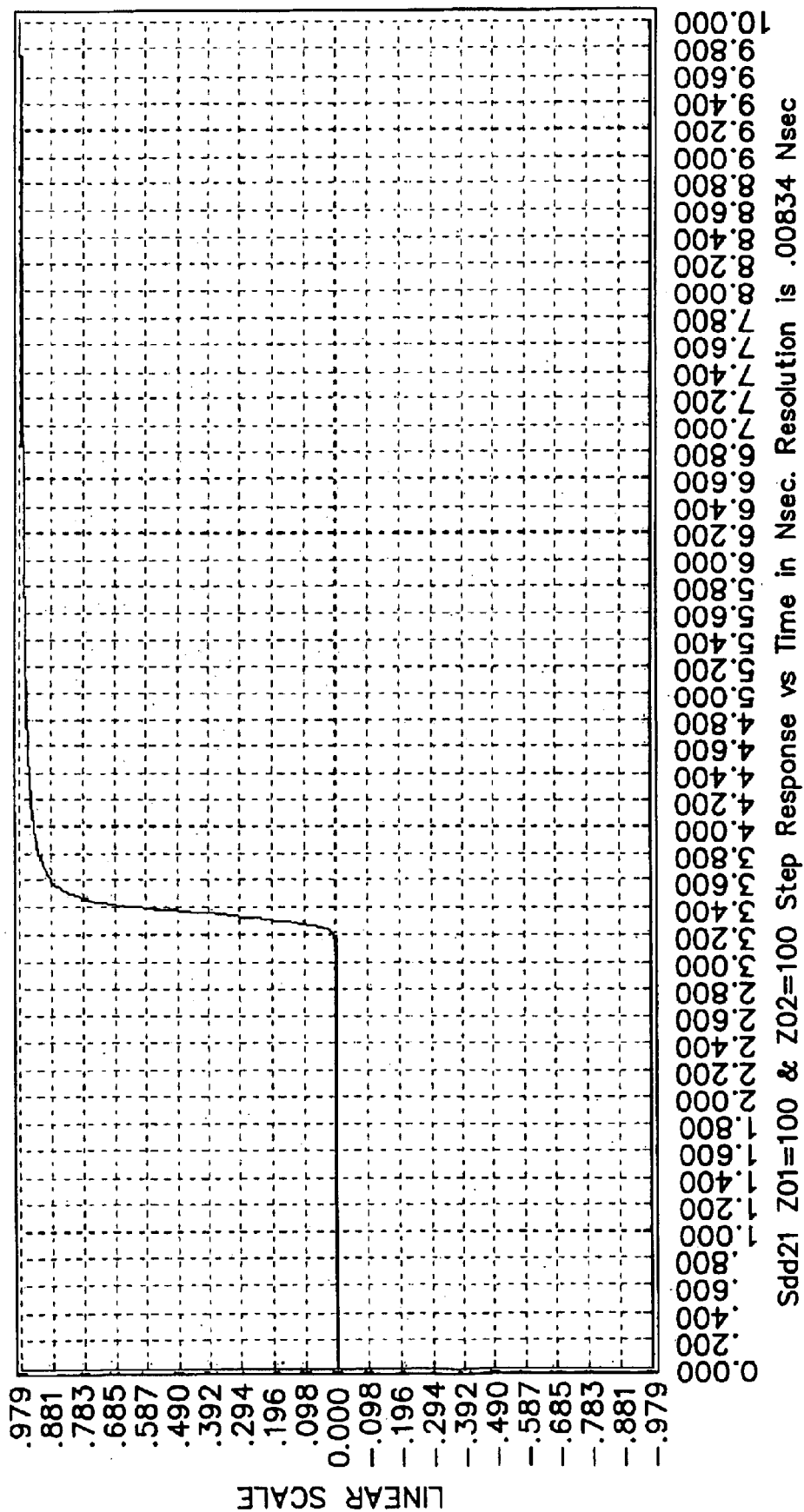
FIG. 22 illustrates a pure differential forward transmission time-domain step response of the FIG. 18.
Figure 23:
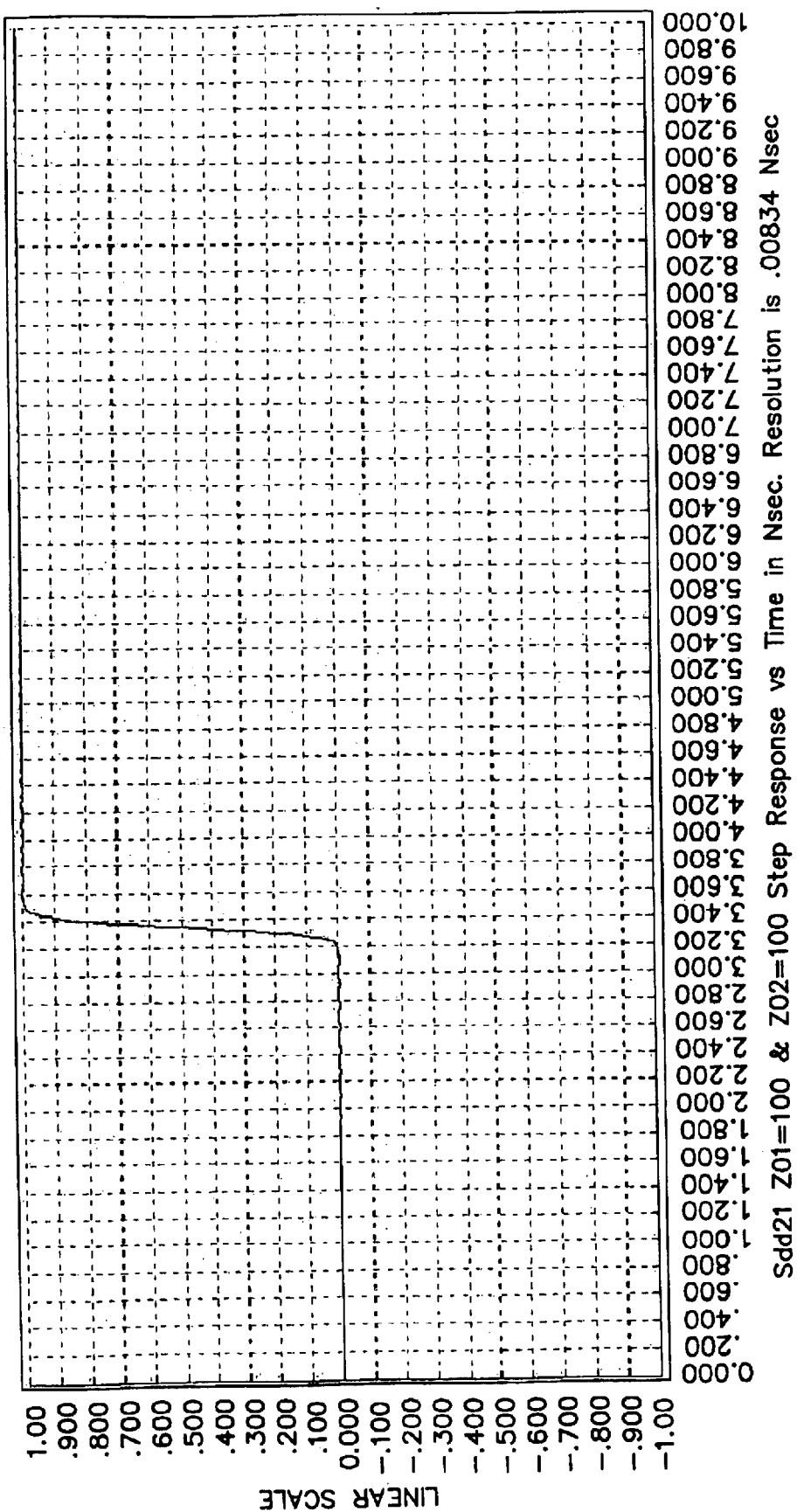
FIG. 23 illustrates the transmission time-domain step response of a 3.35 psec loss-less transmission line that is simulated according to an embodiment of an MTS of this disclosure.

Similarly, FIG. 22 illustrates the time domain of the step response $S_{dd21}$ of the DUT, and FIG. 23 illustrates the simulated step response of the loss-less transmission line. From FIGS. 22–23, it can be seen that the rise-time of the time-domain step function, $S_{dd21}$ is degraded from approximately 121 Psec to approximately 308 Psec. In addition, comparing FIGS. 22 and 23, it can be seen that the step function steady state is attenuated from unity to approximately 0.98.

Figure 24A:
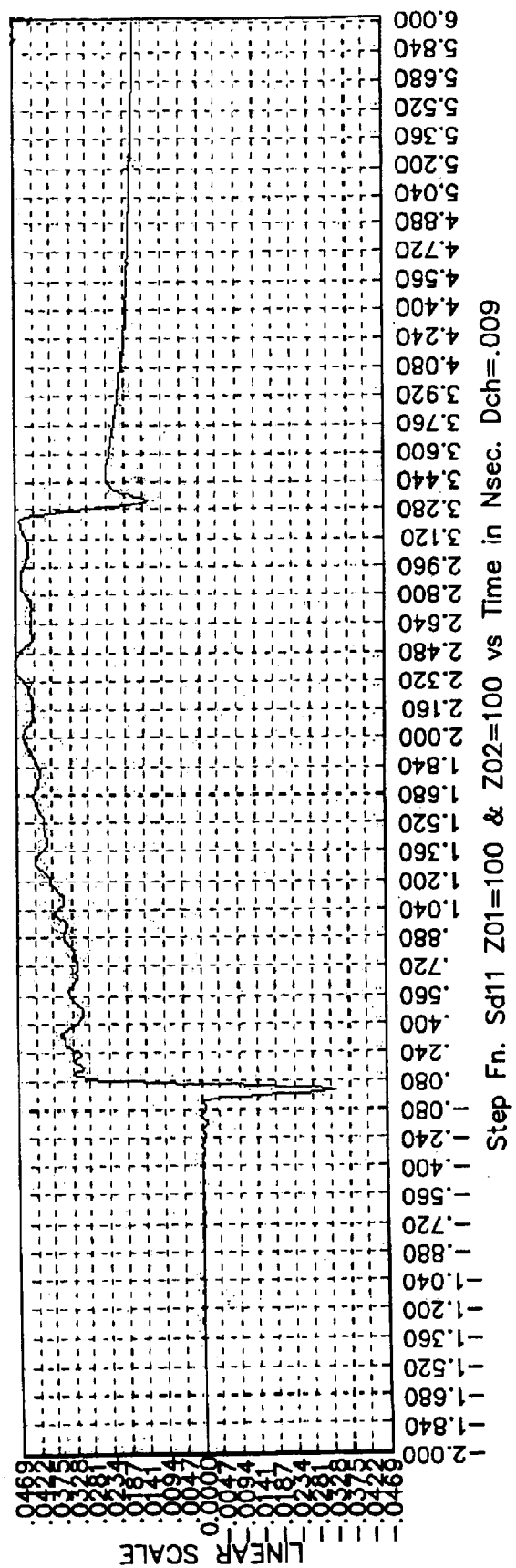
FIG. 24(a) illustrates a pure differential reflection time-domain step response of the differential transmission line according to an embodiment of the multiport test set of this disclosure.
Figure 24B:
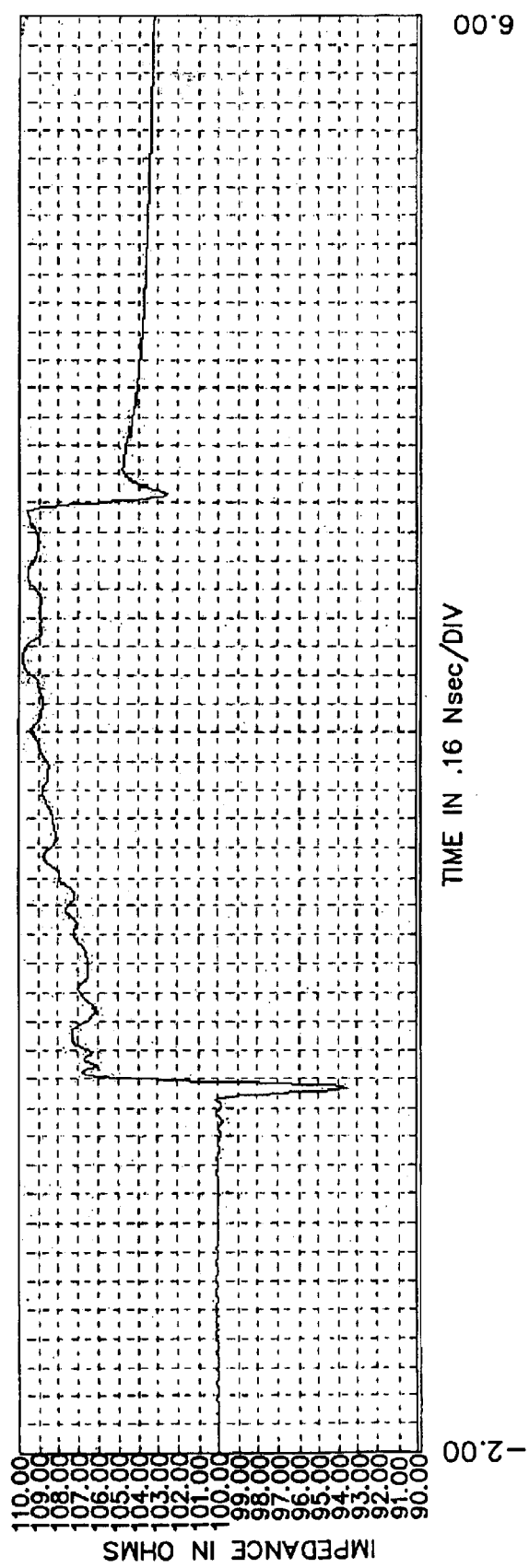
FIG. 24(b) illustrates pure differential impedance profile of the differential transmission line according to an embodiment of the multiport test set of this disclosure.

It is further to be appreciated that according to some embodiments of the method and MTS apparatus of this disclosure, impedance profiling of a DUT can be achieved by characterizing the reflection time-domain step function $S_{dd11}$, which is equivalent to a traditional TDR measurement. FIG. 24(a) illustrates a pure differential forward reflection time domain step response, and FIG. 24(b) a pure differential impedance profile of the DUT. The differential impedance has an impedance value in a range of approximately 106 to 109 Ω. The illustrated upward slope of the differential impedance profile can be due to various loss mechanisms in the DUT such as a skin effect and dielectric losses in the differential transmission line. It is to be appreciated by one of skill in the art that a loss-less transmission line (performance not illustrated) has a flat impedance slope. FIGS. 24(a)–(b) also illustrate discontinuities in the transmission line that can result from the connectors of the DUT. Thus, it is to be appreciated that the reflection time-domain step function can be used to isolate discontinuities in the DUT.

Figure 25:
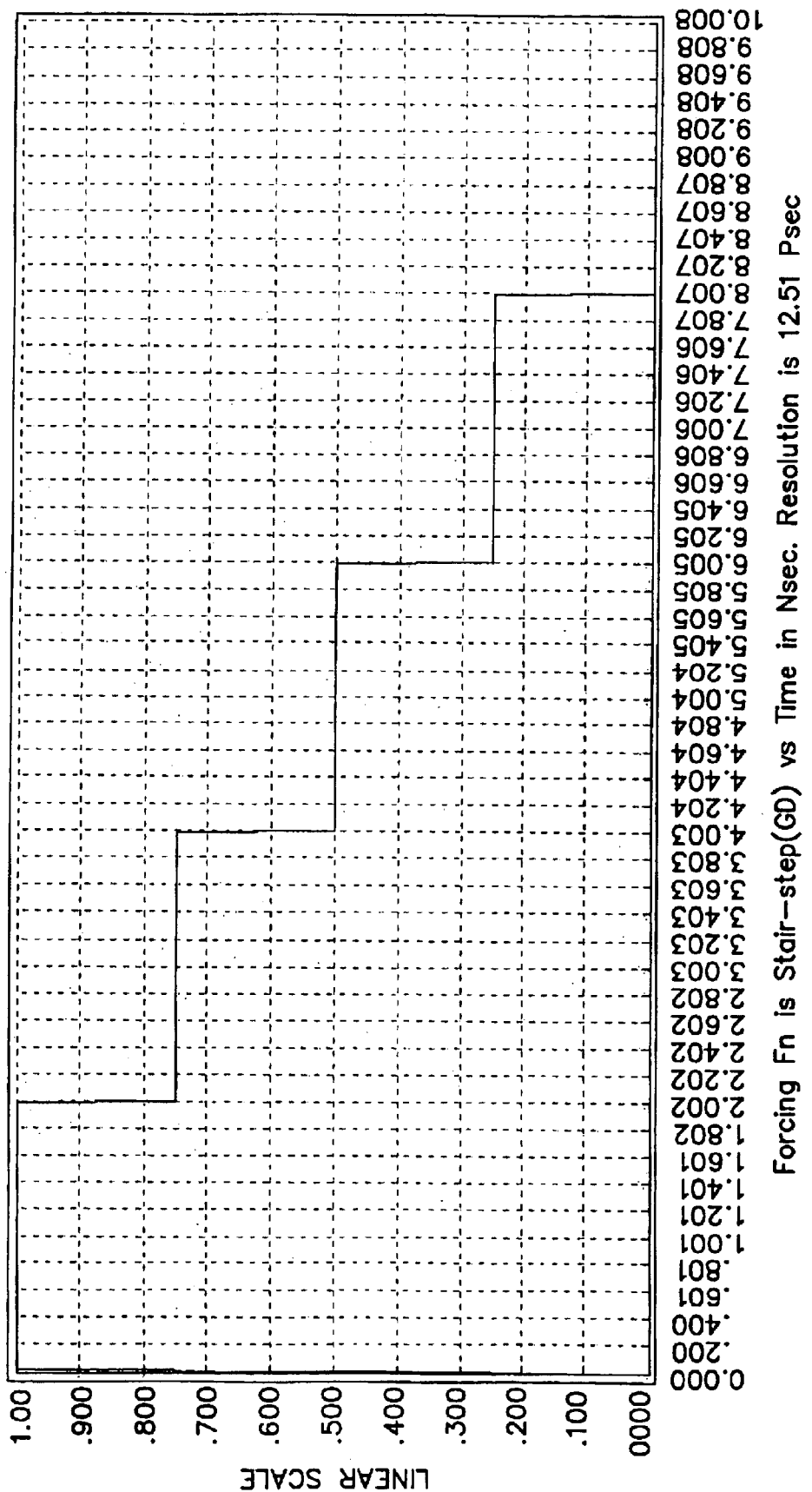
FIG. 25 illustrates a simulated input waveform that can be provided according to an embodiment of the multiport test set of this disclosure.

One of skill in the art can appreciate that one conventional testing process for a high-speed digital DUT in the time domain with a conventional TDR system, is to stimulate the DUT with a digital bit pattern and observe an output response of the DUT. It is to be appreciated that according to some embodiments of the method and MTS apparatus of this disclosure, this testing process can be done on any DUT with any input waveform. In particular, it is to be appreciated that any arbitrary input bit pattern can be generated mathematically according to some embodiments of the MTS of this disclosure. In addition, once the time-domain impulse response is determined from the mixed-mode S-parameter measurements of the DUT with the MTS of this disclosure, an output response of the DUT can be determined by convolving the time-domain impulse response with the simulated input waveform, according to the Discrete Time Convolution Transformation. By way of example, FIG. 25 illustrates a simulated input waveform that initially steps up to 1.0 and then steps down to zero in approximately 2 Nsec step sizes. It is to be appreciated that according to some embodiments of the method and MTS apparatus of this disclosure, this simulated input waveform can be convolved with the time-domain impulse response of the DUT such as the time-domain impulse response of FIG. 20.

Figure 26:
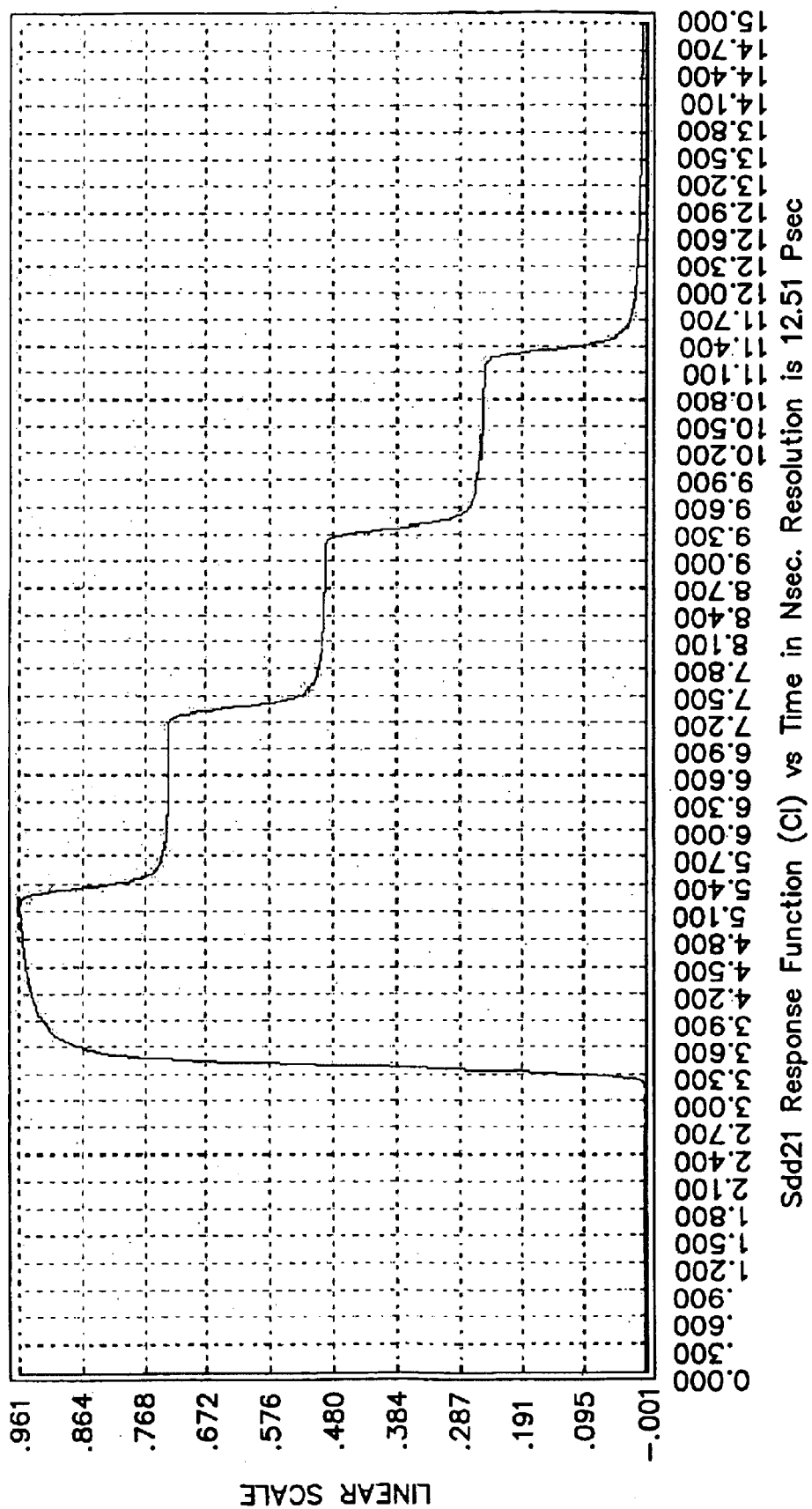
FIG. 26 illustrates a simulated output response of a differential transmission line in response to the simulated input signal of FIG. 25, according to a multiport test set of this disclosure.

Referring to FIG. 26, there is illustrated an output response of the DUT determined by convolving the above-illustrated time-domain impulse response and input waveform, which illustrates that leading and trailing edged discontinuities of the input waveform have been rounded off, and which may be due to filtering of high frequency harmonics of the input signal and distortion of the differential transmission line. It is also to be appreciated that the output response starts at approximately 3.35 Nsec delay, which correlates to the delay of the impulse function. Further, it is to be appreciated that the output response does not reach a signal amplitude of 1.0 due to losses in the differential transmission line.

Figure 27:
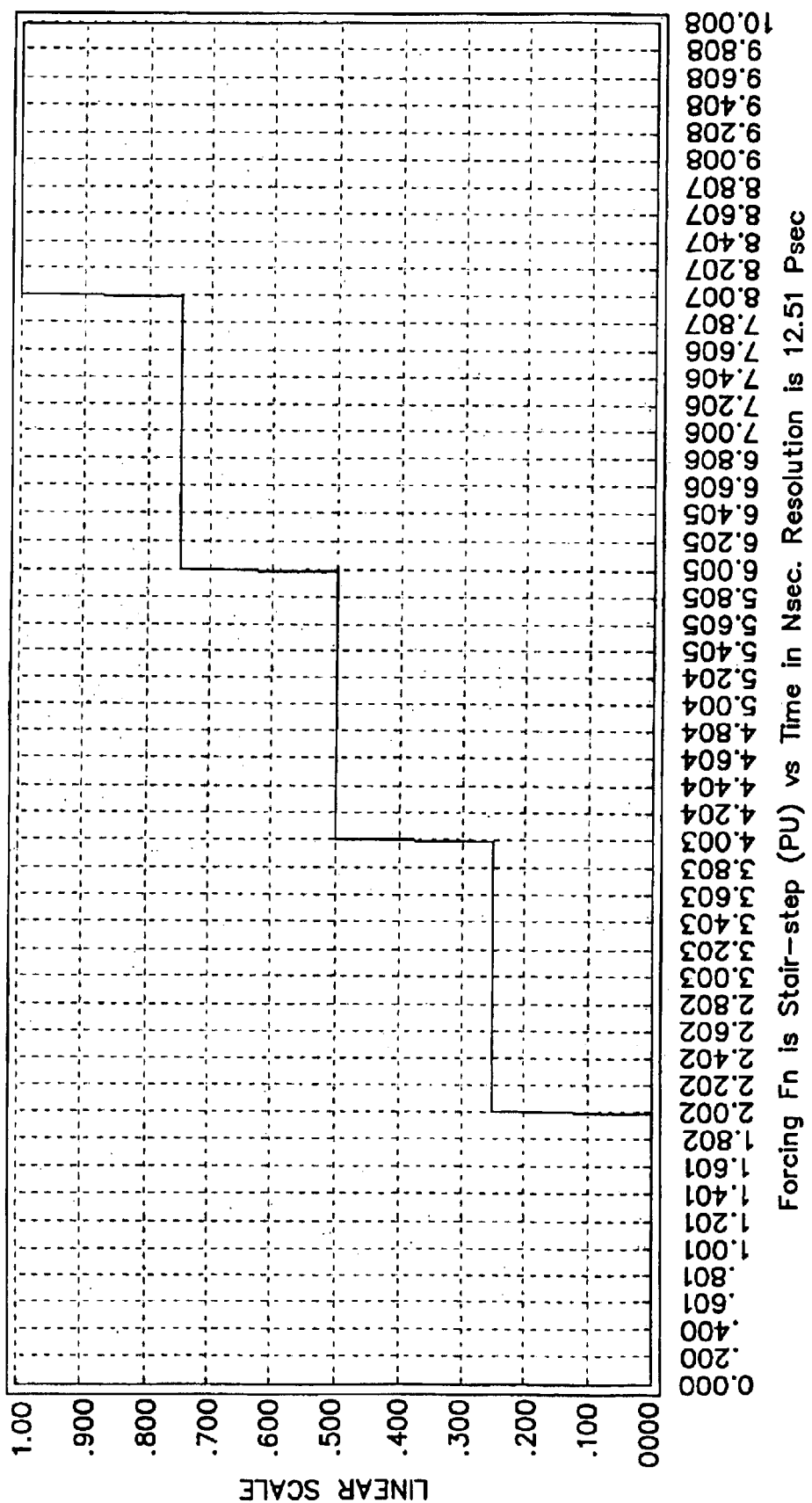
FIG. 27 illustrates another example of a simulated input form according to a multiport test system of this disclosure.
Figure 28:
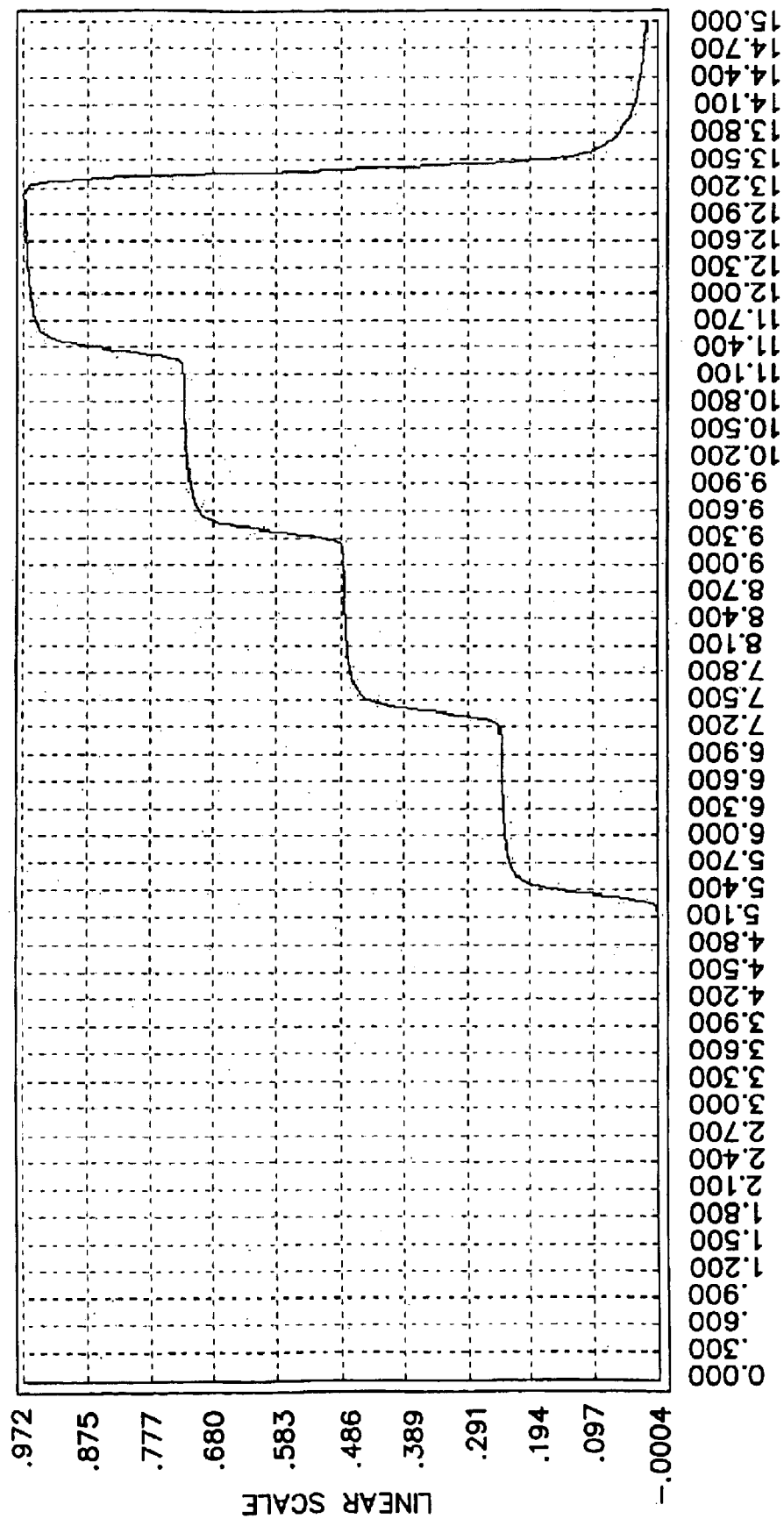
FIG. 28 illustrates a simulated output response of the differential transmission line in response to the simulated input signal of FIG. 27, according to an embodiment of a multiport test set of this disclosure.

Referring to FIG. 27, there is illustrated another example of a mathematically generated input waveform that steps from zero to unity in 2 Nsec step sizes, and that can be convolved with the measured time-domain impulse response of the DUT. The output response is illustrated in FIG. 28.

Figure 29:
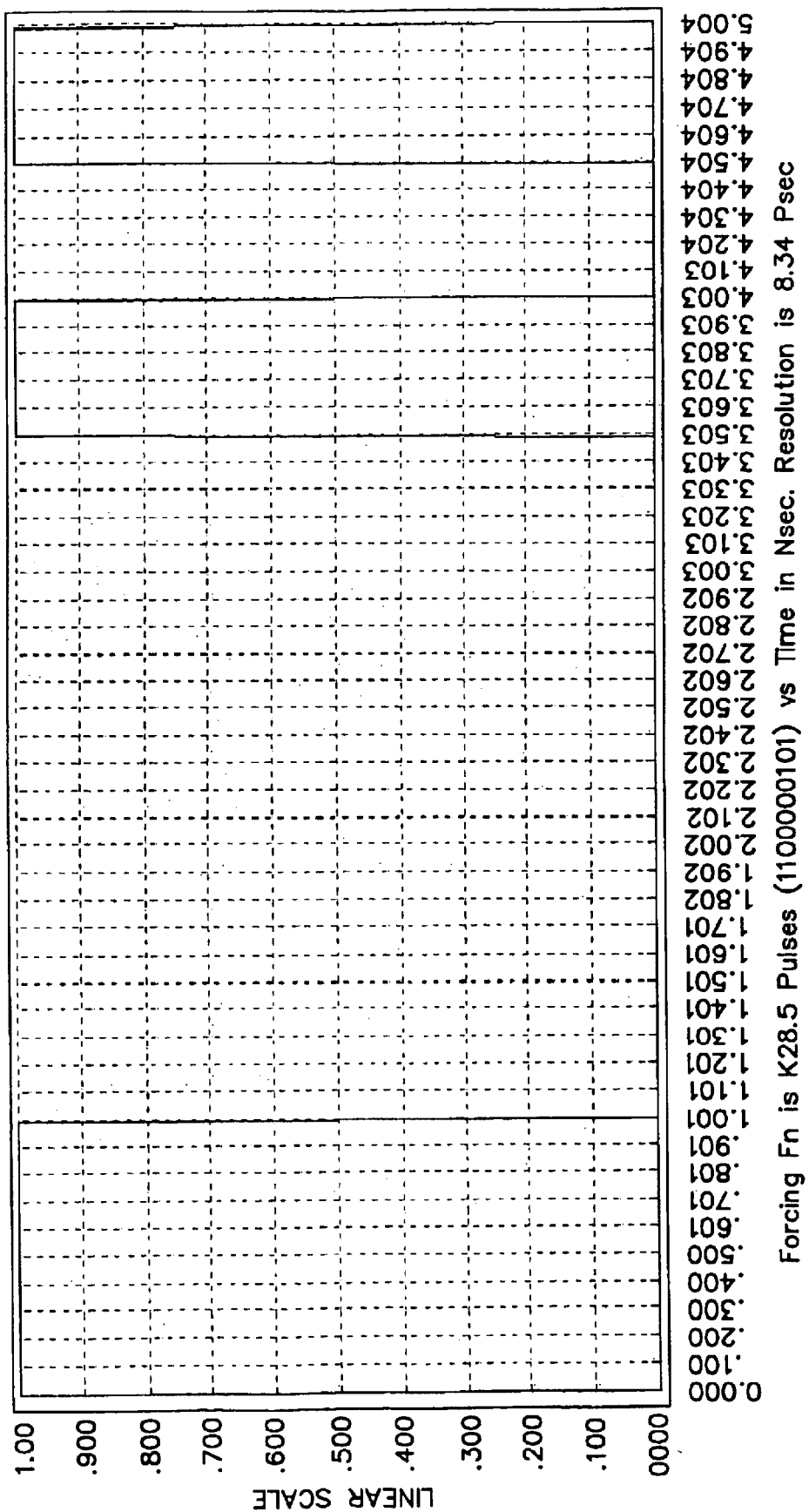
FIG. 29 illustrates another embodiment of a simulated input signal that can be provided with an embodiment of a multiport test set according to this disclosure.
Figure 30:
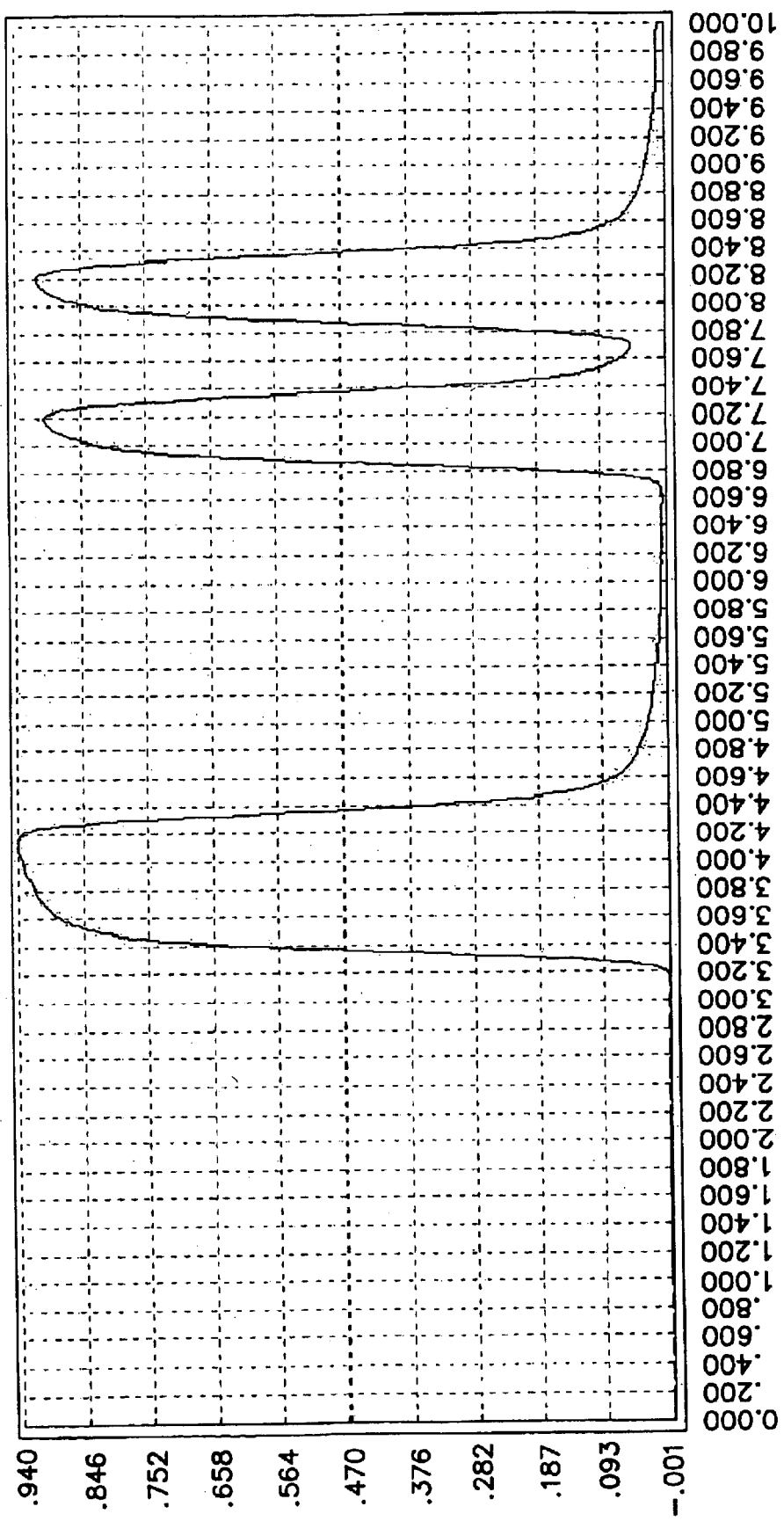
FIG. 30 illustrates a simulated output response of a differential transmission line in response to the simulated input response of FIG. 29, according to an embodiment of the multiport test system of this disclosure.

Referring to FIG. 29, there is illustrated another mathematically generated input waveform that can be provided with an embodiment of an MTS of this disclosure which is known to those of skill in the art as K28.5 and has ten digital pulses. In particular, the pulse bit pattern is 1100000101 and each pulse is 0.5 Nsec wide, which corresponds to a data transmission rate of 2 Gb/S. The K28.5 input waveform can be convolved with the measured impulse response of the DUT, and the output response is illustrated in FIG. 30.

Figure 31:
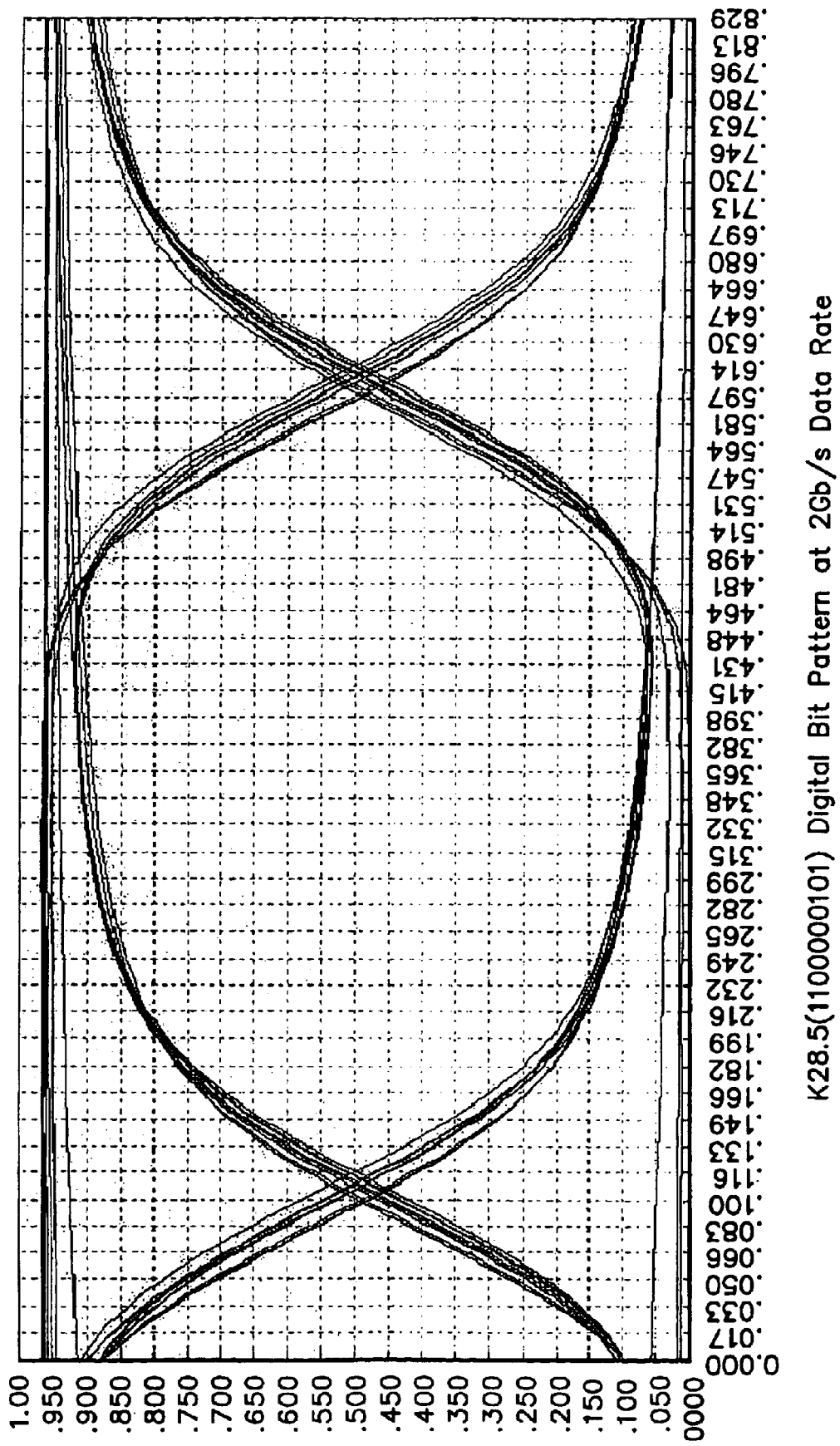
FIG. 31 illustrates an eye diagram which can be provided according to an embodiment of a multiport test system of this disclosure.

It is appreciated by those of skill in the art that in characterizing devices for data communication applications, the devices should add minimal distortion to the waveform passing through them. These devices can be characterized by overlapping each output waveforms from the DUT on top of one another on a common scale through what is known to those of skill in the art as in eye diagram or eye pattern. FIG. 31 illustrates such an eye diagram which can be provided according to one embodiment of an MTS of this disclosure, by plotting each individual output pulse from the DUT for a time span from 0 to 0.642 Nsec. As can be seen from FIG. 31, the differential transmission line clearly preserves the eye pattern for 0.5 Nsec width input pulses or a data transmission rate of 2 Gb/S. In other words, the digital zeros and the digital ones are still distinguishable from one another after traveling through the differential transmission line DUT.

Figure 32:
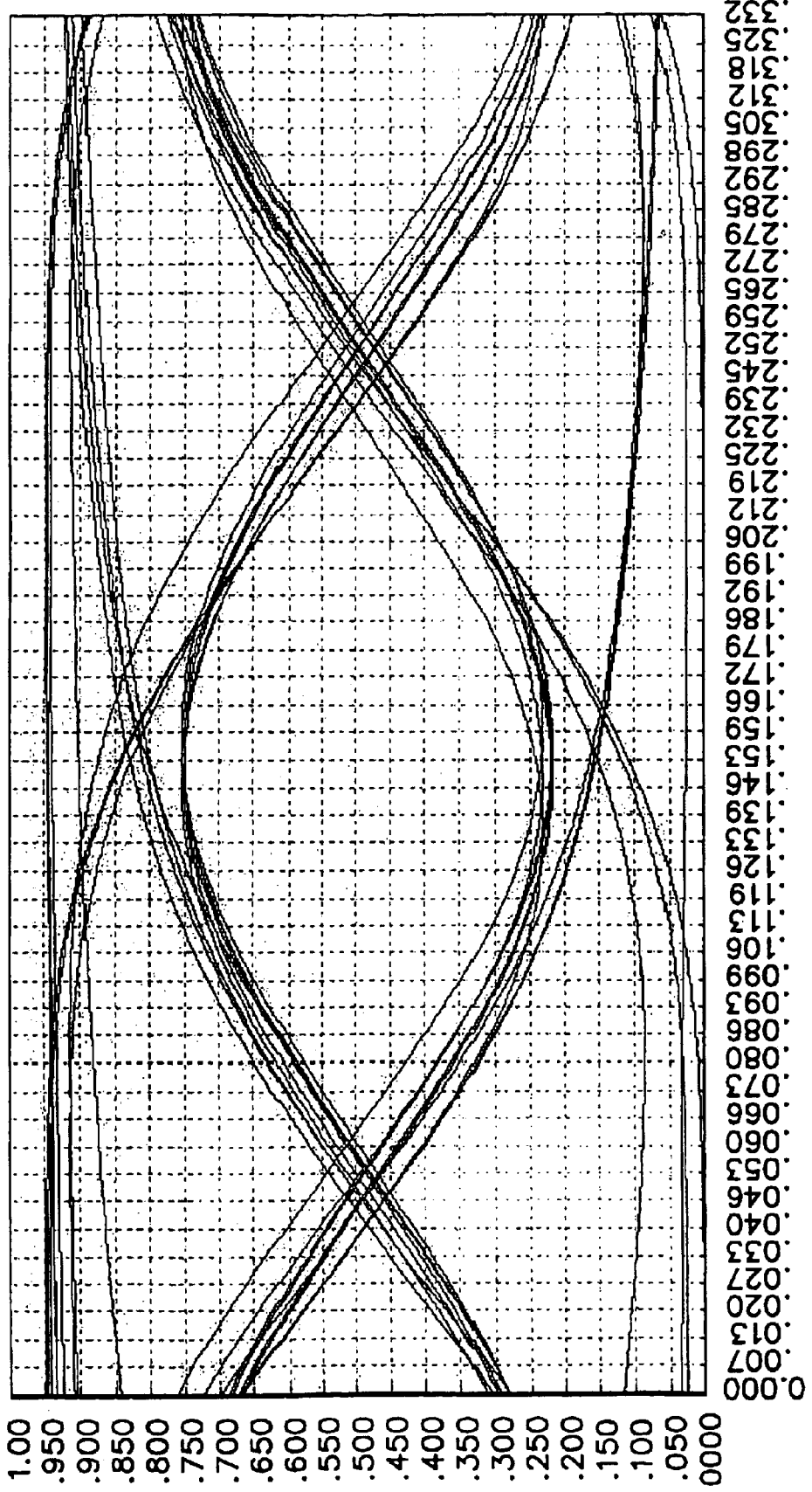
FIG. 32 illustrates another embodiment of an eye diagram of a differential transmission line DUT at an increased data rate, that can be simulated with an embodiment of a multiport test system of this disclosure.

Referring now to FIG. 32, there is illustrated an eye pattern of the DUT at an increased data rate. In particular, the pulse width for the input waveform has been reduced to 0.2 Nsec which corresponds to 5 Gb/S data transmission rate and FIG. 32 illustrates the output eye pattern provided by an embodiment of an MTS. It is apparent from FIG. 32 that the eye has begun to close, indicating that the digital zeros and the digital ones are becoming indistinguishable from one another after traveling through the differential transmission line DUT. Accordingly, it is to be appreciated that the eye pattern provided by some embodiments of the method and MTS apparatus of this disclosure, provides a quick visualization tool that illustrates the performance of a transmission line.

With some embodiments of the method and apparatus for this disclosure, an output response of any device can be analyzed by presenting any arbitrary input waveform to a DUT. It is to be appreciated that with traditional TDR systems, such arbitrary waveform generators are very expensive and impractical. Accordingly, it is to be appreciated that some advantages of some embodiments of the method and apparatus of this disclosure are that any input waveform can be provided to test a DUT, and that an overall cost of providing such performance is drastically reduced. It is also to be appreciated that another advantage of some embodiments of the method and apparatus of the disclosure is that with, for example, existing 50 GHz VNAs, a step rise-time of 15 Psec can be provided in the time domain. It is further to be appreciated that some embodiments of the method and MTS apparatus of this disclosure allow for removal and de-embedding of any known circuit that is cascaded with the DUT, and additional embedding of any known circuit to be cascaded with the DUT. De-embedding can be used, for example, in the measurement of a DUT that has been mounted in a test fixture to remove contributions to the testing of the DUT from the test fixture. Embedding can be used, for example, to simulate a performance of the DUT with an additional element.

Figure 33B:
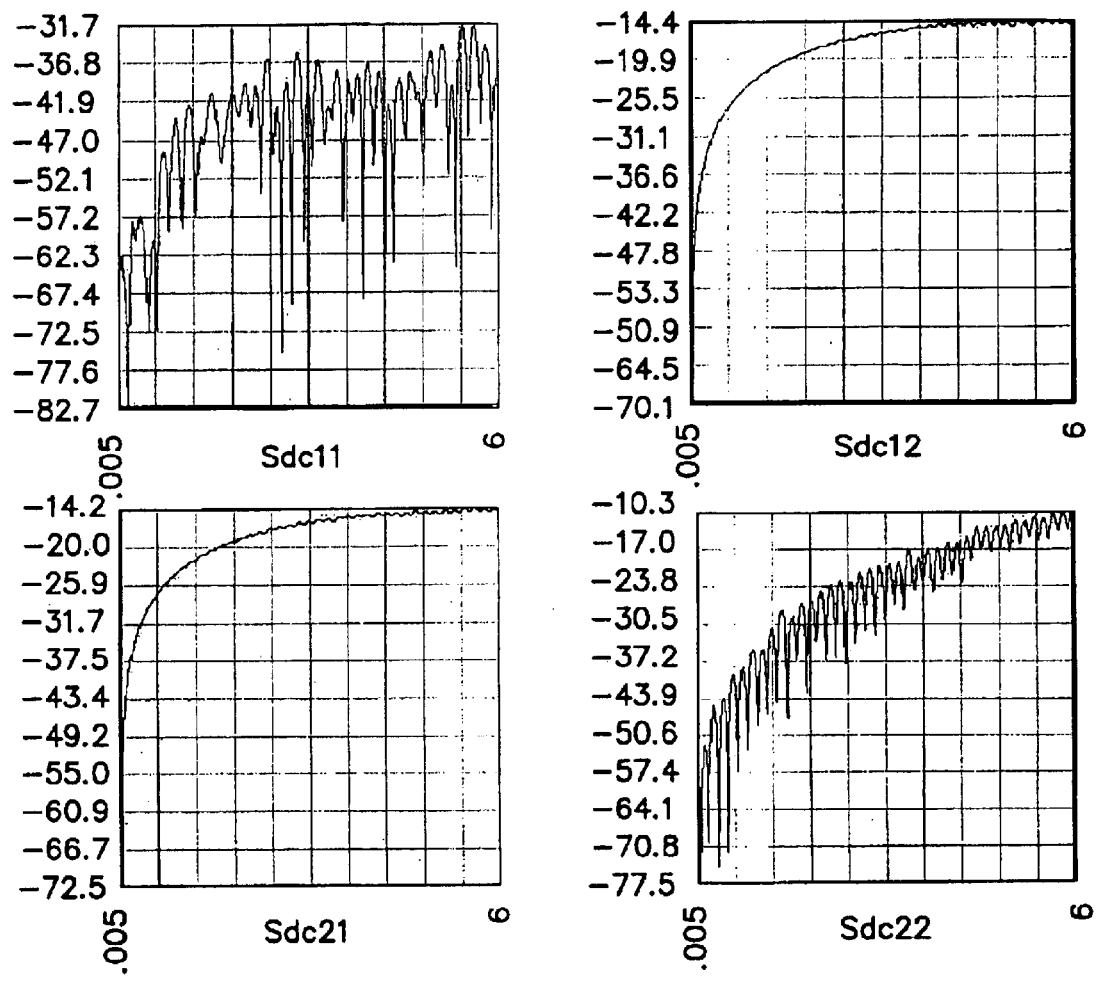
FIG. 33 illustrates mixed-mode S-parameters of a differential transmission line DUT cascaded with a 25 Psec loss-less transmission line embedded at an output of the DUT, that can be simulated with an embodiment of a multiport test system of this disclosure.

For example, FIG. 33 illustrates mixed-mode S-parameters of a differential transmission line DUT with a 25 Psec loss-less line embedded on an output of the DUT, as determined according to one embodiment of the method and MTS apparatus of this disclosure. The differential pair DUT is the same differential pair DUT that was measured and illustrated in FIG. 18, without the embedded 25 Psec loss-less line. As can be seen from FIG. 33, the loss-less line at the output of the DUT causes a phase skew and an imbalance in the differential transmission line. In particular, the transmission parameters of the common to differential mode [$S_{dc}$] and the differential to common mode [$S_{cd}$] are degraded at 6 GHz from approximately −38 dB (see FIG. 18) to −14 dB.

Figure 34:
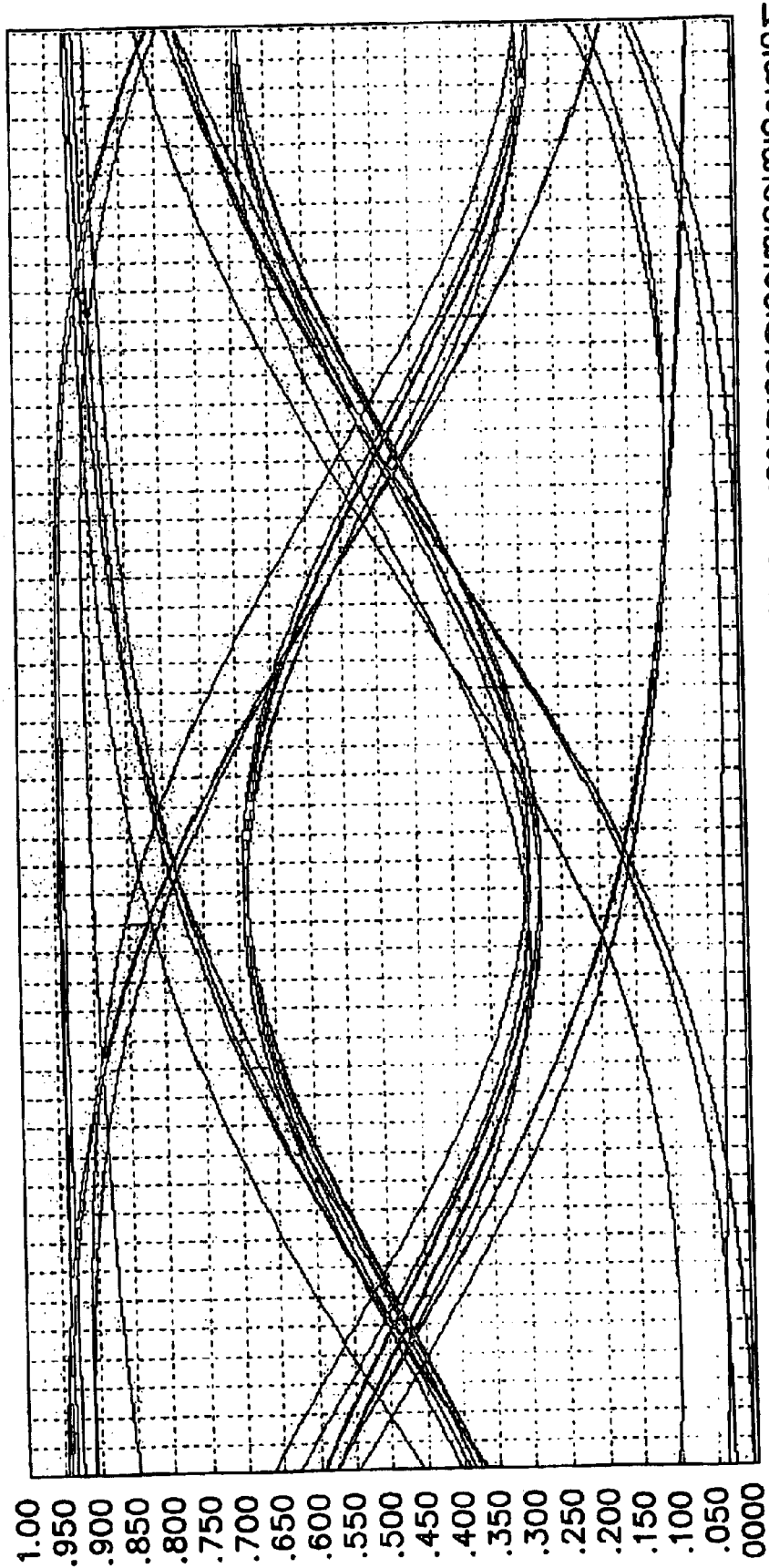
FIG. 34 illustrates an eye diagram of the differential transmission line DUT embedded with the loss-less transmission line of FIG. 33, that can be provided with an embodiment of the multiport test system of this disclosure.

Referring now to FIG. 34, there is illustrated in eye diagram of the differential transmission line DUT embedded with an 85 Psec loss-less line at an output of the differential line DUT for an input having a pulse width of 0.2 Nsec or a 5.0 Gb/S data transmission rate. This is also the same differential transmission line that was measured without the loss-less transmission lines at the output and illustrated with the eye diagram of FIG. 32. Comparing the eye pattern of FIG. 34 with the eye pattern of FIG. 32, it can seen that the 85 Psec phase skew further degrades the eye opening of the differential transmission line.

According to some embodiments of the method and apparatus of this disclosure, it is possible to extract a complete set of transmission line parameters of the DUT from the mixed-mode S-parameter data. The transmission line parameters as known to those of skill in the art provide a complex characteristic impedance and propagation constant, and extract parameters R, L, C, and G per unit length. For the differential mode, measurements of the complex characteristic impedance versus frequency can also be provided. Further, the real and imaginary parts of the propagation constant commonly referred to as $\alpha$ (related to the loss) and $\beta$ (related to the velocity of propagation) may also be provided with some embodiments of the method and apparatus of this disclosure. Such real and imaginary parts are typical simulated using simulation tools such as SPICE.

It is also to be appreciated that there are advantages to applying frequency domain measurements to the analysis of signal integrity of DUTs, as done by some embodiments of the method and apparatus of this disclosure. For example, frequency domain measurements can provide much higher accuracy than traditional TDRs due to correction of systematic sources of measurement error. In addition, some embodiments of an MTS of this disclosure can provide a dynamic range of more than 110 dB in the time domain, which can be useful for isolating cross-talk and identifying EMI problems. Further, a 20 GHz frequency domain MTS system according to some embodiments of this disclosure, impulse and rise-time measurements of 35 Psec can be measured. In addition, some embodiments of the method and MTS apparatus of this system can be used to analyze the effects of phase skew on unbalanced transmission lines. Still further, some embodiments of the method and MTS apparatus of this disclosure allow an operator to quickly evaluate components at different characteristic impedances.

It is further to be appreciated that some embodiments of the method and MTS apparatus of this disclosure use a combination of simulation and hardware measurements rather than heavily relying on hardware measurements. For example, it is to be appreciated that with some embodiments of the method and MTS apparatus of the disclosure, there is no arbitrary waveform generator. In contrast, some embodiments of the method and MTS apparatus of this disclosure simulate the test signal waveform. It is to be appreciated that with those embodiments, there is provided a cost effective solution in comparison to the traditional TDR and signal integrity instrumentation. It is further to be appreciated that some embodiments of the method and apparatus of this disclosure provide flexibility so that as applications change, the embodiments of the method and apparatus of this disclosure can be used to evaluate a DUT.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and FIGS. are by way of example only.

What is claimed is:

1. A method of calibrating an N-port multiport test system for measurement of a DUT, consisting of the steps of:
   coupling each port of an N-port automatic calibration device to a respective port of the N-port multiport test system;
   presenting three reflection standards with the automatic calibration device to each port of the N-port multiport test system;
   providing with the automatic calibration device, N−1 through conditions of a possible N(N−1)/2 possible through conditions, between corresponding ports of the N-port multiport test system;
   making measurements with the N-port multiport test system of the three reflection standards at each port and the N−1 through conditions between the corresponding ports; and
   determining all systematic error coefficients for all of the ports of the N-port multiport test system.

2. The method of calibrating the N-port multiport test system as claimed in claim 1, wherein the step of determining all systematic error coefficients comprises determining corresponding one-port error coefficients for each port of the N-port multiport test system.

3. The method of calibrating the N-port multiport test system as claimed in claim 1, wherein the step of determining all systematic error coefficients comprises determining a load match for each port of the N-port multiport test system.

4. The method of calibrating the N-port multiport test system as claimed in claim 1, wherein the step of determining all systematic error coefficients comprises determining a directivity for each port of the N-port multiport test system.

5. The method of calibrating the N-port multiport test system as claimed in claim 1, wherein the step of determining all systematic error coefficients comprises determining a source match for each port of the N-port multiport test system.

6. The method of calibrating the N-port multiport test system as claimed in claim 1, wherein the step of determining all systematic error coefficients comprises determining a reflection tracking for each port of the N-port multiport test system.

7. The method of calibrating the N-port multiport test system as claimed in claim 1, wherein the step of determining all systematic error coefficients comprises determining all N(N−1)/2 forward transmission tracking coefficients for all N(N−1)/2 two-port paths between all N-ports of the N-port multiport test system.

8. The method of calibrating the N-port multiport test system as claimed in claim 1, wherein the step of providing the N−1 through conditions comprises providing N through conditions.

9. The method of calibrating the N-port multiport test system as claimed in claim 1, wherein the step of providing the N−1 through conditions comprises providing N(N−1)/2 through conditions.

10. The method of calibrating the N-port multiport test system as claimed in claim 1, wherein the step of determining all systematic error coefficients comprises determining all N(N−1)/2 reverse transmission tracking coefficients for all N(N−1)/2 two ports between all N-ports of the N-port multiport test system.

11. The method of calibrating the N-port multiport test system as claimed in claim 1, wherein the step of presenting the three reflection standards comprises coupling the three reflection standards to each port of the N-port multiport test system with the N-port automatic calibration device comprising at least one single-pole, N−1 throw switch.

12. The method of calibrating the N-port multiport test system as claimed in claim 1, wherein the step of presenting the three reflection standards further comprises biasing at least one single-pole, double-throw switch to provide the three reflection standards.

13. The method of calibrating the N-port multiport test system as claimed in claim 1, wherein the step of providing the N−1 through conditions comprises providing the N−1 through conditions to the corresponding ports of the N-port multiport test system with the N-port automatic calibration device comprising at least one single-pole, N−1 throw switch.

14. A combination of an N-port multiport test set that can characterize a multi-terminal DUT and an N-port multiport automatic calibration device, wherein each port of the multiport automatic calibration device is coupled to a respective port of the multiport test set, the multiport test set and the multiport automatical calibration device being configured to accomplish the steps consisting of:

presenting three reflection standards with the automatic calibration device to each port of the N-port multiport test set;

providing with the multiport automatic calibration device, N−1 through conditions of a possible N(N−1)/2 possible through conditions, between corresponding ports of the N-port multiport test set;

measuring with the N-port multiport test set, the three reflection standards presented to each port of the multiport test set and the N−1 through conditions between the corresponding ports; and determining all systematic error coefficients for all of the ports of the multiport test system.

15. The combination of the multiport test set and the multiport automatic calibration device as claimed in claim 14, wherein the combination is further configured in determining all systematic error coefficients to determine corresponding one-port error coefficients for each port of the multiport test set.

16. The combination of the multiport test set and the multiport automatic calibration device as claimed in claim 14, wherein the combination is further configured in determining all systematic error coefficients to determine a load match for each port of the multiport test set.

17. The combination of the multiport test set and the multiport automatic calibration device as claimed in claim 14, wherein the combination is further configured in determining all systematic error coefficients to determine a directivity for each port of the multiport test set.

18. The combination of the multiport test set and the multiport automatic calibration device as claimed in claim 14, wherein the combination is further configured in determining all systematic error coefficients to determine a source match for each port of the multiport test set.

19. The combination of the multiport test set and the multiport automatic calibration device as claimed in claim 14, wherein the combination is further configured in determining all systematic error coefficients to determine a reflection tracking for each port of the multiport test set.

20. The combination of the multiport test set and the multiport automatic calibration device as claimed in claim 14, wherein the combination is further configured in determining all systematic error coefficients to determine all N(N−1)/2 forward transmission tracking coefficients for all N(N−1)/2 two-port paths between all N-ports of the multiport test set.

21. The combination of the multiport test set and the multiport automatic calibration device as claimed in claim 14, wherein the combination is further configured in determining all systematic error coefficients to determine all N(N−1)/2 reverse transmission tracking coefficients for all N(N−1)/2 two-port paths between all N-ports of the multiport test set.

22. The combination of the multiport automatic calibration device as claimed in claim 14, wherein the combination is further configured in providing the N−1 through conditions to provide N through conditions.

23. The combination of the multiport automatic calibration device as claimed in claim 14, wherein the combination is further configured in providing the N−1 through conditions to provide N(N−1)/2 through conditions.

24. The combination of the multiport automatic calibration device as claimed in claim 14, wherein the combination further comprises a controller that biases a plurality of switching devices to present the three reflection standards.

25. The combination of the multiport automatic calibration device as claimed in claim 14, wherein the combination further comprises a controller that biases a plurality of switching devices to provide the N−1 through conditions.

26. The combination of the multiport test set and the multiport automatic calibration device as claimed in claim 14, wherein the plurality of switching devices comprise at least one single-pole, double-throw switching device that can be biased to a plurality of states to provide the at least three reflection standards.

\* \* \* \* \*